United States Patent [19]

Ogawa et al.

[11] Patent Number: 4,460,669
[45] Date of Patent: Jul. 17, 1984

[54] PHOTOCONDUCTIVE MEMBER WITH α-SI AND C, U OR D AND DOPANT

[75] Inventors: Kyosuke Ogawa, Tokyo; Shigeru Shirai, Yamato; Junichiro Kanbe, Yokohama; Keishi Saitoh, Tokyo; Yoichi Osato, Yokohama, all of Japan

[73] Assignee: Canon Kabushiki Kaisha, Tokyo, Japan

[21] Appl. No.: 443,656

[22] Filed: Nov. 22, 1982

[30] Foreign Application Priority Data

Nov. 26, 1981 [JP] Japan ................... 56-190037
Nov. 30, 1981 [JP] Japan ................... 56-193200
Dec. 1, 1981 [JP] Japan ................... 56-194292

[51] Int. Cl.$^3$ .......................... G03G 5/082
[52] U.S. Cl. ........................... 430/57; 430/84; 430/85; 430/86; 430/95; 252/501.1; 427/74; 357/2
[58] Field of Search ............. 430/57, 84, 85, 86, 430/95; 252/501.1; 427/74; 357/2

[56] References Cited

U.S. PATENT DOCUMENTS

| | | | |
|---|---|---|---|
| 3,210,184 | 10/1965 | Uhlig | 430/65 |
| 4,217,374 | 8/1980 | Ovshinsky et al. | 430/84 X |
| 4,226,898 | 10/1980 | Ovshinsky, et al. | 430/84 X |
| 4,239,554 | 12/1980 | Yamazaki | 136/255 |
| 4,251,289 | 2/1981 | Moustakas et al. | 204/192 |
| 4,253,882 | 3/1981 | Dalal | 427/74 X |
| 4,265,991 | 5/1981 | Hirai et al. | 430/65 X |
| 4,289,822 | 9/1981 | Shimada et al. | 427/74 X |
| 4,414,319 | 11/1983 | Shirai et al. | 430/65 |

FOREIGN PATENT DOCUMENTS 2083701 3/1982 United Kingdom ............ 357/2

Primary Examiner—Roland K. Martin, Jr.
Attorney, Agent, or Firm—Fitzpatrick, Cella, Harper & Scinto

[57] ABSTRACT

A photoconductive member comprises a support for a photoconductive member and an amorphous layer having photoconductivity constituted of an amorphous material comprising silicon atoms as a matrix, said amorphous layer having a first layer region containing as the constituent atom at least one kind of atoms selected from the group consisting of oxygen atoms, carbon atoms and nitrogen atoms in a distribution state which is ununiform and continuous in the direction of layer thickness and a second layer region containing atoms belonging to the group III of the periodic table as constituent atoms in a distribution state which is ununiform and continuous in the direction of layer thickness, said first layer region existing internally below the surface of said amorphous layer.

52 Claims, 11 Drawing Figures

PHOTOCONDUCTIVE MEMBER WITH α-SI AND C, U OR D AND DOPANT

BACKGROUND OF THE INVENTION

1. Field of the Invention

This invention relates to a photoconductive member having sensitivity to electromagnetic waves such as light (herein used in a broad sense, including ultraviolet rays, visible light, infrared rays, X-rays and gamma-rays).

2. Description of the Prior Arts

Photoconductive materials, which constitute image forming members for electrophotography in solid state image pick-up devices or in the field of image formation, or photoconductive layers in manuscript reading devices, are required to have a high sensitivity, a high SN ratio (Photocurrent $(I_p)$/Dark current $(I_d)$), spectral characteristics matching to those of electromagnetic waves to be irradiated, a rapid response to light, a desired dark resistance value as well as no harm to human bodies during usage. Further, in a solid state image pick-up device, it is also required that the residual image should easily be treated within a predetermined time. In particular, in case of an image forming member for electrophotography to be assembled in an electrophotographic device to be used in an office as office apparatus, the aforesaid harmless characteristic is very important.

From the standpont as mentioned above, amorphous silicon (hereinafter referred to as a-Si) has recently attracted attention as a photoconductive material. For example, German Laid-Open Patent Publication Nos. 2746967 and 2855718 disclose applications of a-Si for use in image forming members for electrophotography, and German Laid-Open Patent Publication No. 2933411 an application of a-Si for use in a photoconverting reading device.

However, under the present situation, the photoconductive members having photoconductive layers constituted of a-Si are further required to be improved in various aspects including electrical, optical and photoconductive characteristic such as dark resistance value, photosensitivity and response to light, etc., and environmental characteristics during use such as humidity resistance, and further stability with lapse of time.

For instance, when applied in an image forming member for electrophotography, residual potential is frequently observed to remain during use thereof if improvements to higher photosensitivity and higher dark resistance are scheduled to be effected at the same time. When such a photoconductive member is repeatedly used for a long time, there will be caused various inconveniences such as accumulation of fatigues by repeated uses or so called ghost phenomenon wherein residual images are formed.

As another disadvantage, for example, according to the experience by the present inventors from a number of experiments, a-Si material constituting the photoconductive layer of an image forming member for electrophotography, while it has a number of advantages, as compared with inorganic photoconductive materials such as Se, CdS, ZnO or organic photoconductive materials such as PVCz or TNF of prior art, is also found to have several problems to be solved. Namely, when charging treatment is applied for formation of electrostatic images on the photoconductive layer of an image forming member for electrophotography having a photoconductive member constituted of a mono-layer of a-Si which has been endowed with characteristics for use in a solar battery of prior art, dark decay is markedly rapid, whereby it is difficult to apply a conventional electrophotographic method. This tendency is further pronounced under a humid atmosphere to such an extent in some cases that no charge is retained at all until development.

Further, when a-Si material is used to form a photoconductive layer, it may contain as constituent atoms hydrogen atoms or halogen atoms such as fluorine atoms, chlorine atoms, etc. for improving their electrical, photoconductive characteristics, boron atoms, phosphorus atoms, etc. for controlling the electroconduction type as well as other atoms for improving other characteristics. Depending on the manner in which these constituent atoms are contained, there may sometimes be caused problems with respect to electrical, optical or photoconductive characteristics of the layer formed.

That is, for example, in many cases, the life of the photocarriers generated by light irradiation in the photoconductive layer formed is insufficient, or at the dark portion, the charges injected from the support side cannot sufficiently be impeded.

Thus, it is required in designing of a photoconductive material to make efforts to obtain desirable electrical, optical and photoconductive characteristics as mentioned above along with the improvement in the characteristics of a-Si materials per se.

SUMMARY OF THE INVENTION

In view of the above points, the present invention contemplates the achievement obtained as a result of extensive studies made comprehensively from the standpoints of applicability and utility of a-Si as a photoconductive member for image forming members for electrophotography, solid state image pick-up devices, reading devices, etc. it has now been found that a photoconductive member having a photoconductive layer comprising an amorphous layer exhibiting photoconductivity, which is constituted of a-Si, particularly so called hydrogenated amorphous silicon, halogenated amorphous silicon or halogen-containing hydrogenated amorphous silicon which is an amorphous material containing at least one of hydrogen atom (H) and halogen atom (X) in a matrix of a-Si (hereinafter referred to comprehensively as a-Si(H,X)), said photoconductive member being prepared by designing so as to have a specific layer structure, is found to exhibit not only practically extremely excellent characteristics but also surpass the photoconductive members of the prior art in substantially all respects, especially markedly excellent characteristics as a photoconductive member for electrophotography. The present invention is bsed on such finding.

The object of the present invention is to provide an all-environment type photoconductive member having constantly stable electrical, optical and photoconductive characteristics, which are not affected by the environment under use and having remarkably excellent light fatigue resistance.

Another object of the present invention is to provide a photoconductive member excellent in durability without causing any deterioration phenomenon after repeated uses and free entirely or substantially from residual potentials observed.

A further object of the present invention is to provide a photoconductive member having excellent electrophotographic characteristics, which is sufficiently capable of retaining charges at the time of charging treatment for formation of electrostatic charges to the extent such that a conventional electrophotographic method can be very effectively applied when it is provided for use as an image forming member for electrophotography.

Still another object of the present invention is to provide a photoconductive member for electrophotography capable of providing easily a high quality image which is high in density, clear in halftone and high in resolution.

A still another object of the present invention is to provide a photoconductive member having high photosensitivity, high SN ratio characteristic and good electrical contact with a support.

According to the present invention, there is provided a photoconductive member comprising a support for a photoconductive member and an amorphous layer having photoconductivity constituted of an amorphous material comprising silicon atoms as a matrix, said amorphous layer having a first layer region containing as the constituent atom at least one kind of atoms selected from the group consisting of oxygen atoms, carbon atoms and nitrogen atoms in a distribution state which is ununiform and continuous in the direction of layer thickness and a second layer region containing atoms belonging to the group III of the periodic table as constituent atoms in a distribution state which is ununiform and continuous in the direction of the layer thickness, said first layer region existing internally below the surface of said amorphous layer.

DESCRIPTION OF THE PREFERRED EMBODIMENTS

Figure 1:
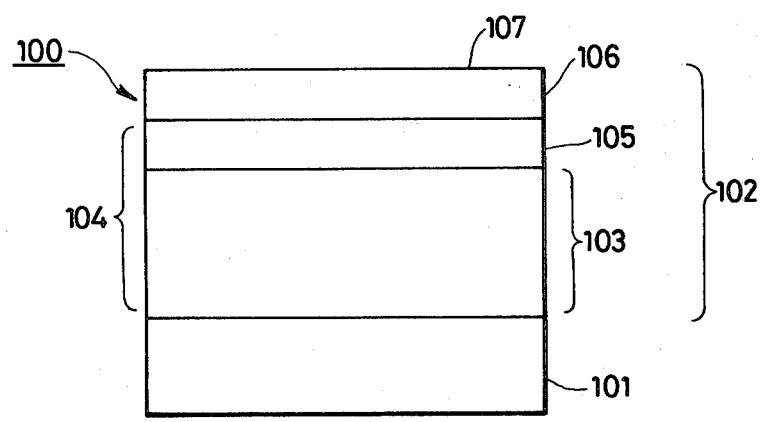
FIG. 1 shows a schematic sectional view for illustration of the layer constitution of a preferred embodiment of the photoconductive member according to the present invention.

Referring now to the drawing, the photoconductive members according to the present invention are to be described in detail below.

FIG. 1 shows a schematic sectional view for illustration of a typical exemplary constitution of the photoconductive member of this invention.

The photoconductive member 100 as shown in FIG. 1 has a support 101 for photoconductive member and an amorphous layer 102 comprising a-Si, preferably a-Si(H,X) having photoconductivity provided on the support.

The amorphous layer 102 has a layer structure constituted of a first layer region (O, N, C) 103 containing as constituent atoms at least one kind of atoms selected from the group consisting of oxygen atoms, nitrogen atoms and carbon atoms, a second layer region (III) 104 containing atoms of an element belonging to the group III of the periodic table (hereinafter called group III atoms) as constituent atoms and a surface layer region 106, containing none of the aforesaid selected atoms and the group III atoms, on the second layer region (III) 104.

In a layer region 105 provided between the first layer region (O, N, C) 103 and the surface layer region 106, the group III atoms are contained but none of the aforesaid selected atoms are contained.

Each of atoms selected from the group consisting of oxygen atoms, carbon atoms and nitrogen atoms contained in the first layer region (O, N, C) 103 is distributed in said layer region (O, N, C) 103 continuously in the direction of the layer thickness in an ununiform distribution, but preferably in a continuous and uniform distribution in the direction substantially parallel to the surface of the support 101.

In the photoconductive member of the present invention, as shown in FIG. 1, it is necessary to provide a layer region containing none of the aforesaid selected atoms (corresponding to the surface layer region 106 in FIG. 1) at the surface portion of the amorphous layer 102, but it is not necessarily required to provide a layer region containing the group III atoms but containing none of said selected atoms (layer region 105 shown in FIG. 1).

That is, for example, in FIG. 1 the first layer region (O, N, C) 103 may be the same layer region as the second layer region (III) 104, or alternatively the second layer region (III) 104 may be provided within the first layer region (O, N, C) 103.

The group III atoms to be contained in the second layer region (III) 104 are distributed in said second layer region (III) 104 continuously in the direction of the layer thickness in an ununiform distribution, but preferably in a continuous and uniform distribution in the direction substantially parallel to the surface of the support 101.

In the photoconductive member 100 as shown in FIG. 1, the surface layer region 106 contains no atom of the group III, but said surface layer region 106 may also contain the group III atoms in the present invention.

In the photoconductive member according to the present invention, improvements to higher dark resistance and to better adhesion between the amorphous layer and the support on which it is directly provided are intended preponderantly by incorporation of at least one kind of atoms selected from the group consisting of oxygen atoms, carbon atoms and nitrogen atoms in the first layer region (O, N, C), while improvement of corona ion resistance and sensitization to higher sensitivity intended preponderantly by omitting the aforesaid selected atoms from the surface layer region.

In the present invention, better results may be obtained in case of layer structures, especially where as shown in the photoconductive member 100 in FIG. 1 the amorphous layer 102 has a first layer region (O, N, C) 103 containing the aforesaid selected atoms, a second layer region (III) 104 containing the group III atoms, a layer region 105 containing none of the aforesaid selected atoms and a surface layer region 106 containing none of said selected atoms and the group III atoms, said first layer region (O, N, C) 103 and said second layer region (III) 104 sharing a common layer region.

In the photoconductive member of the present invention, the distribution in the layer thickness, of the aforesaid selected atoms incorporated in the first layer region (O, N, C) is made in the first place more concentrated toward the side bonded to the support or another layer for ensuring good adhesion and contact with the support or another layer. Secondly, it is preferred that the aforesaid selected atoms should be incorporated in the first layer region (O, N, C) so that, in order to make smooth the electrical contact at the bonded surface with the layer region containing none of the aforesaid selected atoms to be provided on the first layer region (O, N, C), they may be gradually decreased in distribution concentration on the side of said layer region containing none of the aforesaid selected atoms, until the distribution concentration may become substantially zero at the bonded surface. The same is the case in this respect for the group III atoms to be incorporated in the second layer region (III), and in case of an example where none of said group III atoms are incorporated in the surface layer region of the amorphous layer, it is preferred that the distribution state of the group III atoms may be formed in a distribution such that the distribution concentration of the group III atoms within the second layer region (III) should be decreased gradually toward the direction of the surface bonded to the surface layer region until it may become substantially zero at said bonded surface.

In the present invention, the atoms belonging to the group III of the periodic table to be incorporated in the second layer region (III) constituting the amorphous layer may include B (boron), Al (aluminum), Ga (gallium), In (indium) and Tl (thallium). Among them, B and Ga are particularly preferred.

In the present invention, the content of the group III atoms in the second layer region (III), which may be suitably determined as desired so as to achieve effectively the object of the present invention, may be generally 0.01 to $5 \times 10^4$ atomic ppm, preferably 1 to 100 atomic ppm, more preferably 2 to 50 atomic ppm, most preferably 3 to 20 atomic ppm, based on silicon atoms constituting the amorphous layer. The content of oxygen atoms, nitrogen atoms or carbon atoms in the first layer region (O, N, C) may also be determined suitably depending on the characteristics required for the photoconductive member formed, but generally 0.001 to 30 atomic %, preferably 0.01 to 20 atomic %, more preferably 0.02 to 10 atomic %, most preferably 0.03 to 5 atomic %. When two or more kinds of oxygen atoms, nitrogen atoms and carbon atoms are contained in the first layer region (O, N, C) in the present invention, the total content of the atoms contained is determined within the numerical range as mentioned above.

FIGS. 2 through 10 show typical examples of the distribution in the direction of layer thickness of oxygen atoms, nitrogen atoms, carbon atoms and the group III atoms contained in the amorphous layer in the photoconductive member according to the present invention.

In FIGS. 2 through 10, the axis of abscissa indicates the content C of the aforesaid selected atoms contained in the first layer region (O, N, C) and the group III atoms, and the axis of ordinate the layer thickness direction of the amorphous layer exhibiting photoconductivity, $t_B$ showing the position of the surface on the support side and $t_s$ the position of the surface on the side opposite to the support side. That is, the growth of the amorphous layer containing the aforesaid selected atoms and the group III atoms proceeds from the $t_B$ side toward the $t_s$ side.

The scale of the axis of abscissa for the aforesaid selected atoms is different from that for the group III atoms. The solid lines A1-A10 represent distribution concentration lines of the aforesaid selected atoms and the solid lines B2-B10 those of the group III atoms, respectively.

Figure 2:
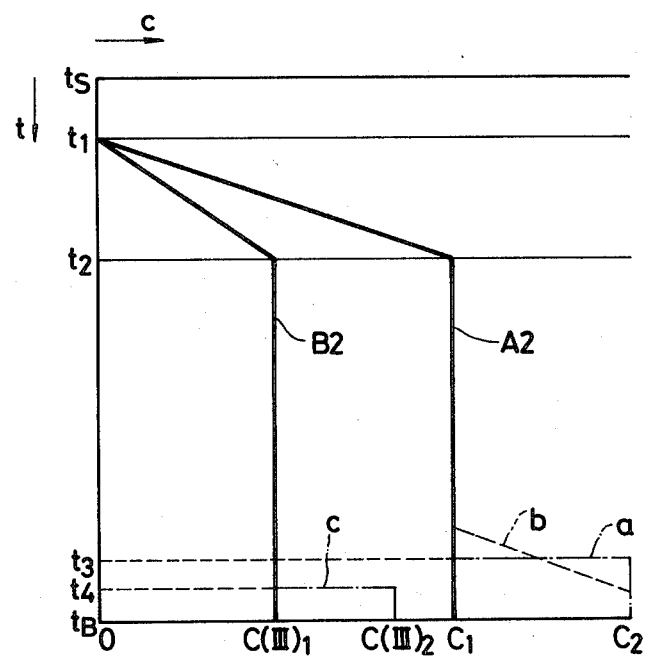
FIGS. 2 through 10 schematic sectional views for illustration of the layer constitutions of the amorphous layer constituting the photoconductive member of the present invention, respectively.

In FIG. 2, there is shown a first typical embodiment of the distribution of the aforesaid selected atoms and the group III atoms in the layer thickness direction contained in the amorphous layer.

According to the embodiment as shown in FIG. 2, the amorphous layer $t_s\, t_B$) (the whole layer region from $t_s$ to $t_B$) comprising a-Si, preferably a-Si(H,X) and exhibiting photoconductivity, has a layer region ($t_2\, t_B$) (the layer region between $t_2$ and $t_B$) wherein the aforesaid selected atoms are distributed at a distribution concentration of $C_1$ and the group III atoms at a distribution concentration of $C_{(III)1}$ substantially uniformly in the layer thickness direction from the support side, a layer region ($t_1\, t_2$) wherein the aforesaid selected atoms are gradually decreased linearly in distribution concentration from $C_1$ to substantially zero and the group III atoms decreased linearly in distribution concentration from $C_{(III)1}$ to substantially zero, and a layer region ($t_s\, t_1$) wherein none of the aforesaid selected atoms and the group III atoms are substantially contained.

In case of the embodiment as shown in FIG. 2, where the amorphous layer ($t_s\, t_B$) is provided on the support side and has a contact face with the support or another layer (corresponding to $t_B$) and a layer region ($t_2\, t_B$) with the aforesaid selected atoms and the group III atoms being uniformly distributed, the distribution concentrations $C_{(III)1}$ and $C_1$, which may suitably be determined as desired in relation to the support or other layers, are 0.1 to $8 \times 10^4$ atomic ppm, preferably 0.1 to 1000 atomic ppm, more preferably 1 to 400 atomic ppm, most preferably 2 to 200 atomic ppm, based on silicon atoms, for $C_{(III)1}$, and 0.01 to 35 atomic %, preferably 0.01 to 30 atomic %, more preferably 0.02 to 20 atomic %, most preferably 0.03 to 10 atomic %, for $C_1$.

The layer region ($t_1\, t_2$) is provided primarily for the purpose of making electrical contact between the layer region ($t_s\, t_1$) and the layer region ($t_2\, t_B$) smooth, and the layer thickness of said layer region ($t_1\, t_2$) should be determined suitably as desired in relation to the distribution concentration $C_1$ of the aforesaid selected atoms and the distribution concentration $C_{(III)1}$ of the group III atoms, especially the distribution concentration $C_1$.

The layer region ($t_s\, t_1$), which may optionally contain the group III atoms but contain none of the aforesaid selected atoms, may have a thickness suitably determined as desired so that the layer region ($t_1\, t_B$) containing the aforesaid selected atoms can be sufficiently protected from the air, including durability against repeated uses, or when photocarriers are to be generated in said region ($t_s\, t_1$) by irradiation of light, so that the irradiated light may be sufficiently absorbed in said layer region ($t_s\, t_1$).

In the present invention, the layer region containing none of the aforesaid selected atoms provided at the surface layer region of the amorphous layer is desired to have a thickness generally of 100 Å to 10μ, preferably 200 Å to 5μ, most preferably 500 Å to 3μ.

In a photoconductive member having distributions of the aforesaid selected atoms and the group III atoms as shown in FIG. 2, for the purpose of improving adhesion with the support or another layer as well as inhibition of charges from the support side to the amorphous layer, while also aiming at improvements to higher photosensitivity and higher dark resistance, it is preferable to provide a layer region ($t_3\, t_B$) which is made higher in distribution concentration of the aforesaid selected atoms than the distribution concentration $C_1$ at the portion on the support side surface (corresponding to the position $t_B$) in the amorphous layer as shown by the broken line a in FIG. 2.

The distribution concentration $C_2$ of the aforesaid selected atoms in the layer region ($t_3$ $t_B$) where the aforesaid selected atoms are distributed at a high concentration may be generally 70 atomic % or less, preferably 50 atomic % or less, most preferably 30 atomic % or less. The distribution of the aforesaid selected atoms in the layer region where the aforesaid selected atoms are distributed at higher concentrations may be made constant (uniform) in the layer thickness direction as shown by the broken line a in FIG. 2, or alternatively in order to make good electrical contact with adjacent layer region directly bonded, it may be made a constant value of $C_2$ from the support side to a certain thickness and decreased thereafter gradually to $C_1$.

The distribution of the group III atoms contained in the second layer region (III) may be generally made so as to give a layer region maintaining a constant value of distribution concentration $C_{(III)1}$ (corresponding to the layer region ($t_2$ $t_B$)) on the support side, but it is desirable for the purpose of inhibiting efficiently injection of charges from the support side to the amorphous layer to provide a layer region ($t_4$ $t_B$) in which the group III atoms are distributed at a high concentration as shown by the broken line c in FIG. 2.

In the present invention, the layer region ($t_4$ $t_B$) may be preferably provided within $5\mu$ from the position $t_B$. The layer region ($t_s$ $t_B$) may be made the whole layer region ($L_T$) to the thickness of $5\mu$ from the position $t_B$, or may be provided as a part of the layer region ($L_T$).

It may be suitably determined depending on the characteristics required for the amorphous layer formed, whether the layer region ($t_4$ $t_B$) should be made a part or whole of the layer region ($L_T$).

The layer region ($t_4$ $t_B$) may be desirably formed so that the group III atoms may be distributed in the layer thickness direction with the maximum distribution value (distribution concentration value) $C_{max}$ being generally 50 atomic ppm or more, preferably 80 atomic ppm or more, most preferably 100 atomic ppm or more, based on silicon atoms.

That is, in the present invention, the second layer region (III) containing the group III atoms may preferably be formed so that the maximum value $C_{max}$ of the content distribution may exist at a depth within $5\mu$ of layer thickness from the support side (layer region of $5\mu$ thickness from $t_B$).

In the present invention, the layer region ($t_3$ $t_B$) where the aforesaid selected atoms are distributed at higher concentration and the layer region ($t_4$ $t_B$) where the group III atoms are distributed at higher concentration may have thicknesses, which may suitably be determined depending on the contents and the distribution states of the aforesaid selected atoms or the group III atoms, but they are desired to be generally 50 Å to $5\mu$, preferably 100 Å to $2\mu$, most preferably 200 Å to 5000 Å.

Figure 3:
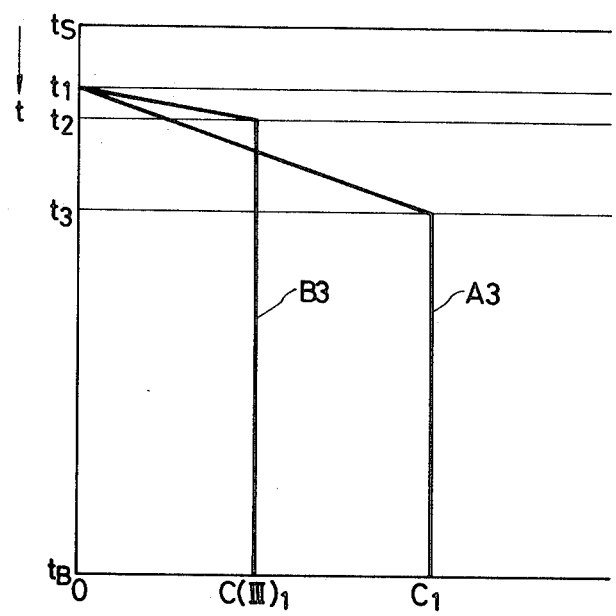

The embodiment shown in FIG. 3 is basically similar to that shown in FIG. 2, but differs in the following point. That is, in the embodiment shown in FIG. 2, both of the distribution concentrations of the aforesaid selected atoms and of the group III atoms commence to be decreased at the position $t_2$ until they become substantially zero at the position $t_1$. In contrast, in case of the embodiment in FIG. 3, the distribution concentration of the aforesaid selected atoms begins to be decreased at the position $t_3$, as shown by the solid line A3, while the distribution concentration of the group III atoms at the position $t_2$, as shown by the solid line B3, respectively, both becoming substantially zero at the position $t_1$.

That is, the first layer region ($t_1$ $t_B$) containing the aforesaid selected atoms is constituted of a layer region ($t_3$ $t_B$) in which they are contained substantially uniformly at a distribution concentration of $C_1$ and a layer region ($t_1$ $t_3$) in which the distribution concentration is decreased linearly from $C_1$ to substantially zero.

The second layer region ($t_1$ $t_B$) containing the group III atoms is constituted of a layer region ($t_2$ $t_B$) in which they are contained substantially uniformly at a distribution concentration of $C_{(III)1}$ and a layer region ($t_1$ $t_2$) in which the distribution concentration is decreased linearly from $C_{(III)1}$ to substantially zero.

In the layer region ($t_s$ $t_1$), neither the aforesaid selected atoms nor the group III atoms are contained similarly as in the layer region ($t_s$ $t_1$) shown in FIG. 2.

Figure 4:
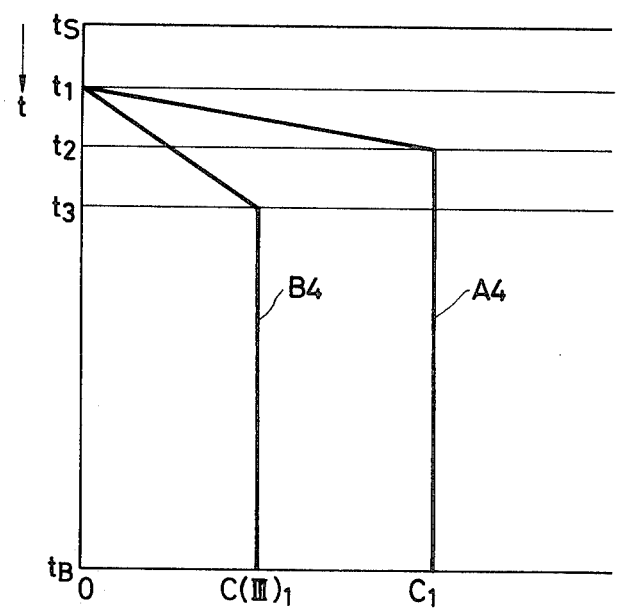

The embodiment shown in FIG. 4 is a modification of the embodiment shown in FIG. 3, having the same constitution as in FIG. 3 except that there is provided a layer region ($t_3$ $t_B$) where the group III atoms are contained in a uniform distribution at a distribution concentration of $C_{(III)1}$ within a layer region ($t_2$ $t_B$) where the aforesaid selected atoms are distributed uniformly at a distribution concentration of $C_1$.

Figure 5:
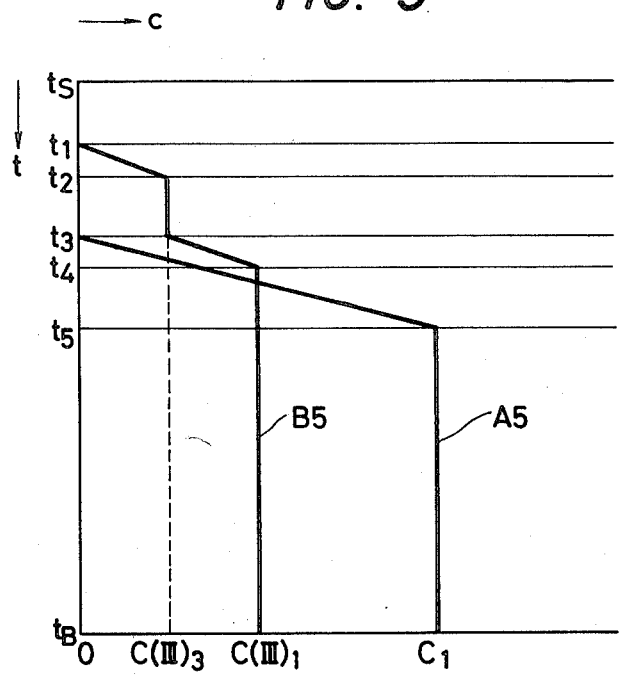

FIG. 5 shows an embodiment, having two layer regions containing the group III atoms uniformly distributed at certain distribution concentrations.

The amorphous layer in the embodiment shown in FIG. 5 is constituted of, from the side of the support, a layer region ($t_3$ $t_B$) containing both of the aforesaid selected atoms and the group III atoms, a layer region ($t_1$ $t_3$) containing the group III atoms but containing none of the aforesaid selected atoms provided on said layer region ($t_3$ $t_B$) and a layer region ($t_s$ $t_1$) containing none of the group III atoms and the aforesaid selected atoms.

And, the layer region ($t_3$ $t_B$) containing the aforesaid selected atoms is constituted of a layer region ($t_5$ $t_B$) in which they are distributed substantially uniformly at a distribution concentration of $C_1$ in the layer thickness direction and a layer region ($t_3$ $t_5$) in which they are gradually decreased linearly from the distribution concentration $C_1$ to substantially zero.

The layer region ($t_1$ $t_B$) has a laminated structure comprising, from the side of the support, a layer region ($t_4$ $t_B$) in which the group III atoms are distributed substantially uniformly at a distribution concentration of $C_{(III)1}$ in the layer thickness direction, a layer region ($t_3$ $t_4$) in which they are gradually decreased linearly from the distribution concentration $C_{(III)1}$ to the distribution concentration $C_{(III)3}$, a layer region ($t_2$ $t_3$) in which they are distributed substantially uniformly at a distribution concentration of $C_{(III)3}$ in the layer thickness direction and a layer region ($t_1$ $t_2$) in which they are continuously decreased linearly from the distribution concentration $C_{(III)3}$.

Figure 6:
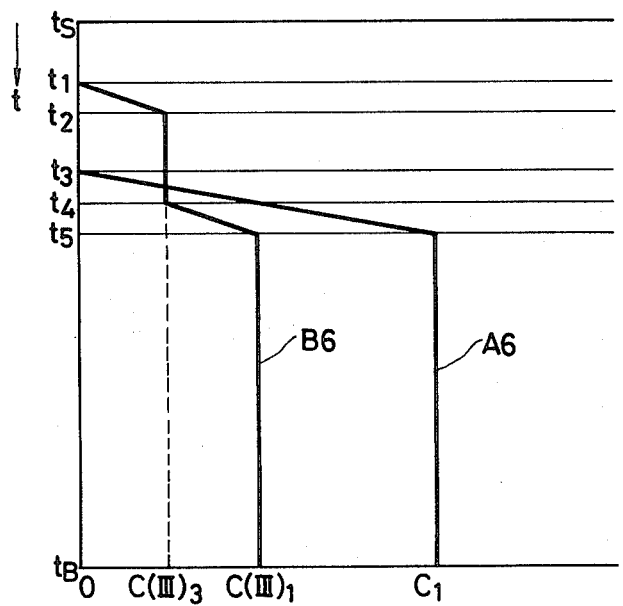

In case of the embodiment shown in FIG. 6, there are provided a layer region ($t_5$ $t_B$) in which the aforesaid selected atoms and the group III atoms are distributed at uniform distribution concentrations of $C_1$, $C_{(III)1}$, respectively, and a layer region ($t_4$ $t_5$) in which the group III atoms are contained in a distribution linearly decreased and a layer region ($t_3\ t_4$) in which the group III atoms are contained in a substantially uniform distribution at the distribution concentration of $C_{(III)3}$ within the layer region ($t_3\ t_5$) wherein the aforesaid selected atoms are gradually decreased from the distribution concentration $C_1$ linearly to substantially zero.

On the layer region ($t_3\ t_B$), there is provided a layer region ($t_s\ t_3$) containing substantially no atom of the aforesaid selected atoms, which layer region ($t_s\ t_3$) being constituted of a layer region ($t_1\ t_3$) containing the group III atoms and a layer region ($t_s\ t_1$) containing none of the aforesaid selected atoms and the group III atoms.

Figure 7:
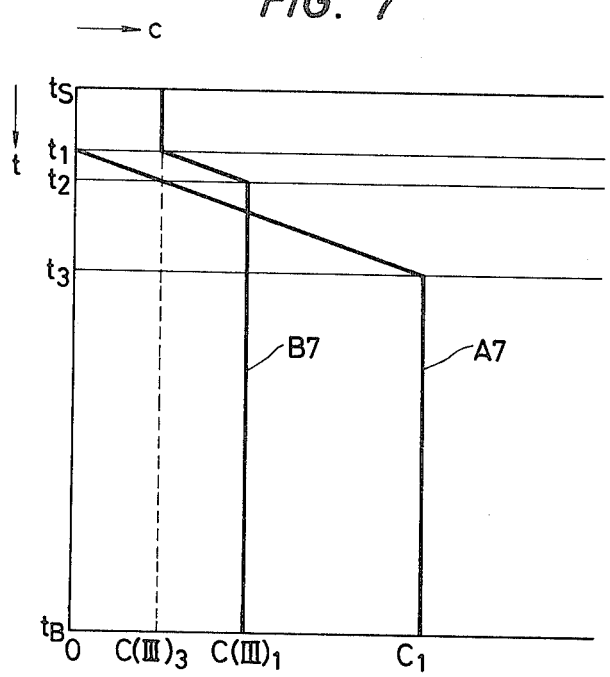

FIG. 7 shows an embodiment wherein the group III atoms are contained in the whole region of the amorphous layer (layer region ($t_s\ t_B$)), and none of the aforesaid selected atoms are contained in the surface layer region ($t_s\ t_1$).

The layer region ($t_1\ t_B$) containing the aforesaid selected atoms, as shown by the solid line A7, has a layer region ($t_3\ t_B$) in which they are contained substantially uniformly at a distribution concentration of $C_1$ and a layer region ($t_1\ t_3$) in which the aforesaid selected atoms are contained in a distribution gradually decreasing from the distribution concentration $C_1$ to substantially zero.

The distribution of the group III atoms in the amorphous layer is shown by the solid line B7. That is, the layer region ($t_s\ t_B$) containing the group III atoms has a layer region ($t_1\ t_2$) in which the group III atoms are contained in a distribution which is continuously changed linearly between the distribution concentrations $C_{(III)1}$ and $C_{(III)3}$, in order to make the distribution of the group III atoms between these distribution concentrations continuously changed, between a layer region ($t_2\ t_B$) in which the group III atoms are contained substantially uniformly at a distribution concentration of $C_{(III)1}$ and a layer region ($t_s\ t_1$) in which the group III atoms are contained uniformly at a distribution concentration $C_{(III)3}$.

Figure 8:
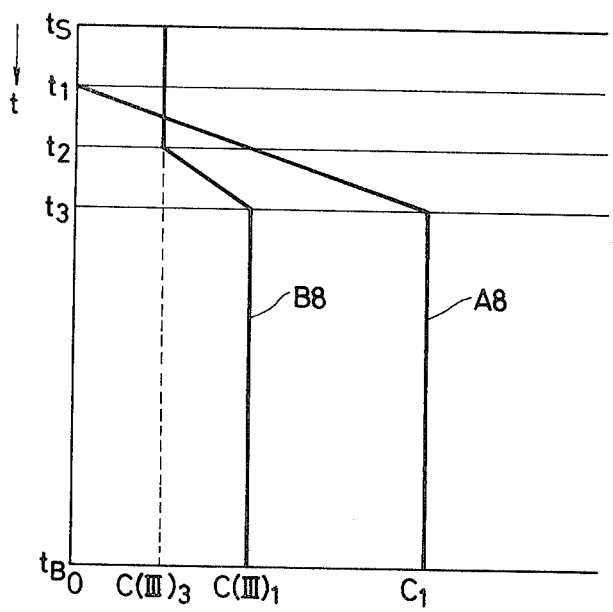

FIG. 8 shows a modification of the embodiment shown in FIG. 7.

Throughout the whole region of the amorphous layer, the group III atoms are contained, as shown by the solid line B8, and the aforesaid selected atoms in the layer region ($t_1\ t_B$). In the layer region ($t_3\ t_B$), the aforesaid selected atoms are contained at a distribution concentration of $C_1$ and the group III atom at a distribution concentration of $C_{(III)1}$, respectively in uniform distributions, while in the layer region ($t_s\ t_2$), the group III atoms are contained uniformly at a distribution concentration of $C_{(III)3}$.

The aforesaid selected atoms are contained, as shown by the solid line A8, in the layer region ($t_1\ t_3$) in a distribution gradually decreased linearly from the distribution concentration $C_1$ at the support side to substantially zero at the position $t_1$.

In the layer region ($t_2\ t_3$), the group III atoms are contained in a distribution gradually decreased from the distribution concentration of $C_{(III)1}$ to the distribution concentration $C_{(III)3}$.

Figure 9:
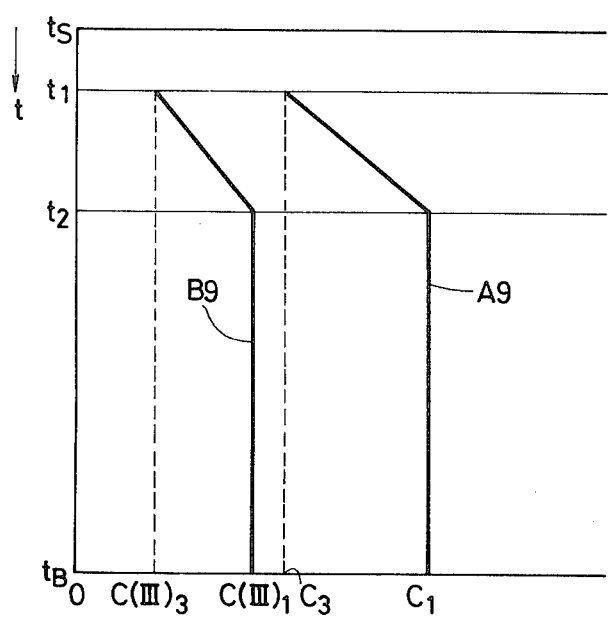

In FIG. 9, there is shown an embodiment in which on a layer region containing the aforesaid selected atoms and the group III atoms uniformly distributed in the layer thickness direction is formed a layer region containing these atoms ununiformly and continuously distributed.

In the embodiment as shown in FIG. 9, the first layer region (O, N, C) containing the aforesaid selected atoms and the second layer region (III) containing the group III atoms are substantially the same layer region, said embodiment having also a surface layer region containing none of the aforesaid selected atoms and the group III atoms.

The aforesaid selected atoms and the group III atoms are distributed in substantially uniform distributions at distribution concentrations of $C_1$ and $C_{(III)1}$, respectively, in the layer region ($t_2\ t_B$), and, in the layer region ($t_1\ t_2$), the aforesaid selected atoms are continuously decreased from the distribution concentration $C_1$ to the distribution concentration $C_3$, and the group III atoms from the distribution concentration $C_{(III)1}$ to the distribution concentration $C_{(III)3}$, respectively.

Figure 10:
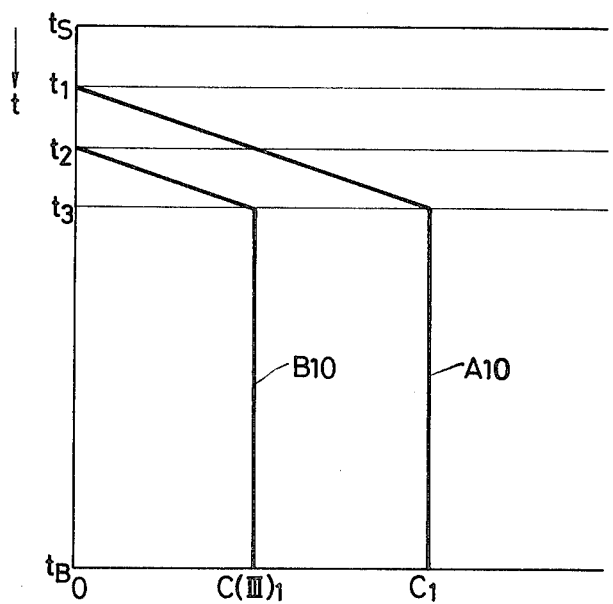

In the embodiment shown in FIG. 10, there is provided a layer region containing both of the aforesaid selected atoms and the group III atoms continuously distributed in ununiform distributions, in which the layer region containing the group III atoms is provided within the layer region containing the aforesaid selected atoms.

And, in the layer region ($t_3\ t_B$), the aforesaid selected atoms are contained substantially uniformly at a distribution concentration $C_1$ and the group III atoms at a distribution concentration $C_{(III)1}$, respectively, while in the layer region ($t_2\ t_3$), the aforesaid selected atoms and the group III atoms are contained, decreasing gradually as the growth of the respective layers, until the distribution concentration of the group III atoms is substantially zero at $t_2$.

The aforesaid selected atoms are contained even in the layer region ($t_1\ t_2$) containing no group III atom so as to form a linearly decreased distribution, until it is substantially zero at $t_1$.

In the layer region ($t_s\ t_1$), none of the aforesaid selected atoms and the group III atoms are contained.

Having described about some typical examples of the distributions of the aforesaid selected atoms and the group III atoms in the layer thickness direction contained in the amorphous layer by referring to FIGS. 2 through 10, it is also possible in case of FIGS. 3 through 10 to provide a layer region with a distribution having a portion with higher concentration C of the aforesaid selected atoms or the group III atoms on the support side and a portion significantly lowered in the concentration C as compared with the support side, on the surface $t_s$ side, similarly as described with reference to FIG. 2.

The aforesaid selected atoms and the group III atoms may be decreased in respective layer regions not only linearly but also in a curve.

In the present invention, typical examples of halogen atoms (X) to be optionally incorporated in the amorphous layer are fluorine, chlorine, bromine and iodine, especially preferably fluorine and chlorine.

In the present invention, formation of an amorphous layer constituted of a-Si:(H,X) may be conducted according to the vacuum deposition method utilizing discharging phenomenon, such as glow discharge method, sputtering method or ion-plating method. For example, for formation of an amorphous layer constituted of a-Si:(H, X) according to the glow discharge method, a starting gas for introduction of hydrogen atoms (H) or/and halogen atoms (X) is introduced together with a starting gas for supplying silicon atoms (Si) into the deposition chamber which can be internally brought to reduced pressure, wherein glow discharge is generated thereby to form a layer of a-Si:(H, X) on the surface of a support placed at a predetermined position in the chamber. When it is to be formed according to the sputtering method, a starting gas for introduction of hydrogen atoms (H) or/and halogen atoms (X) may be introduced into the chamber for sputtering, when effecting sputtering with the target formed of silicon (Si) in an atmosphere of an inert gas such as Ar, He or a gas mixture based on these gases.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the effective starting gas for incorporation of halogen atoms to be used in the present invention, there may be mentioned a number of halogen compounds such as halogen gases, halides, interhalogen compounds and silane derivatives substituted with halogens which are gaseous or gasifiable.

Alternatively, it is also effective in the present invention to use a gaseous or gasifiable silicon compound containing halogen atoms which comprises both silicon atoms and halogen atoms.

Typical examples of halogen compounds preferably used in the present invention may include halogen gases such as of fluorine, chlorine, bromine or iodine and interhalogen compounds such as BrF, ClF, $ClF_3$, $BrF_5$, $BrF_3$, $IF_3$, $IF_7$, ICl, IBr, etc.

As the silicon compound containing halogen atom, so called silane derivatives substituted with halogen atom, silicon halides such as $SiF_4$, $Si_2F_6$, $SiCl_4$, $SiBr_4$, or the like are preferred.

When the specific photoconductive member of this invention is formed according to the glow discharge method by use of such a silicon compound containing halogen atoms, it is possible to form an amorphous layer constituted of a-Si containing halogen atoms (X) on a given support without use of a hydrogenated silicon gas as the starting gas capable of supplying Si.

In forming the amorphous layer containing halogen atoms according to the glow discharge method, the basic procedure comprises feeding a starting gas for supplying Si, namely a gas of silicon halide and a gas such as Ar, $H_2$, He, etc. at a predetermined mixing ratio in a suitable flow rate into the deposition chamber for formation of an amorphous layer, followed by excitation of glow discharge to form a plasma atmosphere of these gases, thereby forming an amorphous layer on a support. It is also possible to form a layer by mixing a gas of a silicon compound containing hydrogen atoms at a suitable mixing ratio with these gases in order to incorporate hydrogen atoms therein.

Each of the gases for introduction of respective atoms may be either a single species or a mixture of plural species at a predetermined ratio.

For formation of an amorphous layer of a-Si(H, X) by the reactive sputtering method or the ion-plating method, for example, a target of Si is used and sputtering is effected thereon in a suitable gas plasma atmosphere in case of the sputtering method. Alternatively, in case of ion-plating method, a polycrystalline or single crystalline silicon is placed as vaporization source in a vapor deposition boat, and the silicon vaporization source is vaporized by heating by resistance heating method or electron beam method (EB method) thereby to permit vaporized flying substances to pass through a suitable gas plasma atmosphere.

During this procedure, in either of the sputtering method or the ion-plating method, for introduction of halogen atoms into the layer formed, a gas of a halogen conpound as mentioned above or a silicon compound containing halogen atoms as mentioned above may be introduced into the deposition chamber to form a plasma atmosphere of said gas therein.

When hydrogen atoms are to be introduced, a starting gas for introduction of hydrogen atoms such as $H_2$ or a gas of silanes as mentioned above may be introduced into the deposition chamber for sputtering, followed by formation of a plasma atmosphere of said gas.

In the present invention, as the starting gas for introduction of halogen atoms, the halogen compounds or silicon compounds containing halogens as mentioned above can effectively be used. In addition, it is also possible to use a gaseous or gasifiable halide containing hydrogen atom as one of the constituents such as hydrogen halide, including HF, HCl, HBr, HI and the like or halogen-substituted hydrogenated silicon, including $SiH_2F_2$, $SiH_2I_2$, $SiH_2Cl_2$, $SiHCl_3$, $SiH_2Br_2$, $SiHBr_3$ and the like as an effective starting material for formation of an amorphous layer.

These halides containing hydrogen atom, which can introduce hydrogen atoms very effective for controlling electrical or photo-electrical characteristics into the layer during formation of the amorphous layer simultaneously with introduction of halogen atoms, can preferably be used as the starting material for introduction of halogen atoms.

For incorporation of hydrogen atoms structurally into the amorphous layer, $H_2$ or a gas of hydrogenated silicon, including $SiH_4$, $Si_2H_6$, $Si_3H_8$, $Si_4H_{10}$ and so on may be permitted to be co-present with a silicon compound for supplying Si in a deposition chamber, wherein discharging is excited.

For example, in case of the reactive sputtering method, an Si target is used and a gas for introduction of halogen atoms and $H_2$ gas are introduced together with, if necessary, an inert gas such as He, Ar, etc. into a deposition chamber, wherein a plasma atmosphere is formed to effect sputtering with said Si target, thereby forming an amorphous layer of a-Si(H, X) on the substrate.

Further, there may also be introduced a gas such as of $B_2H_6$ or others in order to effect also doping of impurities.

The amount of hydrogen atoms (H) or halogen atoms (X) incorporated in the amorphous layer in the photoconductive member according to the present invention, or total amount of both of these atoms, may be preferably 1 to 40 atomic %, more preferably 5 to 30 atomic %.

For the purpose of controlling the amounts of hydrogen atoms (H) or/and halogen atoms (X) in the amorphous layer, for example, the deposition support temperature and/or the amounts of the starting materials for incorporation of hydrogen atoms (H) or halogen atoms (X) to be introduced into the deposition device system or the discharging power may be controlled.

In the present invention, as a diluting gas to be used for formation of an amorphous layer according to the glow discharge method or the sputtering method, there may be included preferably so called rare gases such as He, Ne, Ar, etc.

For formation of a first layer region (O, N, C) by introduction of at least one selected from the group (M)

consisting of oxygen atoms, nitrogen atoms and carbon atoms into an amorphous layer or a second layer region (III) by introduction of the atoms of the group III into the amorphous layer, a starting material for introduction of the atoms of the group III or a starting material for introduction of the atoms (M) or both starting materials may be used together with the above-mentioned starting material for formation of an amorphous layer upon layer formation by the glow discharge or reactive sputtering method, while controlling their amounts to be incorporated in the layer formed.

When the glow discharge method is used for formation of a first layer region (O, N, C) constituting the amorphous layer, the starting material for formation of the first layer region may be selected as desired from those for formation of the amorphous layer as described above and at least one of the starting materials for introducing the atoms (M) are added thereto. As the starting material for introduction of the atoms (M), there may be employed most of gaseous substances or gasified gasifiable substances containing at least atoms (M) as constituent atoms.

For example, as the starting material for introduction of oxygen atoms as the atoms (M), there may be employed a mixture of a starting gas having silicon atoms (Si) as constituent atoms, a starting gas having oxygen atoms (O) as constituent atoms and, if necessary, a gas having hydrogen atoms (H) and/or halogen atoms (X) as constituent atoms at a desired mixing ratio. Alternatively, a mixture of a starting gas having silicon atoms (Si) as constituent atoms and a starting gas having oxygen atoms (O) and hydrogen atoms (H) as constituent atoms at a desired mixing ratio can also be used. Further, it is also possible to use a mixture of a starting gas having silicon atoms (Si) as constituent atoms and a starting gas having the three atoms of silicon atoms (Si), oxygen atoms (O) and hydrogen atoms (H) as constituent atoms.

As another method, it is also possible to use a mixture of a starting gas having silicon atoms (Si) and hydrogen atoms (H) as constituent atoms and a starting gas having oxygen atoms (O) as constituent atoms.

As the starting material for introduction of nitrogen atoms as the atoms (M), there may be employed a mixture of a starting gas having silicon atoms (Si) as constituent atoms, a starting gas having nitrogen atoms (N) as constituent atoms and, if necessary, a gas having hydrogen atoms (H) and/or halogen atoms (X) as constituent atoms at a desired mixing ratio. Alternatively, a mixture of a starting gas having silicon atoms (Si) as constituent atoms and a starting gas having nitrogen atoms (N) and hydrogen atoms (H) as constituent atoms at a desired mixing ratio can also be used.

As another method, it is also possible to use a mixture of a starting gas having silicon atoms (Si) and hydrogen atoms (H) as constituent atoms and a starting gas having nitrogen atoms (N) as constituent atoms.

As the starting material for introduction of carbon atoms as the atoms (M), there may be employed a mixture of a starting gas having silicon atoms (Si) as constituent atoms, a starting gas having carbon atoms (C) as constituent atoms and, if necessary, a gas having hydrogen atoms (H) and/or halogen atoms (X) as constituent atoms at a desired mixing ratio. Alternatively, a mixture of a starting gas having silicon atoms (Si) as constituent atoms and a starting gas having carbon atoms (C) and hydrogen atoms (H) as constituent atoms at a desired mixing ratio can also be used. Further, it is also possible to use a mixture of a starting gas having silicon atoms (Si) as constituent atoms and a starting gas having the three atoms of silicon atoms (Si), carbon atoms (C) and hydrogen atoms (H) as constituent atoms.

As another method, it is also possible to use a mixture of a starting gas having silicon atoms (Si) and hydrogen atoms (H) as constituent atoms and a starting gas having carbon atoms (C) as constituent atoms.

As the starting materials for introduction of the atoms (M) to form the first layer region (O, N, C), there may be effectively used, for example, oxygen ($O_2$), ozone ($O_3$), nitrogen monoxide (NO), nitrogen dioxide ($NO_2$), dinitrogen oxide ($N_2O$), dinitrogen trioxide ($N_2O_3$), dinitrogen tetraoxide ($N_2O_4$), dinitrogen pentoxide ($N_2O_5$), nitrogen trioxide ($NO_3$), lower siloxanes containing silicon atoms (Si), oxygen atoms (O) and hydrogen atoms (H) as constituent atoms such as disiloxane ($H_3SiOSiH_3$), trisiloxane ($H_3SiOSiH_2OSiH_3$), and the like; gaseous or gasifiable nitrogen compounds constituted of nitrogen atoms (N) or nitrogen atoms (N) and hydrogen atoms (H) such as nitrogen, nitrides and azides, including for example nitrogen ($N_2$), ammonia ($NH_3$), hydrazine ($H_2NNH_2$), hydrogen azide ($HN_3$), ammonium azide ($NH_4N_3$) and the like; compounds constituted of carbon atom (C) and hydrogen atom (H), for example saturated hydrocarbons having 1 to 5 carbon atoms such as methane ($CH_4$), ethane ($C_2H_6$), propane ($C_3H_8$), n-butane (n-$C_4H_{10}$), pentane ($C_5H_{12}$) and the like; ethylenic hydrocarbons having 2 to 5 carbon atoms such as ethylene ($C_2H_4$), propylene ($C_3H_6$), butene-1 ($C_4H_8$), butene-2 ($C_4H_8$), isobutylene ($C_4H_8$), pentene ($C_5H_{10}$) and the like; and acetylenic hydrocarbons having 2 to 4 carbon atoms such as acetylene ($C_2H_2$), methylacetylene ($C_3H_4$), butyne ($C_4H_6$) and the like; alkyl silanes such containing silicon atoms (Si), carbon atoms (C) and hydrogen atoms (H) as constituent atoms such as $Si(CH_3)_4$, $Si(C_2H_5)_4$, etc.

Otherwise, for the advantage of introducing halogen atoms in addition to nitrogen atoms (N), there may also be employed halogen-containing nitrogen compounds such as nitrogen trifluoride ($F_3N$), nitrogen tetrafluoride ($F_4N_2$), etc.

There may be employed not only one kind but also plural kinds selected from these starting materials for introduction of the atoms (M) for formation of the first layer region (O, N, C). It is also possible to introduce two or more kinds of oxygen atoms, nitrogen atoms and carbon atoms into the first layer region (O, N, C) by use of at least one kind selected from among the starting materials for introduction of oxygen atoms, the starting materials for introduction of nitrogen atoms and the starting materials for introduction of carbon atoms.

For formation of a layer region (O) containing oxygen atoms (O) as the first layer region (O, N, C) according to the sputtering method, a single crystalline or polycrystalline Si wafer or $SiO_2$ wafer or a wafer containing Si and $SiO_2$ mixed therein may be used as target and sputtering may be effected in various gas atmospheres.

For example, when Si wafer used as target, a starting material for introduction oxygen (O), optionally together with a starting material for incorporation of hydrogen atoms (H) and/or halogen atoms (X), which may be diluted with a diluting gas if desired, is introduced into a deposition chamber for sputter, in which gas plasma of these gases is formed and the sputtering is effected with the Si wafer.

Alternatively, with the use of Si and SiO$_2$ as separate targets or with the use of a target of one sheet of a mixture of Si and SiO$_2$, sputtering may be effected in an atmosphere of a diluting gas as a gas for sputter or in a gas atmosphere containing hydrogen atoms (H) or/and halogen atoms (X) as constituent atoms. As the starting material for introduction of oxygen atoms, there may be employed those for introduction of oxygen atoms among the starting materials, as shown in examples for use in glow discharge, as effective gases also in case of sputtering.

For formation of a layer region (N) containing nitrogen atoms (N) as the first layer region (O, N, C) by the sputtering method, a single crystalline or polycrystalline Si wafer or Si$_3$N$_4$ wafer or a wafer containing Si and Si$_3$N$_4$ mixed therein is used as target and the sputtering is effected in an atmosphere of various gases.

For example, when Si wafer is used as target, a gas of a starting material for introduction of nitrogen atoms (N) and, if necessary, a gas of a starting material for introduction of hydrogen atoms (H) or/and halogen atoms (X), which may be diluted with a diluting gas, if desired, is introduced into a deposition chamber for sputter to form a gas plasma therein and effect sputtering with said Si wafer.

Alternatively, Si and Si$_3$N$_4$ as separate targets or one sheet target of a mixture of Si and Si$_3$N$_4$ can be used and sputtering is effected in an atmosphere of a diluting gas as a gas for sputter or a gas atmosphere containing at least hydrogen atoms (H) or/and halogen atoms (X). As the starting material for introduction of nitrogen atoms, there may be employed those for introduction of nitrogen atoms among the starting materials, as exemplified for use in glow discharge, as effective gases also in case of sputtering.

For formation of a layer region (C) containing carbon atoms (C) as the first layer region (O, N, C) by the sputtering method, a single crystalline or polycrystalline Si wafer or C wafer or a wafer containing Si and C mixed therein is used as target and the sputtering is effected in an atmosphere of various gases.

For example, when Si wafer is used as target, a gas of a starting material for introduction of carbon atoms (C) and, if necessary, a gas of a starting material for introduction of hydrogen atoms or/and halogen atoms, which may be diluted with a diluting gas, if desired, is introduced into a deposition chamber for sputter to form a gas plasma therein and effect sputtering with said S wafer.

Alternatively, Si and C as separate targets or one sheet target of a mixture of Si and C can be used and sputtering is effected in an atmosphere of a diluting gas as a gas for sputtering or a gas atmosphere containing at least hydrogen atoms (H) or/and halogen atoms (X) as constituent atoms. As the starting gas for introduction of carbon atoms, there may be employed those for introduction of carbon atoms among the starting gases, as exemplified for use in glow discharge, as effective gases also in case of sputtering.

For introduction of two or more kinds of oxygen atoms (O), nitrogen atoms (N) and carbon atoms (C) in the first layer region (O, N, C) upon formation of said region (O, N, C) according to the sputtering method, either one or a mixture of SiO$_2$ and Si$_3$N$_4$ may be used as the target, or a mixture of Si with SiO$_2$ or Si$_3$N$_4$ may be used as the target, or alternatively a mixture of C with SiO$_2$ or Si$_3$N$_4$ or a mixture of C, SiO$_2$ and Si$_3$N$_4$ may be used as the target.

For formation of a second layer region (III) constituting the amorphous layer, a gaseous or a gasifiable starting material for introduction of the atoms of the group III may be introduced under gaseous state together with a starting material for formation of an amorphous layer as mentioned above into a vacuum deposition chamber when forming the amorphous layer as described above.

The content of the atoms of the group III to be introduced into the second layer region (III) can be freely controlled by controlling the gas flow rates, the gas flow rate ratios of the starting materials, discharging power, etc.

As the starting materials, which can be effectively used in the present invention for introduction of group III atoms, there may be included boron hydrides such as B$_2$H$_6$, B$_4$H$_{10}$, B$_5$H$_9$, B$_5$H$_{11}$, B$_6$H$_{10}$, B$_6$H$_{12}$, B$_6$H$_{14}$, etc., and boron halides such as BF$_3$, BCl$_3$, BBr$_3$, etc. In addition, there may also be employed AlCl$_3$, GaCl$_3$, Ga(CH$_3$)$_3$, InCl$_3$, TlCl$_3$ and others.

In the present invention, formation of a transition layer region (layer region wherein either of the aforesaid selected atoms (M) or the group (III) atoms are changed in distribution concentration in the layer thickness direction) can be achieved by changing suitably the flow rate of the gas containing the component to be changed in distribution concentration. For example, by the manual method or the method using an externally driven motor conventionally used, the opening of a predetermined needle valve provided in the course of the gas flow system may be gradually changed. During this operation, the rate at which the flow rate is changed is not required to be linear, but the flow rate can be changed according to a change rate curve previously designed by, for example, a microcomputer, to obtain a desirable content curve.

During formation of an amorphous layer, whether the plasma state may be either maintained or intermitted at the boundary between the transition layer region and other layer regions, no influence is given on the characteristic of the layer, but it is preferred to perform the operation continuously from the standpoint of process control.

When the transition layer region is to be formed according to the sputtering method, for incorporation of a component to be changed in distribution concentration in a target, a target may be preferred previously so that said component may be distributed at a desired distribution concentration change.

The amorphous layer may have a thickness suitably determined as desired so that the photocarriers generated in the amorphous layer may be transported efficiently, generally 3 to 100$\mu$, preferably 5 to 50$\mu$.

The support may be either electroconductive or insulating. As the electroconductive material, there may be mentioned metals such as NiCr, stainless steel, Al, Cr, Mo, Au, Nb, Ta, V, Ti, Pt, Pd, etc. or alloys thereof.

As insulating supports, there may usually be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and the like. These insulating supports may suitably have at least one surface subjected to electroconductive treatment, and it is desirable to provide other layers on the side to which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO($In_2O_3 + SnO_2$) thereon. Alternatively, a synthetic resin film such as polyester film can be subjected to the electroconductive treatment on its surface by vacuum vapor deposition, electronbeam deposition or sputtering by use of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The support may be shaped in any form such as cylinders, belts, plates or others, and its form may be determined as desired. For example, when the photoconductive member 100 in FIG. 1 is to be used as an image forming member for electrophotography, it may desirably, be formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be exhibited. However, in such a case, the thickness is generally $10\mu$ or more from the points of fabrication and handling of the support as well as its mechanical strength.

In the photoconductive member of the present invention, it is preferred to provide on the amorphous layer a surface layer of so called barrier layer having a function to impede injection of charges from the free surface side into said amorphous layer. The surface layer provided on the amorphous layer is constituted of an amorphous material containing at least one kind of atom selected from the group consisting of carbon atoms (C) and nitrogen atoms (N), optionally together with at least one of hydrogen atom (H) and halogen atom (X), in a matrix of silicon atoms (there are referred to comprehensively as a-$[Si_x(C,N)_{1-x}]_y(H,X)_{1-y}$ (where $0<x<1$, $0<y<1$)), or an electrically insulating metal oxide or an electrically insulating organic compound.

In the present invention, the above halogen atom (X) may preferably be F, Cl, Br or I, especially F or Cl.

Typical examples of the amorphous materials as mentioned above effectively used for constituting the above surface layer may include, for example, carbon type amorphous materials such as a-$Si_aC_{1-a}$, a-$(Si_bC_{1-b})_cH_{1-c}$, a-$(Si_dC_{1-d})_eX_{1-e}$, a-$(Si_fC_{1-f})_g(H+X)_{1-g}$; nitrogen type amorphous materials such as a-$Si_hN_{1-h}$, a-$(Si_iN_{1-i})_jH_{1-j}$, a-$(Si_kN_{1-k})_lX_{1-l}$, a-$(Si_mN_{1-m})_n(H+X)_{1-n}$; etc. Further, there may also be mentioned amorphous materials containing at least two kinds of atoms of carbon (C) and nitrogen (N) as constituent atoms in the amorphous materials as set forth above (where $0<a$, b, c, d, e, f, g, h, i, j, k, l, m, n $<1$).

These amorphous materials may suitably be selected depending on the properties required for the upper layer by optimum design of the layer structure and easiness in consecutive fabrication of the amorphous layer to be provided in contact with said upper layer. In particular, from the standpoint of properties, carbon type amorphous materials may preferably be selected.

As the method for layer formation when constituting the surface layer of the amorphous material as described above, there may be mentioned the glow discharge method, the sputtering method, the ion implantation method, the ion plating method, the electron-beam method or the like.

When the surface layer is constituted of the amorphous material as described above, it is formed carefully so that the characteristics required may be given exactly as desired.

That is, a substance constituted of silicon atom (Si) and at least one of carbon atom (C) and nitrogen atom (N), and optionally hydrogen atom (H) or/and halogen atom (X) can take structurally various forms from crystalline to amorphous and electrical properties from conductive through semi-conductive to insulating and the properties from photoconductive to non-photoconductive depending on the preparation conditions. In the present invention, the preparation conditions are severely selected so that there may be formed amorphous materials which are non-photoconductive and high in dark resistance at least with respect to the light in visible region.

The contents of carbon atoms (C), nitrogen atoms (N), hydrogen atoms (H) and halogen atoms (X) in the surface layer are important factors, similarly to the conditions for preparation of the surface layer, for forming the surface layer provided with desired characteristics.

In forming the surface layer constituted of a-$Si_aC_{1-a}$, the content of carbon atoms may generally 60 to 90 atomic %, preferably 65 to 80 atomic %, most preferably 70 to 75 atomic %, namely in terms of representation by the index a, 0.1 to 0.4, preferably 0.2 to 0.35 most preferably 0.25 to 0.3. In case of the constitution of a-$(Si_bC_{1-b})_cH_{1-c}$, the content of carbon atoms is generally 30 to 90 atomic %, preferably 40 to 90 atomic %, most preferably 50 to 80 atomic %, and the content of hydrogen atoms generally 1 to 40 atomic %, preferably 2 to 35 atomic %, most preferably 5 to 30 atomic %, namely in terms of representation by the indexes b and c, b being generally 0.1 to 0.5, preferably 0.1 to 0.35, most preferably 0.15 to 0.3, and c being generally 0.60 to 0.99, preferably 0.65 to 0.98, most preferably 0.7 to 0.95. In case of the constitution of a-$(Si_dC_{1-d})_eX_{1-e}$ or a-$(Si_fC_{1-f})_g(H+X)_{1-g}$, the content of carbon atoms is generally 40 to 90 atomic %, preferably 50 to 90 atomic %, most preferably 60 to 80 atomic %, the content of halogen atoms or the sum of the contents of halogen atoms and hydrogen atoms generally 1 to 20 atomic %, preferably 1 to 18 atomic %, most preferably 2 to 15 atomic %, and the content of hydrogen atoms, when both halogen atoms and hydrogen atoms are contained, is generally 19 atomic % or less, preferably 13 atomic % or less, namely in terms of representation by d, e, f, and g, d and f are generally 0.1 to 0.47, preferably 0.1 to 0.35, most preferably 0.15 to 0.3, e and g 0.8 to 0.99, preferably 0.85 to 0.99, most preferably 0.85 to 0.98.

When the surface layer is constituted of a nitrogen type amorphous material, the content of nitrogen atoms in case of a-$Si_hN_{1-h}$ is generally 43 to 60 atomic %, preferably 43 to 50 atomic %, namely in terms of representation by h, generally 0.40 to 0.57, preferably 0.53 to 0.57.

In case of the constitution of a-$(Si_iN_{1-i})_jH_{1-j}$, the content of nitrogen atoms is generally 25 to 55 atomic %, preferably 35 to 55 atomic %, and the content of hydrogen atoms generally 2 to 35 atomic %, preferably 5 to 30 atomic %, namely in terms of representation by i and j, i being generally 0.43 to 0.6, preferably 0.43 to 0.5 and j generally 0.65 to 0.98, preferably 0.7 to 0.95. In case of the constitution of a-$(Si_kN_{1-k})_lX_{1-l}$ or a-$(Si_mN_{1-m})_n(H+X)_{1-n}$, the content of nitrogen atoms is generally 30 to 60 atomic %, preferably 40 to 60 atomic %, the content of halogen atoms or the sum of contents of halogen atoms and hydrogen atoms generally 1 to 20 atomic %, preferably 2 to 15 atomic %, and the content of hydrogen atoms, when both halogen atoms and hydrogen atoms are contained, generally 19 atomic % or less, preferably 13 atomic % or less, namely in terms of representation by k, l, m and n, k and m being generally 0.43 to 0.60, preferably 0.43 to 0.49, and l and n generally 0.8 to 0.99, preferably 0.85 to 0.98.

As the electrically insulating metal oxides for constituting the surface layer, there may preferably be mentioned $TiO_2$, $Ce_2O_3$, $ZrO_2$, $HfO_2$, $GeO_2$, $CaO$, $BeO$, $Y_2O_3$, $Cr_2O_3$, $Al_2O_3$, $MgO$, $MgO.Al_2O_3$, $SiO_2.MgO$, etc. A mixture of two or more kinds of these compounds may also be used to form the upper layer.

The surface layer constituted of an electrically insulating metal oxide may be formed by the vacuum deposition method, the CVD (chemical vapor deposition) method, the glow discharge decomposition method, the sputtering method, the ion implantation method, the ion plating method, the electron-beam method or the like.

The numerical range of the layer thickness of the upper layer is an important factor to achieve effectively the above-mentioned purpose. If the layer thickness is too thin, the function of barring penetration of charges from the side of the surface of the surface layer into the amorphous layer cannot sufficiently be fulfilled. On the other hand, if the thickness is too thick, the probability of combination of the photo-carriers generated in the amorphous layer with the charges existing on the surface of upper layer will become very small. Thus, in any of the cases, the objects by provision of a surface layer cannot effectively be achieved.

In view of the above points, the thickness of the surface layer for effective achievement of the object by provision of an upper layer is generally in the range of from 30 Å to 5μ, preferably from 50 Å to 1μ. The photoconductive member of the present invention designed to have layer constitution as described above can overcome all of the problems as mentioned above and exhibit very excellent electrical, optical, photoconductive charcteristics, as well as good environmental characteristics in use.

In particular, when it is applied as an image forming member for electrophotography, it is excellent in charge retentivity in charging treatment without any influence of residual potential on image formation at all, being stable in its electrical properties with high sensitivity and having high SN ratio as well as excellent light fatigue resistance and repeated usage characteristics, whereby it is possible to obtain repeatedly image of high quality with high concentration, clear halftone and high resolution.

Next, the process for producing the photoconductive member formed according to the glow discharge decomposition method is to be described.

Figure 11:
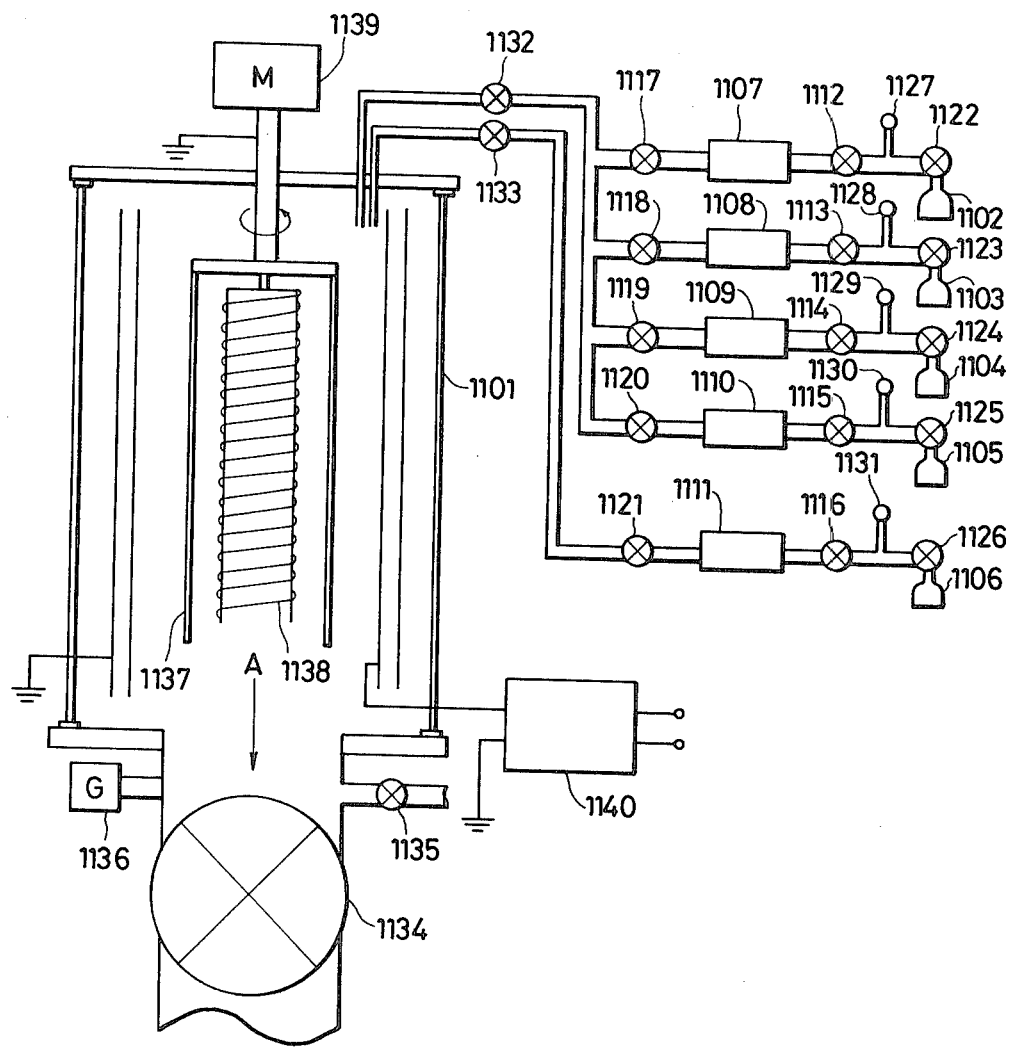
FIG. 11 a schematic view for illustration of the device used for preparation of the photoconductive members of the present invention.

FIG. 11 shows a device for producing a photoconductive member according to the glow discharge decomposition method.

In the gas bombs 1102, 1103, 1104, 1105 and 1106 there are hermetically contained starting gases for formation of respective layers of the present invention. For example, 1102 is a bomb containing $SiH_4$ gas (purity: 99.999%) diluted with He (hereinafter abbreviated as $SiH_4$/He), 1103 is a bomb containing $B_2H_6$ gas (purity: 99.999%) diluted with He (hereinafter abbreviated as $B_2H_6$/He), 1104 is a bomb containing $CH_4$ gas (purity: 99.99%), 1105 is a bomb containing NO gas (purity: 99.999%), and 1106 is a bomb containing $SiF_4$ gas (purity: 99.999%) diluted with He (hereinafter abbreviated as $SiF_4$/He).

For allowing these gases to flow into the reaction chamber 1101, on confirmation of the valves 1122–1126 of the gas bombs 1102–1106 and the lead valve 1135 to be closed, and the inflow valves 1112–1116, the outflow valves 1117–1121 and the auxiliary valves 1132, 1133 to be opened, the main valve 1134 is first opened to evacuate the reaction chamber 1101 and the gas pipelines. As the next step, when the reading on the vacuum indicator 1136 becomes $5 \times 10^{-6}$ Torr, the auxiliary valve 1132, 1133 and the outflow valves 1117–1121 are closed.

Referring now to an example of forming an amorphous layer on a substrate cylinder 1137, $SiH_4$/He gas from the gas bomb 1102, $B_2H_6$/He gas from the gas bomb 1003 and NO gas from the gas bomb 1105 are permitted to flow into the mass-flow controllers 1107, 1108, 1110 by opening the valves 1122, 1123 and 1125 to control the pressures at the outlet pressure gauges 1127, 1128 and 1130 to 1 kg/cm$^2$ and opening gradually the inflow valves 1112, 1113 and 1115. Subsequently, the outflow valves 1117, 1118, 1120 and the auxiliary valve 1132 are gradually opened to permit respective gases to flow into the reaction chamber 1101. The outlet valves 1117, 1118 and 1120 are controlled so that the relative flow rate ratios between $SiH_4$/He, $B_2H_6$/He and NO gases may have desired values and opening of the main valve 1134 is also controlled while watching the reading on the vacuum indicator 1136 so that the pressure in the reaction chamber may reach a desired value. And, after confirming that the temperature of the substrate cylinder 1137 is set at 50°–400° C. by the heater 1138, the power source 1140 is set at a desired power to excite glow discharge in the reaction chamber 1101, while simultaneously performing the operation to change gradually the flow rates of $B_2H_6$/He gas and NO gas in accordance with a previously designed change ratio curve by changing the valves 1118 and 1120 gradually by the manual method or by means of an externally driven motor, thereby controlling the content of oxygen atom and the group III atoms such as B atoms in the layer.

In the above procedure, when $NH_3$ gas or $CH_4$ gas is employed in place of NO gas, nitrogen atoms or carbon atoms maay be incorporated in the layer formed similarly as oxygen atoms. $SiF_4$/He gas or a gas mixture of $SiH_4$/He and $SiF_4$/He may be used in place of $SiH_4$/He gas to form an amorphous layer.

For further forming a surface layer on the amorphous layer, layer formation may be carried out by using $CH_4$ gas in place of $B_2H_6$/He gas and NO gas employed in formation of the amorphous layer.

All the outflow valves other than those for gases necessary for formation of respective layers are of course closed, and during formation of respective layers, in order to avoid remaining of the gas used in the precedent layer in the reaction chamber 1101 and pipelines from the outflow valves 1117–1121 to the reaction chamber 1101, there may be conducted the procedure, comprising once evacuating to a high vacuum the system by closing the outflow valves 1117–1121 and opening the auxiliary valves 1132 and 1133 with full opening of the main valve 1134, if necessary.

During formation of the layer, the substrate cylinder 1137 may be rotated at a constant speed by means of a motor 1139 in order to effect uniform layer formation.

The present invention is desired in further detail below by referring to the Examples.

ducibility, etc. were performed for the images visualized on transfer papers.

TABLE 1

| Amorphous layer constitution | Gases employed (Vol. %) | Flow rate (SCCM) | Layer formation rate (Å/S) | Layer thickness ($\mu$) | Discharging power (W/cm$^2$) | Substrate temperature (°C.) | Pressure during reaction (torr) | Discharging frequency (MHz) |
|---|---|---|---|---|---|---|---|---|
| Layer region ($t_2$ $t_B$) | SiH$_4$/He = 0.5<br>NO 100<br>B$_2$H$_6$/He = 3 × 10$^{-3}$ | SiH$_4$ = 200 suitably changed depending on sample | 16 | 20 | 0.2 | 250 | 0.5 | 13.56 |
| Layer region ($t_1$ $t_2$) | SiH$_4$/He = 0.5<br>NO 100<br>B$_2$H$_6$/He = 3 × 10$^{-3}$ | SiH$_4$ = 200 suitably changed continuously | 16 | 1 | 0.2 | 250 | 0.5 | 13.56 |
| Layer region ($t_s$ $t_1$) | SiH$_4$/He = 0.5 | SiH$_4$ = 300 | 16 | 0.15 | 0.2 | 250 | 0.5 | 13.56 |

TABLE 2

| O distribution concentration $C_1$ atomic % | B distribution concentration $C_{(III)1}$ atomic ppm | | | | | | | | | | | |
|---|---|---|---|---|---|---|---|---|---|---|---|---|
| | 0.1 | 0.5 | 1 | 5 | 10 | 30 | 50 | 80 | 100 | 200 | 400 | 800 |
| 0.01 | 1-1 Δ | 1-2 Δ | 1-3 Δ | 1-4 | 1-5 | 1-6 Δ | 1-7 Δ | 1-8 Δ | 1-9 Δ | 1-10 Δ | 1-11 Δ | 1-12 Δ |
| 0.03 | 2-1 Δ | 2-2 Δ | 2-3 Δ | 2-4 | 2-5 | 2-6 Δ | 2-7 Δ | 2-8 Δ | 2-9 Δ | 2-10 Δ | 2-11 Δ | 2-12 Δ |
| 0.05 | 3-1 Δ | 3-2 Δ | 3-3 Δ | 3-4 | 3-5 | 3-6 | 3-7 Δ | 3-8 Δ | 3-9 Δ | 3-10 Δ | 3-11 Δ | 3-12 Δ |
| 0.1 | 4-1 Δ | 4-2 Δ | 4-3 Δ | 4-4 | 4-5 | 4-6 | 4-7 | 4-8 Δ | 4-9 Δ | 4-10 Δ | 4-11 Δ | 4-12 Δ |
| 0.3 | 5-1 Δ | 5-2 Δ | 5-3 Δ | 5-4 | 5-5 | 5-6 | 5-7 | 5-8 | 5-9 | 5-10 | 5-11 Δ | 5-12 Δ |
| 0.5 | 6-1 Δ | 6-2 Δ | 6-3 Δ | 6-4 | 6-5 | 6-6 | 6-7 | 6-8 | 6-9 | 6-10 | 6-11 Δ | 6-12 Δ |
| 1 | 7-1 Δ | 7-2 Δ | 7-3 Δ | 7-4 | 7-5 | 7-6 | 7-7 | 7-8 | 7-9 | 7-10 | 7-11 Δ | 7-12 Δ |
| 2 | 8-1 Δ | 8-2 Δ | 8-3 | 8-4 | 8-5 | 8-6 | 8-7 | 8-8 | 8-9 | 8-10 | 8-11 | 8-12 Δ |
| 3.5 | 9-1 | 9-2 | 9-3 | 9-4 | 9-5 | 9-6 | 9-7 | 9-8 | 9-9 | 9-10 | 9-11 | 9-12 Δ |
| 5 | 10-1 | 10-2 | 10-3 | 10-4 | 10-5 | 10-6 | 10-7 | 10-8 | 10-9 | 10-10 | 10-11 | 10-12 |
| 7 | 11-1 Δ | 11-2 | 11-3 | 11-4 | 11-5 | 11-6 | 11-7 | 11-8 | 11-9 | 11-10 | 11-11 Δ | 11-12 Δ |
| 10 | 12-1 Δ | 12-2 Δ | 12-3 | 12-4 | 12-5 | 12-6 | 12-7 | 12-8 | 12-9 | 12-10 | 12-11 Δ | 12-12 Δ |
| 20 | 13-1 Δ | 13-2 Δ | 13-3 Δ | 13-4 | 13-5 | 13-6 | 13-7 | 13-8 | 13-9 | 13-10 | 13-11 Δ | 13-12 Δ |
| 30 | 14-1 Δ | 14-2 Δ | 14-3 Δ | 14-4 Δ | 14-5 Δ | 14-6 Δ | 14-7 Δ | 14-8 ΔΔ | 14-9 Δ | 14-10 Δ | 14-11 | 14-12 Δ |

Evaluation standards:
 Excellent
 Good
 Δ Practically satisfactory

EXAMPLE 1

Image forming members for electrophotography were prepared by carrying out formation of amorphous layers having the layer constitution as shown in FIG. 2 on Al cylinders by means of the preparation device as shown in FIG. 11, with the contents of boron (B) and oxygen (O) in the layers being as parameters. The common preparation conditions are as shown in Table 1.

In Table 2, there are shown the results of evaluation for respective samples, with contents of boron $C_{(III)1}$ represented on the axis of abscissa and the contents of oxygen $C_1$ on the axis of ordinate, respectively.

The image forming members for electrophotography prepared were subjected to a series of electrophotographic process of charging-imagewise exposure-development-transfer, and overall evaluations of the results with respect to density, resolution, tone repro-

EXAMPLE 2

Image forming members for electrophotography were prepared by carrying out formation of amorphous layers having the layer constitution as shown in FIG. 3 on Al cylinders by means of the preparation device as shown in FIG. 11, with the contents of boron (B) and oxygen (O) in the layers being as parameters. The preparation conditions for respective layer regions constituting the amorphous layers are shown in Table 3 below.

| Distribution concentration of oxygen $C_1$ | 3.5 atomic % |
| Distribution concentration of boron $C_{(III)1}$ | 80 atomic ppm |

Using the image forming members for electrophotography obtained, toner images were formed repeatedly on transfer papers by applying similarly the electrophotographic process as in Example 1, whereby transferred toner images of high quality could be obtained stably.

TABLE 4

| Amorphous layer constitution | Gases employed (vol. %) | Flow rate (SCCM) | Flow rate ratio | Layer formation rate (Å/S) | Layer thickness (μ) | Discharging power (W/cm²) | Substrate temperature (°C.) | Pressure during reaction (torr) |
| --- | --- | --- | --- | --- | --- | --- | --- | --- |
| Layer region ($t_3$ $t_B$) | $SiH_4/He = 0.5$<br>NO 100<br>$B_2H_6/He = 3 \times 10^{-3}$ | $SiH_4 = 200$ | $NO/SiH_4 = 8 \times 10^{-2}$<br>$B_2H_6/SiH_4 = 3 \times 10^{-3}$ | 20 | 20 | 0.2 | 250 | 0.5 |
| Layer region ($t_2$ $t_3$) | $SiH_4/He = 0.5$<br>NO 100<br>$B_2H_6/He = 3 \times 10^{-3}$ | $SiH_4 = 200$ | $NO/SiH_4 = 8 \times 10^{-2}$<br>$B_2H_6/SiH_4 = 3 \times 10^{-5} \sim 1.5 \times 10^{-5}$ | 20 | 0.5 | 0.2 | 250 | 0.5 |
| Layer region ($t_1$ $t_2$) | $SiH_4/He = 0.5$<br>NO = 100<br>$B_2H_6/He = 3 \times 10^{-3}$ | $SiH_4 = 200$ | $NO/SiH_4 = 8 \times 10^{-2} \sim 0$<br>$B_2H_6/SiH_4 = 1.5 \times 10^{-5} \sim 0$ | 20 | 0.5 | 0.2 | 250 | 0.5 |
| Layer region ($t_S$ $t_1$) | $SiH_4/He = 0.5$ | $SiH_4 = 300$ | | 20 | 1 | 0.2 | 250 | 0.5 |

Discharging frequency: 13.56 MHz tographic process as in Example 1, whereby transferred toner images of high quality could be obtained stably.

TABLE 3

| Amorphous layer constitution | Gases employed (Vol. %) | Flow rate (SCCM) | Flow rate ratio | Layer formation rate (Å/S) | Layer thickness (μ) | Discharging power (W/cm²) | Substrate temperature (°C.) | Pressure during reaction (torr) |
| --- | --- | --- | --- | --- | --- | --- | --- | --- |
| Layer region ($t_3$ $t_B$) | $SiH_4/He = 0.5$<br>NO 100<br>$B_2H_6/He = 3 \times 10^{-3}$ | $SiH_4 = 200$ | $NO/SiH_4 = 4 \times 10^{-2}$ | 20 | 20 | 0.18 | 250 | 0.5 |
| Layer region ($t_2$ $t_3$) | $SiH_4/He = 0.5$<br>NO 100<br>$B_2H_6/He = 3 \times 10^{-3}$ | $SiH_4 = 200$ | $NO/SiH_4 = 4 \times 10^{-2} \sim 2 \times 10^{-2}$<br>$B_2H_6/SiH_4 = 8 \times 10^{-5}$ | 20 | 0.5 | 0.18 | 250 | 0.5 |
| Layer region ($t_1$ $t_2$) | $SiH_4/He = 0.5$<br>NO 100<br>$B_2H_6/He = 3 \times 10^{-3}$ | $SiH_4 = 200$ | $NO/SiH_4 = 2 \times 10^{-2} \sim 0$<br>$B_2H_6/SiH_4 = 8 \times 10^{-5} \sim 0$ | 20 | 0.5 | 0.18 | 250 | 0.5 |
| Layer region ($t_S$ $t_1$) | $SiH_4/He = 0.5$ | $SiH_4 = 300$ | | 20 | 1 | 0.18 | 250 | 0.5 |

Discharging frequency: 13.56 MHz
Note: The swung dask represents "changing the flow rate ratio from one value to another". The same note applies to subsequent other tables.

EXAMPLE 3

Image forming members for electrophotography were prepared by carrying out formation of amorphous layers having the layer constitution as shown in FIG. 4 on Al cylinders by means of the preparation device as shown in FIG. 11, with the contents of boron (B) and oxygen (O) in the layers being as parameters. The preparation conditions for respective layer regions constituting the amorphous layers are shown in Table 4 below.

| | |
| --- | --- |
| Distribution concentration of oxygen $C_1$ | 7 atomic % |
| Distribution concentration of boron $C_{(III)1}$ | 30 atomic ppm |

Using the image forming members for electrophotography obtained, toner images were formed repeatedly on transfer papers by applying similarly the electrophotographic process as in Example 1, whereby transferred toner images of high quality could be obtained stably.

EXAMPLE 4

Image forming members for electrophotography were prepared by carrying out formation of amorphous layers having the layer constitution as shown in FIG. 5 on Al cylinders by means of the preparation device as shown in FIG. 11, with the contents of boron (B) and oxygen (O) in the layers being as parameters. The preparation conditions for respective layer regions constituting the amorphous layers are shown in Table 5 below.

| | |
| --- | --- |
| Distribution concentration of oxygen $C_1$ | 7 atomic % |
| Distribution concentration of boron $C_{(III)1}$ | 10 atomic ppm |
| Distribution concentration of boron $C_{(III)3}$ | see Table 6 |

Using the image forming members for electrophotography obtained, toner images were formed repeatedly on transfer papers by applying similarly the electrophotographic process as in Example 1, to obtain the evaluations as shown in Table 6.

In Table 5, X(4) means the following:

| | |
|---|---|
| S4-1 ... $1 \times 10^{-7}$ | S4-2 ... $5 \times 10^{-7}$ |
| S4-3 ... $1 \times 10^{-6}$ | S4-4 ... $5 \times 10^{-6}$ |

| | |
|---|---|
| Distribution concentration of oxygen $C_1$ | 1 atomic % |
| Distribution concentration of boron $C_{(III)1}$ | 100 atomic ppm |
| Distribution concentration of boron $C_{(III)3}$ | see Table 6 |

Using the image forming members for electrophotography obtained, respectively, toner images were formed repeatedly on transfer papers by applying similarly the

TABLE 5

| Amorphous layer constitution | Gases employed (Vol. %) | Flow rate (SCCM) | Flow rate ratio | Layer formation rate (Å/S) | Layer thickness ($\mu$) | Discharging power (W/cm$^2$) | Substrate temperature (°C.) | Pressure during reaction (torr) |
|---|---|---|---|---|---|---|---|---|
| Layer region ($t_5\ t_B$) | SiH$_4$/He = 0.5 NO 100 B$_2$H$_6$/He = $3 \times 10^{-3}$ | SiH$_4$ = 200 | NO/SiH$_4$ = $8 \times 10^{-2}$ B$_2$H$_6$/SiH$_4$ = $1 \times 10^{-5}$ | 18 | 20 | 0.18 | 250 | 0.5 |
| Layer region ($t_4\ t_5$) | SiH$_4$/He = 0.5 NO 100 B$_2$H$_6$/He = $3 \times 10^{-3}$ | SiH$_4$ = 200 | NO/SiH$_4$ = $8 \times 10^{-2} \sim 5 \times 10^{-2}$ B$_2$H$_6$/SiH$_4$ = $1 \times 10^{-5}$ | 18 | 0.5 | 0.18 | 250 | 0.5 |
| Layer region ($t_3\ t_4$) | SiH$_4$/He = 0.5 NO 100 B$_2$H$_6$/He = $3 \times 10^{-3}$ | SiH$_4$ = 200 | NO/SiH$_4$ = $5 \times 10^{-2} \sim 0$ B$_2$H$_6$/SiH$_4$ = $1 \times 10^{-5} \sim$ X(4) | 18 | 0.3 | 0.18 | 250 | 0.5 |
| Layer region ($t_2\ t_3$) | SiH$_4$/He = 0.5 B$_2$H$_6$/He = $3 \times 10^{-3}$ | SiH$_4$ = 200 | B$_2$H$_6$/SiH$_4$ = X(4) | 18 | 0.5 | 0.18 | 250 | 0.5 |
| Layer region ($t_1\ t_2$) | SiH$_4$/He = 0.5 NO 100 B$_2$H$_6$/He = $3 \times 10^{-3}$ | SiH$_4$ = 200 | B$_2$H$_6$/SiH$_4$ = X(4) $\sim$ 0 | 18 | 0.3 | 0.18 | 250 | 0.5 |
| Layer region ($t_s\ t_1$) | SiH$_4$/He = 0.5 | SiH$_4$ = 300 | | 18 | 0.3 | 0.18 | 250 | 0.5 |

Discharging frequency: 13.56 MHz

TABLE 6

| | B distribution concentration $C_{(III)3}$ (atomic %) | | | | | | | | |
|---|---|---|---|---|---|---|---|---|---|
| | 0.1 | 0.5 | 1 | 5 | 10 | 20 | 40 | 80 | 100 |
| Example | Sample No./ Evaluation | Sample No./ Evaluation | Sample No./ Evaluation | Sample No./ Evaluation | Sample No./ Evaluation | Sample No./ Evaluation | Sample No./ Evaluation | Sample No./ Evaluation | Sample No./ Evaluation |
| 4 | S4-1 Δ | S4-2 | S4-3 | S4-4 | | | | | |
| 5 | S5-1 Δ | S5-2 | S5-3 | S5-4 | S5-5 | S5-6 | S5-7 | S5-8 Δ | S5-9 Δ |
| 6 | S6-1 | S6-2 | S6-3 | S6-4 | S6-5 | S6-6 | | | |
| 7 | S7-1 | S7-2 | S7-3 | S7-4 | S7-5 | S7-6 | S7-7 | S7-8 Δ | S7-9 Δ |

Evaluation standards are the same as in Table 2

EXAMPLE 5

Image forming members for electrophotography were prepared by carrying out formation of amorphous layers having the layer constitution as shown in FIG. 6 on Al cylinders by means of the preparation device as shown in FIG. 11, with the contents of boron (B) and oxygen (O) in the layers being as parameters. The preparation conditions for respective layer regions constituting the amorphous layers are shown in Table 7 below.

electrophotographic process as in Example 1, to obtain the evaluations as shown in Table 6.

In Table 7, X(5) means the following:

| | |
|---|---|
| S5-1 ... $1 \times 10^{-7}$ | S5-2 ... $5 \times 10^{-7}$ |
| S5-3 ... $1 \times 10^{-6}$ | S5-4 ... $5 \times 10^{-6}$ |
| S5-5 ... $1 \times 10^{-5}$ | S5-6 ... $2 \times 10^{-5}$ |
| S5-7 ... $4 \times 10^{-5}$ | S5-8 ... $5 \times 10^{-5}$ |
| S5-9 ... $6 \times 10^{-5}$ | |

TABLE 7

| Amorphous layer constitution | Gases employed (Vol. %) | Flow rate (SCCM) | Flow rate ratio | Layer formation rate (Å/S) | Layer thickness (μ) | Discharging power (W/cm$^2$) | Substrate temperature (°C) | Pressure during reaction (torr) |
|---|---|---|---|---|---|---|---|---|
| Layer region ($t_5 \, t_B$) | SiH$_4$/He = 0.5<br>NO 100<br>B$_2$H$_6$/He = 3 × 10$^{-3}$ | SiH$_4$ = 200 | NO/SiH$_4$ = 1.1 × 10$^{-2}$<br>B$_2$H$_6$/SiH$_4$ = 8 × 10$^{-5}$ | 20 | 20 | 0.2 | 250 | 0.5 |
| Layer region ($t_4 \, t_5$) | SiH$_4$/He = 0.5<br>NO 100<br>B$_2$H$_6$/He = 3 × 10$^{-3}$ | SiH$_4$ = 200 | NO/SiH$_4$ = 1.1 × 10$^{-2}$ ~ 7.4 × 10$^{-3}$<br>B$_2$H$_6$/SiH$_4$ = 8.0 × 10$^{-5}$ ~ X(5) | 20 | 1.0 | 0.2 | 250 | 0.5 |
| Layer region ($t_3 \, t_4$) | SiH$_4$/He = 0.5<br>NO 100<br>B$_2$H$_6$/He = 3 × 10$^{-3}$ | SiH$_4$ = 200 | NO/SiH$_4$ = 7.4 × 10$^{-3}$ ~ 0<br>B$_2$H$_6$/SiH$_4$ = X(5) | 20 | 0.5 | 0.2 | 250 | 0.5 |
| Layer region ($t_2 \, t_3$) | SiH$_4$/He = 0.5<br>B$_2$H$_6$/He = 3 × 10$^{-3}$ | SiH$_4$ = 200 | B$_2$H$_6$/SiH$_4$ = X(5) | 20 | 0.3 | 0.2 | 250 | 0.5 |
| Layer region ($t_1 \, t_2$) | SiH$_4$/He = 0.5<br>B$_2$H$_6$/He = 3 × 10$^{-3}$ | SiH$_4$ = 200 | B$_2$H$_6$/SiH$_4$ = X(5) ~ 0 | 20 | 0.5 | 0.2 | 250 | 0.5 |
| Layer region ($t_s \, t_1$) | SiH$_4$/He = 0.5 | SiH$_4$ = 300 | | 20 | 0.5 | 0.2 | 250 | 0.5 |

Discharging frequency: 13.56 MHz

EXAMPLE 6

Image forming members for electrophotography were prepared by carrying out formation of amorphous layers having the layer constitution as shown in FIG. 7 on Al cylinders by means of the preparation device as shown in FIG. 11, with the contents of boron (B) and oxygen (O) in the layers being as parameters.

The preparation conditions for respective layer regions constituting the amorphous layers are shown in Table 8 below.

| Distribution concentration of oxygen C$_1$ | 2 atomic % |
|---|---|
| Distribution concentration of boron C$_{(III)1}$ | 30 atomic ppm |
| Distribution concentration of boron C$_{(III)3}$ | see Table 6 |

Using the image forming members for electrophotography obtained, respectively, toner images were formed repeatedly on transfer papers by applying similarly the electrophotographic process as in Example 1, to obtain the evaluations as shown in Table 6.

In Table 8, X(6) means the following:

| S6-1 ... 1 × 10$^{-7}$ | S6-2 ... 5 × 10$^{-7}$ |
|---|---|
| S6-3 ... 1 × 10$^{-6}$ | S6-4 ... 5 × 10$^{-6}$ |
| S6-5 ... 1 × 10$^{-5}$ | S6-6 ... 2 × 10$^{-5}$ |

TABLE 8

| Amorphous layer constitution | Gases employed (Vol. %) | Flow rate (SCCM) | Flow rate ratio | Layer formation rate (Å/S) | Layer thickness (μ) | Discharging power (W/cm$^2$) | Substrate temperature (°C) | Pressure during reaction (torr) |
|---|---|---|---|---|---|---|---|---|
| Layer region ($t_3 \, t_B$) | SiH$_4$/He = 0.5<br>NO 100<br>B$_2$H$_6$/He = 3 × 10$^{-3}$ | SiH$_4$ = 200 | NO/SiH$_4$ = 2.2 × 10$^{-2}$<br>B$_2$H$_6$/SiH$_4$ = 3 × 10$^{-5}$ | 20 | 20 | 0.2 | 250 | 0.5 |
| Layer region ($t_2 \, t_3$) | SiH$_4$He = 0.5<br>NO 100<br>B$_2$H$_6$/He = 3 × 10$^{-3}$ | SiH$_4$ = 200 | NO/SiH$_4$ = 2.2 × 10$^{-2}$ ~ 1.38 × 10$^{-2}$<br>B$_2$H$_6$/SiH$_4$ = 3 × 10$^{-5}$ | 20 | 0.5 | 0.2 | 250 | 0.5 |
| Layer region ($t_1 \, t_2$) | SiH$_4$/He = 0.5<br>NO 100<br>B$_2$H$_6$/He = 3 × 10$^{-3}$ | SiH$_4$ = 200 | NO/SiH$_4$ = 1.38 × 10$^{-2}$ ~ 0<br>B$_2$H$_6$/SiH$_4$ = 3 × 10$^{-5}$ ~ X(6) | 20 | 0.3 | 0.2 | 250 | 0.5 |
| Layer region ($t_s \, t_1$) | SiH$_4$/He = 0.5<br>B$_2$H$_6$/He = 3 × 10$^{-3}$ | SiH$_4$ = 200 | B$_2$H$_6$/SiH$_4$ = X(6) | 20 | 0.2 | 0.2 | 250 | 0.5 |

Discharging frequency: 13.56 MHz

EXAMPLE 7

Image forming members for electrophotography were prepared by carrying out formation of amorphous layers having the layer constitution as shown in FIG. 8 on Al cylinders by means of the preparation device as shown in FIG. 11, with the contents of boron (B) and oxygen (O) in the layers being as parameters.

The preparation conditions for respective layer regions constituting the amorphous layers are shown in Table 9 below.

| Distribution concentration of oxygen $C_1$ | 2 atomic % |
|---|---|
| Distribution concentration of boron $C_{(III)1}$ | 200 atomic ppm |
| Distribution concentration of boron $C_{(III)3}$ | see Table 6 |

Using the image forming members for electrophotography obtained, respectively, toner images were formed repeatedly on transfer papers by applying similarly the electrophotographic process as in Example 1, to obtain the evaluations as shown in Table 6.

In Table 9, X(7) means the following:

| S7-1 ... $1 \times 10^{-7}$ | S7-2 ... $5 \times 10^{-7}$ |
|---|---|
| S7-3 ... $1 \times 10^{-6}$ | S7-4 ... $5 \times 10^{-6}$ |
| S7-5 ... $1 \times 10^{-5}$ | S7-6 ... $2 \times 10^{-5}$ |
| S7-7 ... $4 \times 10^{-5}$ | S7-8 ... $8 \times 10^{-5}$ |
| S7-9 ... $1 \times 10^{-4}$ | | layers having the layer constitution as shown in FIG. 9 on Al cylinders by means of the preparation device as shown in FIG. 1, with the contents of boron (B) and oxygen (O) in the layer being as parameters.

The preparation conditions for respective layer regions constituting the amorphous layers are shown in Table 10 below.

| Distribution concentration of oxygen $C_1$ | 5 atomic % |
|---|---|
| Distribution concentration of oxygen $C_3$ | see Table 11 |
| Distribution concentration of boron $C_{(III)1}$ | 50 atomic ppm |

Using the image forming members for electrophotography obtained, respectively, toner images were formed repeatedly on transfer papers by applying similarly the electrophotographic process as in Example 1, to obtain the evaluations as shown in Table 11.

In Table 10, X(8) means the following:

| S8-1 ... $1.1 \times 10^{-4}$ | S8-2 ... $4.4 \times 10^{-4}$ |
|---|---|
| S8-3 ... $1.1 \times 10^{-3}$ | S8-4 ... $2.2 \times 10^{-3}$ |
| S8-5 ... $4.4 \times 10^{-3}$ | S8-6 ... $7.7 \times 10^{-3}$ |

TABLE 9

| Amorphous layer constitution | Gases employed (Vol. %) | Flow rate (SCCM) | Flow rate ratio | Layer formation rate (Å/S) | Layer thickness ($\mu$) | Discharging power (W/cm$^2$) | Substrate temperature (°C.) | Pressure during reaction (torr) |
|---|---|---|---|---|---|---|---|---|
| Layer region ($t_3\ t_B$) | SiH$_4$/He = 0.5<br>NO 100<br>B$_2$H$_6$/He = 3 × 10$^{-3}$ | SiH$_4$ = 200 | NO/SiH$_4$ = 2.2 × 10$^{-2}$<br>B$_2$H$_6$/SiH$_4$ = 2 × 10$^{-4}$ | 20 | 20 | 0.2 | 250 | 0.5 |
| Layer region ($t_2\ t_3$) | SiH$_4$/He = 0.5<br>NO 100<br>B$_2$H$_6$/He = 3 × 10$^{-3}$ | SiH$_4$ = 200 | NO/SiH$_4$ = 2.2 × 10$^{-2}$ ~ 1.47 × 10$^{-2}$<br>B$_2$H$_6$/SiH$_4$ = 2 × 10$^{-4}$ ~ X(7) | 20 | 0.3 | 0.2 | 250 | 0.5 |
| Layer region ($t_1\ t_2$) | SiH$_4$/He = 0.5<br>NO 100<br>B$_2$H$_6$/He = 3 × 10$^{-3}$ | SiH$_4$ = 200 | NO/SiH$_4$ = 1.47 × 10$^{-2}$ ~ 0<br>B$_2$H$_6$/SiH$_4$ = X(7) | 20 | 1.0 | 0.2 | 250 | 0.5 |
| Layer region ($t_s\ t_1$) | SiH$_4$/He = 0.5<br>B$_2$H$_6$/He = 3 × 10$^{-3}$ | SiH$_4$ = 200 | B$_2$H$_6$/SiH$_4$ = X(7) | 20 | 2.0 | 0.2 | 250 | 0.5 |

Discharging frequency: 13.56 MHz

EXAMPLE 8

Image forming members for electrophotography were prepared by carrying out formation of amorphous

TABLE 10

| Amorphous layer constitution | Gases employed (Vol. %) | Flow rate (SCCM) | Flow rate ratio | Layer formation rate (Å/S) | Layer thickness ($\mu$) | Discharging power (W/cm$^2$) | Substrate temperature (°C.) | Pressure during reaction (torr) |
|---|---|---|---|---|---|---|---|---|
| Layer region ($t_s\ t_B$) | SiH$_4$/He = 0.5<br>NO 100<br>B$_2$H$_6$/He = 3 × 10$^{-3}$ | SiH$_4$ = 200 | NO/SiH$_4$ = 1.1 × 10$^{-2}$<br>B$_2$H$_6$/SiH$_4$ = 4 × 10$^{-5}$ | 20 | 20 | 0.2 | 250 | 0.5 |
| Layer region ($t_1\ t_2$) | SiH$_4$/He = 0.5<br>NO 100<br>B$_2$H$_6$/He = 3 × 10$^{-3}$ | SiH$_4$ = 200 | NO/SiH$_4$ = 1.1 × 10$^{-2}$ ~ x(8)<br>B$_2$H$_6$/SiH$_4$ = 4 × 10$^{-4}$ ~ 2 × 10$^{-5}$ | 20 | 0.5 | 0.2 | 250 | 0.5 |
| Layer region ($t_s\ t_1$) | SiH$_4$ = 0.5 | SiH$_4$ = 300 | | 20 | 1 | 0.2 | 250 | 0.5 |

Discharging frequency: 13.56 MHz

TABLE 11

| Sample No. | S8-1 | S8-2 | S8-3 | S8-4 | S8-5 | S8-6 |
|---|---|---|---|---|---|---|
| O distribution concentration $C_{(o)3}$ (atomic %) | 0.05 | 0.2 | 1.0 | 1.0 | 2 | 3.5 |
| Evaluation | Δ | Δ | | | | |

Evaluation standards are the same as in Table 2

TABLE 12

| Amorphous layer constitution | Gases employed (Vol. %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region ($t_3\ t_B$) | $SiH_4/He = 0.5$<br>NO 100<br>$B_2H_6/He = 3 \times 10^{-3}$ | $SiH_4 = 200$ | $NO/SiH_4 = 7.7 \times 10^{-2}$<br>$B_2H_6/SiH_4 = 8 \times 10^{-5}$ | 20 | 20 | 0.2 | 250 | 0.5 |
| Layer region ($t_2\ t_3$) | $SiH_4/He = 0.5$<br>NO 100<br>$B_2H_6/He = 3 \times 10^{-3}$ | $SiH_4 = 200$ | $NO/SiH_4 = 7.7 \times 10^{-2} \sim 3.85 \times 10^{-2}$<br>$B_2H_6/SiH_4 = 8 \times 10^{-5} \sim 0$ | 20 | 0.5 | 0.2 | 250 | 0.5 |
| Layer region ($t_1\ t_2$) | $SiH_4/He = 0.5$<br>NO 100 | $SiH_4 = 200$ | $NO/SiH_4 = 3.85 \times 10^{-2} \sim 0$ | 20 | 0.5 | 0.2 | 250 | 0.5 |
| Layer region ($t_s\ t_1$) | $SiH_4/He = 0.5$ | $SiH_4 = 300$ | | 20 | 1 | 0.2 | 250 | 0.5 |

Discharging frequency: 13.56 MHz

TABLE 13

| Layer region ($t_2\ t_3$)(μm) | Layer region ($t_1\ t_2$)(μm) | | | | |
|---|---|---|---|---|---|
| | 0.1<br>Sample No./<br>Evaluation | 0.5<br>Sample No./<br>Evaluation | 1.0<br>Sample No./<br>Evaluation | 4<br>Sample No./<br>Evaluation | 8<br>Sample No./<br>Evaluation |
| 0.1 | S9-11 | S9-12 | S9-13 | S9-14 | S9-15 |
| 0.2 | S9-21 | S9-22 | S9-23 | S9-24 | S9-25 |
| 1.0 | S9-31 | S9-32 | S9-33 | S9-34 | S9-35 |
| 4 | S9-41 | S9-42 | S9-43 | S9-44 | S9-45 |
| 8 | S9-51 | S9-52 | S9-53 | S9-54 | S9-55 |

EXAMPLE 9

Image forming members for electrophotography were prepared by carrying out formation of amorphous layers having the layer constitution as shown in FIG. 2 on Al cylinders by means of the preparation device as shown in FIG. 11, with the thicknesses of the layer region ($t_1\ t_2$) and the layer region ($t_2\ t_3$) in the amorphous layers being as parameters. The preparation conditions for respective layer regions constituting the amorphous layers are shown in Table 12 below.

| | |
|---|---|
| Distribution concentration of oxygen $C_1$ | 7 atomic % |
| Distribution concentration of boron $C_{(III)1}$ | 100 atomic ppm |

Using the image forming members for electrophotography obtained, toner images were formed repeatedly on transfer papers by applying similarly the electrophotographic process as in Example 1, whereby the evaluations as shown in Table 13 were obtained.

EXAMPLE 10

Image forming members for electrophotography were prepared by carrying out formation of amorphous layers having the layer constitution as shown in FIG. 2 on Al cylinders by means of the preparation device as shown in FIG. 11, with the contents of boron (B) and oxygen (O) in the layers being as parameters.

The preparation conditions for respective layer regions constituting the amorphous layers are shown in Table 14 below.

| | |
|---|---|
| Distribution concentration of oxygen $C_1$ | 3.5 atomic % |
| Distribution concentration of boron $C_{(III)1}$ | 80 atomic ppm |
| Distribution concentration of boron $C_{(III)2}$ | 500 atomic ppm |

Using the image forming members for electrophotography obtained, respectively, toner images were formed repeatedly on transfer papers by applying similarly the electrophotographic process as in Example 1, whereby transferred toner images of high quality could be obtained stably.

TABLE 14

| Amorphous layer constitution | Gases employed (Vol. %) | Flow rate (SCCM) | Flow rate ratio | Layer formation rate (Å/s) | Layer thickness (μ) | Discharging power (W/cm²) | Substrate temperature (°C.) | Pressure during reaction (torr) |
|---|---|---|---|---|---|---|---|---|
| Layer region ($t_4 \, t_B$) | $SiH_4/He = 0.5$<br>NO 100<br>$B_2H_6/He = 3.3 \times 10^{-3}$ | $SiH_4 = 200$ | $NO/SiH_4 = 4 \times 10^{-2}$<br>$B_2H_6/SiH_4 = 5 \times 10^{-4}$ | 20 | 0.3 | 0.2 | 250 | 0.5 |
| Layer region ($t_2 \, t_4$) | $SiH_4/He = 0.5$<br>NO 100<br>$B_2H_6/He = 3.3 \times 10^{-3}$ | $SiH_4 = 200$ | $NO/SiH_4 = 4 \times 10^{-2}$<br>$B_2H_6/SiH_4 = 8 \times 10^{-5}$ | 20 | 20 | 0.2 | 250 | 0.5 |
| Layer region ($t_1 \, t_2$) | $SiH_4/He = 0.5$<br>NO 100<br>$B_2H_6/He = 3.3 \times 10^{-3}$ | $SiH_4 = 200$ | $NO/SiH_4 = 4 \times 10^{-2} \sim 0$<br>$B_2H_6/SiH_4 = 8 \times 10^{-5} \sim 0$ | 20 | 1 | 0.2 | 250 | 0.5 |
| Layer region ($t_s \, t_1$) | $SiH_4/He = 0.5$ | $SiH_4 = 300$ | | 20 | 0.15 | 0.2 | 250 | 0.5 |

Discharging frequency: 13.56 MHz

EXAMPLE 11

After amorphous layers having the layer constitution as shown in FIG. 3 were formed on Al cylinders according to the same procedures under the same conditions as in Example 2, silicon carbide type surface barrier layers were formed on said amorphous layers in accordance with the conditions as shown below. The thus prepared samples were subjected to the electrophotographic process repeatedly to obtain toner transferred images. As the result, even the one millionth toner transferred image was also found to be of very high quality, comparable to the first toner transferred image.

| Gases employed | $CH_4$<br>$SiH_4/He = 10:250$ |
|---|---|
| Flow rate | $SiH_4 = 10$ SCCM |
| Flow rate ratio | $CH_4/SiH_4 = 30$ |
| Layer formation rate | 0.84 Å/sec |
| Discharging power | 0.18 W/cm² |
| Substrate temperature | 250° C. |
| Pressure during reaction | 0.5 Torr |

EXAMPLE 12

Image forming members for electrophotography were prepared by carrying out formation of amorphous layers having the layer constitution as shown in FIG. 3 on Al cylinders by means of the preparation device as shown in FIG. 11, with the contents of boron (B) and oxygen (O) in the layers being as parameters.

The preparation conditions for respective layer regions constituting the amorphous layers are shown in Table 15 below.

| Distribution concentration of oxygen $C_1$ | 3.5 atomic % |
|---|---|
| Distribution concentration of boron $C_{(III)1}$ | 80 atomic ppm |

Using the image forming members for electrophotography obtained, respectively, toner images were formed repeatedly on transfer papers by applying similarly the electrophotographic process as in Example 1, whereby transferred toner images of high quality could be obtained stably.

TABLE 15

| Amorphous layer constitution | Gases employed (Vol. %) | Flow rate (SCCM) | Flow rate ratio | Layer formation rate (Å/s) | Layer thickness (μ) | Discharging power (W/cm²) | Substrate temperature (°C.) | Pressure during reaction (torr) |
|---|---|---|---|---|---|---|---|---|
| Layer region ($t_3 \, t_B$) | $SiH_4/He = 0.5$<br>$SiF_4/He = 0.5$<br>NO 100<br>$B_2H_6/He = 3 \times 10^{-3}$ | $SiH_4 = 200$ | $NO/(SiH_4 + SiF_4) = 4 \times 10^{-2}$<br>$SiF_4/SiH_4 = 0.2$<br>$B_2H_6/(SiH_4 + SiF_4) = 8 \times 10^{-5}$ | 20 | 20 | 0.18 | 250 | 0.5 |
| Layer region ($t_2 \, t_3$) | $SiH_4/He = 0.5$<br>$SiF_4/He = 0.5$<br>NO 100<br>$B_2H_6/He = 3 \times 10^{-3}$ | $SiH_4 = 200$ | $NO/(SiH_4 + SiF_4) = 4 \times 10^{-2} \sim 2 \times 10^{-2}$<br>$SiF_4/SiH_4 = 0.2$<br>$B_2H_6/(SiH_4 + SiF_4) = 8 \times 10^{-5}$ | 20 | 0.5 | 0.18 | 250 | 0.5 |
| Layer region ($t_1 \, t_2$) | $SiH_4/He = 0.5$<br>$SiF_4/He = 0.5$<br>NO 100<br>$B_2H_6/He = 3 \times 10^{-3}$ | $SiH_4 = 200$ | $NO/(SiH_4 + SiF_4) = 2 \times 10^{-2} \sim 0$<br>$SiF_4/SiH_4 = 0.2$<br>$B_2H_6 (SiH_4 + SiF_4) = 8 \times 10^{-5} \sim 0$ | 20 | 0.5 | 0.18 | 250 | 0.5 |
| Layer region | $SiH_4/He = 0.5$<br>$SiF_4/He = 0.5$ | $SiH_4 = 300$ | $SiF_4/SiH_4 = 0.2$ | 20 | 1 | 0.18 | 250 | 0.5 |

TABLE 15-continued

| Amorphous layer constitution | Gases employed (Vol. %) | Flow rate (SCCM) | Flow rate ratio | Layer formation rate (Å/s) | Layer thickness (μ) | Discharging power (W/cm²) | Substrate temperature (°C.) | Pressure during reaction (torr) |
|---|---|---|---|---|---|---|---|---|
| ($t_S$ $t_1$) | | | | | | | | |

Discharging frequency: 13.56 MHz

EXAMPLE 13

Image forming members for electrophotography were prepared by carrying out formation of amorphous layers having the layer constitution as shown in FIG. 2 on Al cylinders by means of the preparation device as shown in FIG. 11, with the contents of boron (B) and nitrogen (N) in the layers being as parameters. The common preparation conditions are as shown in Table 16.

In Table 17, there are shown the results of evaluation for respective samples, with contents of boron $C_{(III)1}$ represented on the axis of ordinate and the contents of nitrogen $C_1$ on the axis of abscissa, respectively.

The image forming members for electrophotography prepared were subjected to a series of electrophotographic process of charging-imagewise exposure-development-transfer, and overall evaluations of the results with respect to density, resolution, tone reproducibility, etc. were performed for the images visualized on transfer papers.

TABLE 16

| Amorphous layer constitution | Gases employed (Vol. %) | Flow Rate (SCCM) | Layer formation rate (Å/s) | Layer thickness (μ) | Discharging power (W/cm²) | Substrate temperature (°C.) | Pressure during reaction (torr) | Discharging frequency (MHz) |
|---|---|---|---|---|---|---|---|---|
| Layer region ($t_2$ $t_B$) | SiH$_4$/He = 0.5<br>NH$_3$ 100<br>B$_2$H$_6$/He = 3 × 10$^{-3}$ | SiH$_4$ = 200 suitably changed depending on samples | 16 | 20 | 0.2 | 250 | 0.5 | 13.56 |
| Layer region ($t_1$ $t_2$) | SiH$_4$/He = 0.5<br>NH$_3$ 100<br>B$_2$H$_6$/He = 3 × 10$^{-3}$ | SiH$_4$ = 200 suitably changed continuously | 16 | 1 | 0.2 | 250 | 0.5 | 13.56 |
| Layer region ($t_S$ $t_1$) | SiH$_4$/He = 0.5 | SiH$_4$ = 300 | 16 | 0.15 | 0.2 | 250 | 0.5 | 13.56 |

TABLE 17

| | B distribution concentration $C_{(III)1}$ atomic ppm | | | | | | | |
|---|---|---|---|---|---|---|---|---|
| N distribution concentration $C_1$ atomic % | 0.1<br>Sample No./<br>Evaluation | 0.5<br>Sample No./<br>Evaluation | 1<br>Sample No./<br>Evaluation | 5<br>Sample No./<br>Evaluation | 10<br>Sample No./<br>Evaluation | 30<br>Sample No./<br>Evaluation | 50<br>Sample No./<br>Evaluation | 80<br>Sample No./<br>Evaluation |
| 0.01 | N1-1<br>Δ | N1-2<br>Δ | N1-3<br>Δ | N1-4 | N1-5 | N1-6<br>Δ | N1-7<br>Δ | N1-8<br>Δ |
| 0.03 | N2-1<br>Δ | N2-2<br>Δ | N2-3<br>Δ | N2-4 | N2-5 | N2-6<br>Δ | N2-7<br>Δ | N2-8<br>Δ |
| 0.05 | N3-1<br>Δ | N3-2<br>Δ | N3-3<br>Δ | N3-4 | N3-5 | N3-6 | N3-7<br>Δ | N3-8<br>Δ |
| 0.1 | N4-1<br>Δ | N4-2<br>Δ | N4-3<br>Δ | N4-4 | N4-5 | N4-6 | N4-7 | N4-8<br>Δ |
| 0.3 | N5-1<br>Δ | N5-2 | N5-3<br>Δ | N5-4 | N5-5 | N5-6 | N5-7 | N5-8 |
| 0.5 | N6-1<br>Δ | N6-2<br>Δ | N6-3<br>Δ | N6-4 | N6-5 | N6-6 | N6-7 | N6-8 |
| 1 | N7-1<br>Δ | N7-2 | N7-3<br>Δ | N7-4 | N7-5 | N7-6 | N7-7 | N7-8 |
| 2 | N8-1<br>Δ | N8-2<br>Δ | N8-3 | N8-4 | N8-5 | N8-6 | N8-7 | N8-8 |
| 3.5 | N9-1<br>Δ | N9-2<br>Δ | N9-3 | N9-4 | N9-5 | N9-6 | N9-7 | N9-8 |
| 5 | N10-1<br>Δ | N10-2<br>Δ | N10-3 | N10-4 | N10-5 | N10-6 | N10-7 | N10-8 |
| 7 | N11-1<br>Δ | N11-2<br>Δ | N11-3<br>Δ | N11-4 | N11-5 | N11-6 | N11-7 | N11-8 |
| 10 | N12-1<br>Δ | N12-2<br>Δ | N12-3<br>Δ | N12-4<br>Δ | N12-5<br>Δ | N12-6<br>Δ | N12-7<br>Δ | N12-8<br>Δ |
| 20 | N13-1<br>Δ | N13-2<br>Δ | N13-3<br>Δ | N13-4<br>Δ | N13-5<br>Δ | N13-6<br>Δ | N13-7<br>Δ | N13-8<br>Δ |
| 30 | N14-1<br>Δ | N14-2<br>Δ | N14-3<br>Δ | N14-4<br>Δ | N14-5<br>Δ | N14-6<br>Δ | N14-7<br>Δ | N14-8<br>Δ |

TABLE 17-continued

| N distribution concentration $C_1$ atomic % | B distribution concentration $C_{(II)1}$ atomic ppm | | | | |
|---|---|---|---|---|---|
| | 100 Sample No./ Evaluation | 200 Sample No./ Evaluation | 400 Sample No./ Evaluation | 800 Sample No./ Evaluation | 1500 Sample No./ Evaluation |
| 0.01 | N1-9 Δ | N1-10 Δ | N1-11 Δ | N1-12 Δ | N1-13 Δ |
| 0.03 | N2-9 Δ | N2-10 Δ | N2-11 Δ | N2-12 Δ | N2-13 Δ |
| 0.05 | N3-9 Δ | N3-10 Δ | N3-11 Δ | N3-12 Δ | N3-13 Δ |
| 0.1 | N4-9 Δ | N4-10 Δ | N4-11 Δ | N4-12 Δ | N4-13 Δ |
| 0.3 | N5-9 Δ | N5-10 Δ | N5-11 Δ | N5-12 Δ | N5-13 Δ |
| 0.5 | N6-9 | N6-10 | N6-11 | N6-12 | N6-13 Δ |
| 1 | N7-9 | N7-10 | N7-11 | N7-12 | N7-13 Δ |
| 2 | N8-9 | N8-10 | N8-11 | N8-12 | N8-13 Δ |
| 3.5 | N9-9 | N9-10 | N9-11 | N9-12 | N9-13 Δ |
| 5 | N10-9 | N10-10 | N10-11 | N10-12 | N10-13 Δ |
| 7 | N11-9 | N11-10 | N11-11 | N11-12 | N11-13 Δ |
| 10 | N12-9 Δ | N12-10 Δ | N12-11 Δ | N12-12 Δ | N12-13 Δ |
| 20 | N13-9 Δ | N13-10 Δ | N13-11 Δ | N13-12 Δ | N13-13 Δ |
| 30 | N14-9 Δ | N14-10 Δ | N14-11 Δ | N14-12 Δ | N14-13 Δ |

Evaluation standards
 Excellent
 Good
Δ Practically satisfactory

EXAMPLE 14

TABLE 18

| Amorphous layer constitution | Gases employed (vol. %) | Flow rate (SCCM) | Flow rate ratio | Layer formation rate (Å/s) | Layer thickness (μ) | Discharging power (W/cm²) | Substrate temperature (°C.) | Pressure during reaction (torr) |
|---|---|---|---|---|---|---|---|---|
| Layer region ($t_3 \, t_B$) | $SiH_4/He = 0.5$ $NH_3$ 100 $B_2H_6/He = 3 \times 10^{-3}$ | $SiH_4 = 200$ | $NH_3/SiH_4 = 8 \times 10^{-2}$ | 20 | 20 | 0.18 | 250 | 0.5 |
| Layer region ($t_2 \, t_3$) | $SiH_4/He = 0.5$ $NH_3$ 100 $B_2H_6/He = 3 \times 10^{-3}$ | $SiH_4 = 200$ | $NH_3/SiH_4 = 8 \times 10^{-2} \sim 4 \times 10^{-2}$ $B_2H_6/SiH_4 = 8 \times 10^{-5}$ | 20 | 0.5 | 0.18 | 250 | 0.5 |
| Layer region ($t_1 \, t_2$) | $SiH_4/He = 0.5$ $NH_3$ 100 $B_2H_6/He = 3 \times 10^{-3}$ | $SiH_4 = 200$ | $NH_3/SiH_4 = 4 \times 10^{-2} \sim 0$ $B_2H_6/SiH_4 = 8 \times 10^{-5} \sim 0$ | 20 | 0.5 | 0.18 | 250 | 0.5 |
| Layer region ($t_s \, t_1$) | $SiH_4/He = 0.5$ | $SiH_4 = 300$ | | 20 | 1 | 0.18 | 250 | 0.5 |

Discharging frequency: 13.56 MHz

Image forming members for electrophotography were prepared by carrying out formation of amorphous layers having the layer constitution as shown in FIG. 3 on Al cylinders by means of the preparation device as shown in FIG. 11, with the contents of boron (B) and nitrogen (N) in the layers being as parameters. The preparation conditions for respective layer regions constituting the amorphous layers are shown in Table 18 below.

Using the image forming members for electrophotography obtained, toner images were formed repeatedly on transfer papers by applying similarly the electrophotographic process as in Example 13, whereby transferred toner images of high quality could be obtained stably.

EXAMPLE 15

Image forming members for electrophotography were prepared by carrying out formation of amorphous layers having the layer constitution as shown in FIG. 4 on Al cylinders by means of the preparation device as shown in FIG. 11, with the contents of boron (B) and nitrogen (N) in the layers being as parameters. The preparation conditions for respective layer constituting the amorphous layers are shown in Table 19 below.

Using the image forming members for electrophotography obtained, toner images were formed repeatedly on transfer papers by applying similarly the electrophotographic process as in Example 13, whereby transferred toner images of high quality could be obtained stably.

stituting the amorphous layers are shown in Table 20 below.

Using the image forming members for electrophotography obtained, toner images were formed repeatedly

TABLE 19

| Amorphous layer constitution | Gases employed (vol. %) | Flow rate (SCCM) | Flow rate ratio | Layer formation rate (Å/s) | Layer thickness ($\mu$) | Discharging power (W/cm$^2$) | Substrate temperature (°C.) | Pressure during reaction (torr) |
|---|---|---|---|---|---|---|---|---|
| Layer region ($t_3$ $t_B$) | SiH$_4$/He = 0.5 NH$_3$ 100 B$_2$H$_6$/He = 3 × 10$^{-3}$ | SiH$_4$ = 200 | NH$_3$/SiH$_4$ = 16 × 10$^{-2}$ B$_2$H$_6$/SiH$_4$ = 1 × 10$^{-4}$ | 20 | 20 | 0.2 | 250 | 0.5 |
| Layer region ($t_2$ $t_3$) | SiH$_4$/He = 0.5 NH$_3$ 100 B$_2$H$_6$/He = 3 × 10$^{-3}$ | SiH$_4$ = 200 | NH$_3$/SiH$_4$ = 16 × 10$^{-2}$ B$_2$H$_6$/SiH$_4$ = 1 × 10$^{-4}$ ~ 1.5 × 10$^{-5}$ | 20 | 0.5 | 0.2 | 250 | 0.5 |
| Layer region ($t_1$ $t_2$) | SiH$_4$/He = 0.5 NH$_3$ 100 B$_2$H$_6$/He = 3 × 10$^{-3}$ | SiH$_4$ = 200 | NH$_3$/SiH$_4$ = 16 × 10$^{-2}$ ~ 0 B$_2$H$_6$/SiH$_4$ = 1.5 × 10$^{-5}$ ~ 0 | 20 | 0.5 | 0.2 | 250 | 0.5 |
| Layer region ($t_s$ $t_1$) | SiH$_4$/He = 0.5 | SiH$_4$ = 300 | | 20 | 1 | 0.2 | 250 | 0.5 |

Discharging frequency: 13.56 MHz

EXAMPLE 16

Image forming members for electrophotography were prepared by carrying out formation of amorphous layers having the layer constitution as shown in FIG. 5 on Al cylinders by means of the preparation device as shown in FIG. 11, with the contents of boron (B) and nitrogen (N) in the layers being as parameters. The preparation conditions for respective layer regions conon transfer papers by applying similarly the electrophotographic process as in Example 13, to obtain the evaluations as shown in Table 21.

In Table 20, X(4) means the following:

| | |
|---|---|
| NS4-1 ... 1 × 10$^{-7}$ | NS4-2 ... 5 × 10$^{-7}$ |
| NS4-3 ... 1 × 10$^{-6}$ | NS4-4 ... 5 × 10$^{-6}$ |

TABLE 20

| Amorphous layer constitution | Gases employed (vol. %) | Flow rate (SCCM) | Flow rate ratio | Layer formation rate (Å/s) | Layer thickness ($\mu$) | Discharging power (W/cm$^2$) | Substrate temperature (°C.) | Pressure during reaction (torr) |
|---|---|---|---|---|---|---|---|---|
| Layer region ($t_5$ $t_B$) | SiH$_4$/He = 0.5 NH$_3$ 100 B$_2$H$_6$/He = 3 × 10$^{-3}$ | SiH$_4$ = 200 | NH$_3$/SiH$_4$ = 16 × 10$^{-2}$ B$_2$H$_6$/SiH$_4$ = 1 × 10$^{-4}$ | 18 | 20 | 0.18 | 250 | 0.5 |
| Layer region ($t_4$ $t_5$) | SiH$_4$/He = 0.5 NH$_3$ 100 B$_2$H$_6$/He = 3 × 10$^{-3}$ | SiH$_4$ = 200 | NH$_3$/SiH$_4$ = 16 × 10$^{-2}$ ~ 5 × 10$^{-2}$ B$_2$H$_6$/SiH$_4$ = 1 × 10$^{-4}$ | 18 | 0.5 | 0.18 | 250 | 0.5 |
| Layer region ($t_3$ $t_4$) | SiH$_4$/He = 0.5 NH$_3$ 100 B$_2$H$_6$/He = 3 × 10$^{-3}$ | SiH$_4$ = 200 | NH$_3$/SiH$_4$ = 5 × 10$^{-2}$ ~ 0 B$_2$H$_6$/SiH$_4$ = 1 × 10$^{-4}$ ~ X(4) | 18 | 0.3 | 0.18 | 250 | 0.5 |
| Layer region ($t_2$ $t_3$) | SiH$_4$/He = 0.5 B$_2$H$_6$/He = 3 × 10$^{-3}$ | SiH$_4$ = 200 | B$_2$H$_6$/SiH$_4$ = X(4) | 18 | 0.5 | 0.18 | 250 | 0.5 |
| Layer region ($t_1$ $t_2$) | SiH$_4$/He = 0.5 B$_2$H$_6$/He = 3 × 10$^{-3}$ | SiH$_4$ = 200 | B$_2$H$_6$/SiH$_4$ = X(4) ~ 0 | 18 | 0.3 | 0.18 | 250 | 0.5 |
| Layer region ($t_s$ $t_1$) | SiH$_4$/He = 0.5 | SiH$_4$ = 300 SCCM | | 18 | 1 | 0.18 | 250 | 0.5 |

Discharging frequency: 13.56 MHz

TABLE 21

| | B distribution concentration $C_{(III)3}$ (atomic %) | | | | | | | | |
|---|---|---|---|---|---|---|---|---|---|
| Example | 0.1 Sample No./ Evaluation | 0.5 Sample No./ Evaluation | 1 Sample No./ Evaluation | 5 Sample No./ Evaluation | 10 Sample No./ Evaluation | 20 Sample No./ Evaluation | 40 Sample No./ Evaluation | 80 Sample No./ Evaluation | 100 Sample No./ Evaluation |
| 16 | NS4-1 Δ | NS4-2 | NS4-3 | NS4-4 | | | | | |

TABLE 21-continued

| | B distribution concentration $C_{(II)3}$ (atomic %) | | | | | | | | |
|---|---|---|---|---|---|---|---|---|---|
| | 0.1 | 0.5 | 1 | 5 | 10 | 20 | 40 | 80 | 100 |
| Example | Sample No./ Evaluation | Sample No./ Evaluation | Sample No./ Evaluation | Sample No./ Evaluation | Sample No./ Evaluation | Sample No./ Evaluation | Sample No./ Evaluation | Sample No./ Evaluation | Sample No./ Evaluation |
| 17 | NS5-1 Δ | NS5-2 | NS5-3 | NS5-4 | NS5-5 | NS5-6 | NS5-7 | NS5-8 Δ | NS5-9 Δ |
| 18 | NS6-1 | NS6-2 | NS6-3 | NS6-4 | NS6-5 | NS6-6 | | | |
| 19 | NS7-1 | NS7-2 | NS7-3 | NS7-4 | NS7-5 | NS7-6 | NS7-7 | NS7-8 Δ | NS7-9 Δ |

Evaluation standards are the same as in Table 17

EXAMPLE 17

Image forming members for electrophotography were prepared by carrying out formation of amorphous layers having the layer constitution as shown in FIG. 6 on Al cylinders by means of the preparation device as shown in FIG. 11, with the contents of boron (B) and nitrogen (N) in the layers being as parameters. The preparation conditions for respective layer regions constituting the amorphous layers are shown in Table 22 below.

Using the image forming members for electrophotography obtained, respectively, toner images were formed repeatedly on transfer papers by applying similarly the electrophotographic process as in Example 13, to obtain the evaluations as shown in Table 21.

In Table 22, X(5) means the following:

| | |
|---|---|
| NS5-1 ... $1 \times 10^{-7}$ | NS5-2 ... $5 \times 10^{-7}$ |
| NS5-3 ... $1 \times 10^{-6}$ | NS5-4 ... $5 \times 10^{-6}$ |
| NS5-5 ... $1 \times 10^{-5}$ | NS5-6 ... $2 \times 10^{-5}$ |
| NS5-7 ... $4 \times 10^{-5}$ | NS5-8 ... $5 \times 10^{-5}$ |
| NS5-9 ... $6 \times 10^{-5}$ | |

EXAMPLE 18

Image forming members for electrophotography were prepared by carrying out formation of amorphous layers having the layer constitution as shown in FIG. 7 on Al cylinders by means of the preparation device as shown in FIG. 11, with the contents of boron (B) and nitrogen (N) in the layers being as parameters. The preparation conditions for respective layer regions constituting the amorphous layers are shown in Table 23 below.

Using the image forming members for electrophotography obtained, respectively, toner images were formed repeatedly on transfer papers by applying similarly the electrophotographic process as in Example 13, to obtain the evaluations as shown in Table 21.

In Table 23, X(6) means the following:

| | |
|---|---|
| NS6-1 ... $1 \times 10^{-7}$ | NS6-2 ... $5 \times 10^{-7}$ |
| NS6-3 ... $1 \times 10^{-6}$ | NS6-4 ... $5 \times 10^{-6}$ |
| NS6-5 ... $1 \times 10^{-5}$ | NS6-6 ... $2 \times 10^{-5}$ |

TABLE 22

| Amorphous layer constitution | Gases employed (vol. %) | Flow rate (SCCM) | Flow rate ratio | Layer formation rate (Å/s) | Layer thickness (μ) | Discharging power (W/cm²) | Substrate temperature (°C.) | Pressure during reaction (torr) |
|---|---|---|---|---|---|---|---|---|
| Layer region ($t_5 \, t_B$) | SiH$_4$/He = 0.5 NH$_3$ 100 B$_2$H$_6$/He = $3 \times 10^{-3}$ | SiH$_4$ = 200 | NH$_3$/SiH$_4$ = $2.2 \times 10^{-2}$ B$_2$H$_6$/SiH$_4$ = $8 \times 10^{-5}$ | 20 | 20 | 0.2 | 250 | 0.5 |
| Layer region ($t_4 \, t_5$) | SiH$_4$/He = 0.5 NH$_3$ 100 B$_2$H$_6$/He = $3 \times 10^{-3}$ | SiH$_4$ = 200 | NH$_3$/SiH$_4$ = $2.2 \times 10^{-2} \sim$ $7.4 \times 10^{-3}$ B$_2$H$_6$/SiH$_4$ = $8.0 \times 10^{-5} \sim$ X(5) | 20 | 1.0 | 0.2 | 250 | 0.5 |
| Layer region ($t_3 \, t_4$) | SiH$_4$/He = 0.5 NH$_3$ 100 B$_2$H$_6$/He = $3 \times 10^{-3}$ | SiH$_4$ = 200 | NH$_3$/SiH$_4$ = $7.4 \times 10^{-3} \sim 0$ B$_2$H$_6$/SiH$_4$ = X(5) | 20 | 0.5 | 0.2 | 250 | 0.5 |
| Layer region ($t_2 \, t_3$) | SiH$_4$/He = 0.5 B$_2$H$_6$/He = $3 \times 10^{-3}$ | SiH$_4$ = 200 | B$_2$H$_6$/SiH$_4$ = X(5) | 20 | 0.3 | 0.2 | 250 | 0.5 |
| Layer region ($t_1 \, t_2$) | SiH$_4$/He = 0.5 B$_2$H$_6$/He = $3 \times 10^{-3}$ | SiH$_4$ = 200 | B$_2$H$_6$/SiH$_4$ = X(5) $\sim 0$ | 20 | 0.5 | 0.2 | 250 | 0.5 |
| Layer region ($t_s \, t_1$) | SiH$_4$/He = 0.5 | SiH$_4$ = 300 | | 20 | 0.5 | 0.2 | 250 | 0.5 |

Discharging frequency: 13.56 MHz

TABLE 23

| Amorphous layer constitution | Gases employed (Vol. %) | Flow rate (SCCM) | Flow rate ratio | Layer formation rate (Å/s) | Layer thickness ($\mu$) | Discharging power (W/cm$^2$) | Substrate temperature (°C.) | Pressure during reaction (torr) |
|---|---|---|---|---|---|---|---|---|
| Layer region ($t_3 \, t_B$) | SiH$_4$/He = 0.5<br>NH$_3$ 100<br>B$_2$H$_6$/He = 3 × 10$^{-3}$ | SiH$_4$ = 200 | NH$_3$/SiH$_4$ = 2.2 × 10$^{-2}$<br>B$_2$H$_6$/SiH$_4$ = 3 × 10$^{-5}$ | 20 | 20 | 0.2 | 250 | 0.5 |
| Layer region ($t_2 \, t_3$) | SiH$_4$/He = 0.5<br>NH$_3$ 100<br>B$_2$H$_6$/He = 3 × 10$^{-3}$ | SiH$_4$ = 200 | NH$_3$/SiH$_4$ = 2.2 × 10$^{-2}$ ~ 1.38 × 10$^{-2}$<br>B$_2$H$_6$/SiH$_4$ = 3 × 10$^{-5}$ | 20 | 0.5 | 0.2 | 250 | 0.5 |
| Layer region ($t_1 \, t_2$) | SiH$_4$/He = 0.5<br>NH$_3$ 100<br>B$_2$H$_6$/He = 3 × 10$^{-3}$ | SiH$_4$ = 200 | NH$_3$/SiH$_4$ = 1.38 × 10$^{-2}$ ~ 0<br>B$_2$H$_6$/SiH$_4$ = 3 × 10$^{-5}$ ~ X(6) | 20 | 0.3 | 0.2 | 250 | 0.5 |
| Layer region ($t_s \, t_1$) | SiH$_4$/He = 0.5<br>B$_2$H$_6$/He = 3 × 10$^{-3}$ | SiH$_4$ = 200 | B$_2$H$_6$/SiH$_4$ = X(6) | 20 | 0.2 | 0.2 | 250 | 0.5 |

Discharging frequency: 13.56 MHz

EXAMPLE 19

Image forming members for electrophotography were prepared by carrying out formation of amorphous layers having the layer constitution as shown in FIG. 8 on Al cylinders by means of the preparation device as shown in FIG. 11, with the contents of boron (B) and nitrogen (N) in the layers being as parameters. The preparation conditions for respective layer regions constituting the amorphous layers are shown in Table 24 below.

Using the image forming members for electrophotography obtained, respectively, toner images were formed repeatedly on transfer papers by applying similarly the electrophotographic process as in Example 13, to obtain the evaluations as shown in Table 21.

In Table 24, X(7) means the following:

| | |
|---|---|
| NS7-1 ... 1 × 10$^{-7}$ | NS7-2 ... 5 × 10$^{-7}$ |
| NS7-3 ... 1 × 10$^{-6}$ | NS7-4 ... 5 × 10$^{-6}$ |
| NS7-5 ... 1 × 10$^{-5}$ | NS7-6 ... 2 × 10$^{-5}$ |
| NS7-7 ... 4 × 10$^{-5}$ | NS7-8 ... 8 × 10$^{-5}$ |
| NS7-9 ... 1 × 10$^{-4}$ | |

EXAMPLE 20

Image forming members for electrophotography were prepared by carrying out formation of amorphous layers having the layer constitution as shown in FIG. 9 on Al cylinders by means of the preparation device as shown in FIG. 11, with the contents of boron (B) and nitrogen (N) in the layers being as parameters. The preparation conditions for respective layer regions constituting the amorphous layers are shown in Table 25 below.

Using the image forming members for electrophotography obtained, respectively, toner images were formed repeatedly on transfer papers by applying similarly the electrophotographic process as in Example 13, to obtain the evaluations as shown in Table 26.

In Table 25, X(8) means the following:

| | |
|---|---|
| NS8-1 ... 1.1 × 10$^{-4}$ | NS8-2 ... 4.4 × 10$^{-4}$ |
| NS8-3 ... 1.1 × 10$^{-3}$ | NS8-4 ... 2.2 × 10$^{-3}$ |
| NS8-5 ... 4.4 × 10$^{-3}$ | NS8-6 ... 7.7 × 10$^{-3}$ |

TABLE 24

| Amorphous layer constitution | Gases employed (Vol. %) | Flow rate (SCCM) | Flow rate ratio | Layer formation rate (Å/s) | Layer thickness ($\mu$) | Discharging power (W/cm$^2$) | Substrate temperature (°C.) | Pressure during reaction (torr) |
|---|---|---|---|---|---|---|---|---|
| Layer region ($t_3 \, t_B$) | SiH$_4$/He = 0.5<br>NH$_3$ 100<br>B$_2$H$_6$/He = 3 × 10$^{-3}$ | SiH$_4$ = 200 | NH$_3$/SiH$_4$ = 2.2 × 10$^{-2}$<br>B$_2$H$_6$/SiH$_4$ = 2 × 10$^{-4}$ | 20 | 20 | 0.2 | 250 | 0.5 |
| Layer region ($t_2 \, t_3$) | SiH$_4$/He = 0.5<br>NH$_3$ 100<br>B$_2$H$_6$/He = 3 × 10$^{-3}$ | SiH$_4$ = 200 | NH$_3$/SiH$_4$ = 2.2 × 10$^{-2}$ ~ 1.47 × 10$^{-2}$<br>B$_2$H$_6$/SiH$_4$ = 2 × 10$^{-4}$ ~ X(7) | 20 | 0.3 | 0.2 | 250 | 0.5 |
| Layer region ($t_1 \, t_2$) | SiH$_4$/He = 0.5<br>NH$_3$ 100<br>B$_2$H$_6$/He = 3 × 10$^{-3}$ | SiH$_4$ = 200 | NH$_3$/SiH$_4$ = 1.47 × 10$^{-2}$ ~ 0<br>B$_2$H$_6$/SiH$_4$ = X(7) | 20 | 1.0 | 0.2 | 250 | 0.5 |
| Layer region ($t_s \, t_1$) | SiH$_4$/He = 0.5<br>B$_2$H$_6$/He = 3 × 10$^{-3}$ | SiH$_4$ = 200 | B$_2$H$_6$/SiH$_4$ = X(7) | 20 | 2.0 | 0.2 | 250 | 0.5 |

Discharging frequency: 13.56 MHz

TABLE 25

| Amorphous layer constitution | Gases employed (Vol %) | Flow rate (SCCM) | Flow rate ratio | Layer formation rate (Å/S) | Layer thickness ($\mu$) | Discharging power (w/cm$^2$) | Substrate temperature (°C.) | Pressure during reaction (torr) |
|---|---|---|---|---|---|---|---|---|
| Layer region ($t_2t_B$) | SiH$_4$/He = 0.5<br>NH$_3$ 100<br>B$_2$H$_6$/He = $3 \times 10^{-3}$ | SiH$_4$ = 200 | NH$_3$/SiH$_4$ = $1.1 \times 10^{-2}$<br>B$_2$H$_6$/SiH$_4$ = $4 \times 10^{-5}$ | 20 | 20 | 0.2 | 250 | 0.5 |
| Layer region ($t_1t_2$) | SiH$_4$/He = 0.5<br>NH$_3$ 100<br>B$_2$H$_6$/He = $3 \times 10^{-3}$ | SiH$_4$ = 200 | NH$_3$/SiH$_4$ = $1.1 \times 10^{-2} \sim$ x(8)<br>B$_2$H$_6$/SiH$_4$ = $4 \times 10^{-4} \sim 2 \times 10^{-5}$ | 20 | 0.5 | 0.2 | 250 | 0.5 |
| Layer region ($t_st_1$) | SiH$_4$/He = 0.5 | SiH$_4$ = 300 | | 20 | 1 | 0.2 | 250 | 0.5 |

Discharging frequency: 13.56 MHz

TABLE 26

| Sample No. | NS8-1 | NS8-2 | NS8-3 | NS8-4 | NS8-5 | NS8-6 |
|---|---|---|---|---|---|---|
| Evaluation | Δ | Δ | ○ | ◎ | ◎ | ◎ |

(Evaluation standards are the same as in Table 17)

EXAMPLE 21

Image forming members for electrophotography were prepared by carrying out formation of amorphous layers having the layer constitution as shown in FIG. 10 on Al cylinders by means of the preparation device as shown in FIG. 11, with the thicknesses of the layer region ($t_1 t_2$) and the layer region ($t_2 t_3$) being as parameters. The preparation conditions for respective layer regions constituting the amorphous layers are shown in Table 27 below.

Using the image forming members for electrophotography obtained, respectively, toner images were formed repeatedly on transfer papers by applying similarly the electrophotographic process as in Example 13, to obtain the evaluations as shown in Table 28.

TABLE 27

| Amorphous layer constitution | Gases employed (Vol %) | Flow rate (SCCM) | Flow rate ratio | Layer formation rate (Å/S) | Layer thickness ($\mu$) | Discharging power (w/cm$^2$) | Substrate temperature (°C.) | Pressure during reaction (torr) |
|---|---|---|---|---|---|---|---|---|
| Layer region ($t_3t_B$) | SiH$_4$/He = 0.5<br>NH$_3$ 100<br>B$_2$H$_6$/He = $3 \times 10^{-3}$ | SiH$_4$ = 200 | NH$_3$SiH$_4$ = $7.7 \times 10^{-2}$<br>B$_2$H$_6$/SiH$_4$ = $8 \times 10^{-5}$ | 20 | 20 | 0.2 | 250 | 0.5 |
| Layer region ($t_2t_3$) | SiH$_4$/He = 0.5<br>NH$_3$ 100<br>B$_2$H$_6$/He = $3 \times 10^{-3}$ | SiH$_4$ = 200 | NH$_3$/SiH$_4$ = $7.7 \times 10^{-2} \sim$<br>B$_2$H$_6$/SiH$_4$ = $8 \times 10^{-5} \sim 0$ | 20 | 0.5 | 0.2 | 250 | 0.5 |
| Layer region ($t_1t_2$) | SiH$_4$/He = 0.5<br>NH$_3$ 100 | SiH$_4$ = 200<br>0 | NH$_3$/SiH$_4$ = $3.85 \times 10^{-2} \sim$ | 20 | 0.5 | 0.2 | 250 | 0.5 |
| Layer region ($t_st_1$) | SiH$_4$/He = 0.5 | SiH$_4$ = 300 | | 20 | 1 | 0.2 | 250 | 0.5 |

Discharging frequency: 13.56 MHz

TABLE 28

| Layer region ($t_2t_3$) ($\mu$m) | Layer region ($t_1t_2$) ($\mu$m) | | | | |
|---|---|---|---|---|---|
| | 0.1<br>Sample No./Evaluation | 0.5<br>Sample No./Evaluation | 1.0<br>Sample No./Evaluation | 4<br>Sample No./Evaluation | 8<br>Sample No./Evaluation |
| 0.1 | NS9-11<br>○ | NS9-12<br>○ | NS9-13<br>○ | NS9-14<br>○ | NS9-15<br>◎ |
| 0.2 | NS9-21<br>○ | NS9-22<br>◎ | NS9-23<br>◎ | NS9-24<br>◎ | NS0-25<br>◎ |
| 1.0 | NS9-31<br>○ | NS9-32<br>◎ | NS9-33<br>◎ | NS9-34<br>◎ | NS9-35<br>◎ |
| 4 | NS9-41<br>○ | NS9-42<br>◎ | NS9-43<br>◎ | NS9-44<br>◎ | NS9-45<br>◎ |
| 8 | NS9-51<br>◎ | NS9-52<br>◎ | NS9-53<br>◎ | NS9-54<br>◎ | NS9-55<br>◎ |

TABLE 28-continued

| Layer region ($t_2t_3$) (μm) | Layer region ($t_1t_2$) (μm) | | | | |
|---|---|---|---|---|---|
| | 0.1 Sample No./ Evaluation | 0.5 Sample No./ Evaluation | 1.0 Sample No./ Evaluation | 4 Sample No./ Evaluation | 8 Sample No./ Evaluation |

EXAMPLE 22

Image forming members for electrophotography were prepared by carrying out formation of amorphous layers having the layer constitution as shown in FIG. 2 on Al cylinders by means of the preparation device as shown in FIG. 11, with the contents of boron (B) and nitrogen (N) in the layers being as parameters. The preparation conditions for respective layer regions constituting the amorphous layers are shown in Table 29 below.

Using the image forming members for electrophotography obtained, toner images were formed repeatedly on transfer papers by applying similarly the electrophotographic process as in Example 13, whereby transferred toner images of high quality could be obtained stably.

the one millionth toner transferred image was also found to be of very high quality, comparable to the first toner transferred image.

| | |
|---|---|
| Gases employed | $CH_4$ |
| | $SiH_4/He = 10:250$ |
| Flow rate | $SiH_4 = 10$ SCCM |
| Flow rate ratio | $CH_4/SiH_4 = 30$ |
| Layer formation rate | 0.80Å/sec |
| Discharging power | 0.18 W/cm$^2$ |
| Substrate temperature | 250° C. |
| Pressure during reaction | 0.5 torr |

EXAMPLE 24

Image forming members for electrophotography were prepared by carrying out formation of amorphous layers having the layer constitution as shown in FIG. 3 on Al cylinders by means of the preparation device as shown in FIG. 11. The preparation conditions for respective layer regions constituting the amorphous layers as shown in Table 30 below.

Using the image forming members for electrophotography obtained, toner images were formed repeatedly on transfer papers by applying similarly the electrophotographic process as in Example 13, whereby transferred toner images of high quality could be obtained stably.

TABLE 29

| Amorphous layer constitution | Gases employed (Vol %) | Flow rate (SCCM) | Flow rate ratio | Layer formation rate (Å/S) | Layer thickness (μ) | Discharging power (w/cm$^2$) | Substrate temperature (°C.) | Pressure during reaction (torr) |
|---|---|---|---|---|---|---|---|---|
| Layer region ($t_4t_B$) | $SiH_4/He = 0.5$<br>$NH_3$ 100<br>$B_2H_6/He = 3.3 \times 10^{-3}$ | $SiH_4 = 200$ | $NH_3/SiH_4 = 8 \times 10^{-2}$<br>$B_2H_6/SiH_4 = 5 \times 10^{-4}$ | 20 | 0.3 | 0.2 | 250 | 0.5 |
| Layer region ($t_2t_4$) | $SiH_4/He = 0.5$<br>$NH_3$ 100<br>$B_2H_6/He = 3.3 \times 10^{-3}$ | $SiH_4 = 200$ | $NH_3/SiH_4 = 8 \times 10^{-2}$<br>$B_2H_6/SiH_4 = 8 \times 10^{-5}$ | 20 | 20 | 0.2 | 250 | 0.5 |
| Layer region ($t_1t_2$) | $SiH_4/He = 0.5$<br>$NH_3$ 100<br>$B_2H_6/He = 3.3 \times 10^{-3}$ | $SiH_4 = 200$ | $NH_3/SiH_4 = 8 \times 10^{-2} \sim 0$<br>$B_2H_6/SiH_4 = 8 \times 10^{-5} \sim 0$ | 20 | 1 | 0.2 | 250 | 0.5 |
| Layer region ($t_ST_1$) | $SiH_4/He = 0.5$ | $SiH_4 = 300$ | | 20 | 0.15 | 0.2 | 250 | 0.5 |

Discharging frequency: 13.56 MHz

EXAMPLE 23

After amorphous layers having the layer constitution as shown in FIG. 3 were formed on Al cylinders according to the same procedures under the same conditions as in Example 14, silicon carbide type surface barrier layers were formed on said amorphous layers in accordance with the conditions as shown below. The thus prepared samples were subjected to the electrophotographic process repeated similarly to Example 13 to obtain toner transferred images. As the result, even

TABLE 30

| Amorphous layer constitution | Gases employed (Vol %) | Flow rate (SCCM) | Flow rate ratio | Layer formation rate (Å/S) | Layer thickness (μ) | Discharging power (w/cm$^2$) | Substrate temperature (°C.) | Pressure during reaction (torr) |
|---|---|---|---|---|---|---|---|---|
| Layer region | $SiH_4/He = 0.5$ | $SiH_4 = 200$ | $NH_3/(SiH_4 + SiF_4) =$ | 20 | 20 | 0.18 | 250 | 0.5 |

TABLE 30-continued

| Amorphous layer constitution | Gases employed (Vol %) | Flow rate (SCCM) | Flow rate ratio | Layer formation rate (Å/S) | Layer thickness (μ) | Discharging power (w/cm²) | Substrate temperature (°C.) | Pressure during reaction (torr) |
|---|---|---|---|---|---|---|---|---|
| ($t_3t_B$) | $SiF_4/He = 0.5$<br>$NH_3$ 100<br>$B_2H_6/He = 3 \times 10^{-3}$ | | $4 \times 10^{-2}$<br>$SiF_4/SiH_4 = 0.2$<br>$B_2H_6/(SiH_4 + SiF_4)$<br>$8 \times 10^{-5}$ | | | | | |
| Layer region ($t_2t_3$) | $SiH_4/He = 0.5$<br>$SiF_4/He = 0.5$<br>$NH_3$ 100<br>$B_2H_6/He = 3 \times 10^{-3}$ | $SiH_4 = 200$ | $NH_3/(SiH_4 + SiF_4) = 4 \times 10^{-2} \sim 2 \times 10^{-2}$<br>$SiF_4/SiH_4 = 0.2$<br>$B_2H_6/(SiH_4 + SiF_4) = 8 \times 10^{-5}$ | 20 | 0.5 | 0.18 | 250 | 0.5 |
| Layer region ($t_1t_2$) | $SiH_4/He = 0.5$<br>$SiF_4/He = 0.5$<br>$NH_3$ 100<br>$B_2H_6He = 3 \times 10^{-3}$ | $SiH_4 = 200$ | $NH_3/(SiH_4 + SiF_4) = 2 \times 10^{-2} \sim 0$<br>$SiF_4/SiH_4 = 0.2$<br>$B_2H_6/(SiH_4 + SiF_4) = 8 \times 10^{-5} \sim 0$ | 20 | 0.5 | 0.18 | 250 | 0.5 |
| Layer region ($t_St_1$) | $SiH_4/He = 0.5$<br>$SiF_4/He = 0.5$ | $SiH_4 = 300$ | $SiF_4/SiH_4 = 0.2$ | 20 | 1 | 0.18 | 250 | 0.5 |

EXAMPLE 25

Image forming members for electrophotography were prepared by carrying out formation of amorphous layers having the layer constitution as shown in FIG. 2 on Al cylinders by means of the preparation device as shown in FIG. 11, with the contents of boron (B) and carbon (C) in the layers being as parameters. The common preparation conditions are as shown in Table 31.

In Table 32, there are shown the results of evaluation for respective samples, with contents of boron $C_{(III)1}$ represented on the axis of abscissa and the contents of carbon $C_1$ on the axis of ordinate, respectively.

The image forming members for electrophotography prepared were subjected to a series of electrophotographic process of charging-imagewise exposure-development-transfer, and overall evaluations of the results with respect to density, resolution, tone reproducibility, etc. were performed for the images visualized on transfer papers.

TABLE 31

| Amorphous layer constitution | Gases employed (Vol %) | Flow rate (SCCM) | Layer formation rate (Å/S) | Layer thickness (μ) | Discharging power (w/cm²) | Substrate temperature (°C.) | Pressure during reaction (torr) | Discharging frequency (MHz) |
|---|---|---|---|---|---|---|---|---|
| Layer region ($t_2t_B$) | $SiH_4/He = 0.5$<br>$CH_4$ 100<br>$B_2H_6/He = 3 \times 10^{-3}$ | $SiH_4 = 200$ | 16 | 20 | 0.2 | 250 | 0.5 | 13.56 |
| Layer region ($t_1t_2$) | $SiH_4/He = 0.5$<br>$CH_4$ / 100<br>$B_2H_6/He = 3 \times 10^{-3}$ | $SiH_4 = 200$ | 16 | 1 | 0.2 | 250 | 0.5 | 13.56 |
| Layer region ($t_St_1$) | $SiH_4/He = 0.5$ | $SiH_4 = 300$ | 16 | 0.15 | 0.2 | 250 | 0.5 | 13.56 |

TABLE 32

| | B distribution concentration $C_{(III)1}$ atomic ppm | | | | | | | |
|---|---|---|---|---|---|---|---|---|
| C distribution concentration $C_1$ atomic % | 0.1<br>Sample No./<br>Evaluation | 0.5<br>Sample No./<br>Evaluation | 1<br>Sample No./<br>Evaluation | 5<br>Sample No./<br>Evaluation | 10<br>Sample No./<br>Evaluation | 30<br>Sample No./<br>Evaluation | 50<br>Sample No./<br>Evaluation | 80<br>Sample No./<br>Evaluation |
| 0.01 | C1-1<br>Δ | C1-2<br>Δ | C1-3<br>Δ | C1-4<br>○ | C1-5<br>○ | C1-6<br>Δ | C1-7<br>Δ | C1-8<br>Δ |
| 0.03 | C2-1 | C2-2 | C2-3 | C2-4 | C2-5 | C2-6 | C2-7 | C2-8 |

TABLE 32-continued

| C dist. conc. $C_1$ atomic % | | | | | | | | |
|---|---|---|---|---|---|---|---|---|
| 0.05 | C3-1 / Δ | C3-2 / Δ | C3-3 / Δ | C3-4 / ◯ | C3-5 / ◯ | C3-6 / ◯ | C3-7 / Δ | C3-8 / Δ |
| 0.1 | C4-1 / Δ | C4-2 / Δ | C4-3 / ◯ | C4-4 / ◎ | C4-5 / ◎ | C4-6 / ◎ | C4-7 / ◯ | C4-8 / Δ |
| 0.3 | C5-1 / Δ | C5-2 / Δ | C5-3 / ◯ | C5-4 / ◎ | C5-5 / ◎ | C5-6 / ◎ | C5-7 / ◎ | C5-8 / ◯ |
| 0.5 | C6-1 / Δ | C6-2 / Δ | C6-3 / ◯ | C6-4 / ◎ | C6-5 / ◎ | C6-6 / ◎ | C6-7 / ◎ | C6-8 / ◎ |
| 1 | C7-1 / Δ | C7-2 / Δ | C7-3 / ◯ | C7-4 / ◎ | C7-5 / ◎ | C7-6 / ◎ | C7-7 / ◎ | C7-8 / ◎ |
| 2 | C8-1 / Δ | C8-2 / ◯ | C8-3 / ◯ | C8-4 / ◎ | C8-5 / ◎ | C8-6 / ◎ | C8-7 / ◎ | C8-8 / ◎ |
| 3.5 | C9-1 / Δ | C9-2 / ◯ | C9-3 / ◯ | C9-4 / ◎ | C9-5 / ◎ | C9-6 / ◎ | C9-7 / ◎ | C9-8 / ◎ |
| 5 | C10-1 / ◯ | C10-2 / ◯ | C10-3 / ◯ | C10-4 / ◎ | C10-5 / ◎ | C10-6 / ◎ | C10-7 / ◎ | C10-8 / ◎ |
| 7 | C11-1 / ◯ | C11-2 / ◯ | C11-3 / ◯ | C11-4 / ◎ | C11-5 / ◎ | C11-6 / ◎ | C11-7 / ◎ | C11-8 / ◎ |
| 10 | C12-1 / Δ | C12-2 / ◯ | C12-3 / ◯ | C12-4 / ◎ | C12-5 / ◎ | C12-6 / ◎ | C12-7 / ◎ | C12-8 / ◎ |
| 20 | C13-1 / Δ | C13-2 / Δ | C13-3 / ◯ | C13-4 / ◯ | C13-5 / ◎ | C13-6 / ◎ | C13-7 / ◎ | C13-8 / ◎ |
| 30 | C14-1 / Δ | C14-2 / Δ | C14-3 / Δ | C14-4 / ◯ | C14-5 / ◯ | C14-6 / ◯ | C14-7 / ◎ | C14-8 / ◎ |

| C distribution concentration $C_1$ atomic % | B distribution concentration $C_{(III)}$ atomic ppm | | | |
|---|---|---|---|---|
| | 100 Sample No./Evaluation | 200 Sample No./Evaluation | 400 Sample No./Evaluation | 800 Sample No./Evaluation |
| 0.01 | C1-9 / Δ | C1-10 / Δ | C1-11 / Δ | C1-12 / Δ |
| 0.03 | C2-9 / Δ | C2-10 / Δ | C2-11 / Δ | C2-12 / Δ |
| 0.05 | C3-9 / Δ | C3-10 / Δ | C3-11 / Δ | C3-12 / Δ |
| 0.1 | C4-9 / Δ | C4-10 / Δ | C4-11 / Δ | C4-12 / Δ |
| 0.3 | C5-9 / ◯ | C5-10 / ◯ | C5-11 / Δ | C5-12 / Δ |
| 0.5 | C6-9 / ◯ | C6-10 / ◯ | C6-11 / Δ | C6-12 / Δ |
| 1 | C7-9 / ◎ | C7-10 / ◯ | C7-11 / Δ | C7-12 / Δ |
| 2 | C8-9 / ◎ | C8-10 / ◯ | C8-11 / ◯ | C8-12 / Δ |
| 3.5 | C9-9 / ◎ | C9-10 / ◎ | C9-11 / ◯ | C9-12 / Δ |
| 5 | C10-9 / ◎ | C10-10 / ◯ | C10-11 / ◯ | C10-12 / Δ |
| 7 | C11-9 / ◎ | C11-10 / ◯ | C11-11 / Δ | C11-12 / Δ |
| 10 | C12-9 / ◎ | C12-10 / ◯ | C12-11 / Δ | C12-12 / Δ |
| 20 | C13-9 / ◯ | C13-10 / ◯ | C13-11 / Δ | C13-12 / Δ |
| 30 | C14-9 / Δ | C14-10 / Δ | C14-11 / Δ | C14-12 / Δ |

Evaluation standards
◎ Excellent
◯ Good
Δ Practically satisfactory

EXAMPLE 26

Image forming members for electrophotography were prepared by carrying out formation of amorphous layers having the layer constitution as shown in FIG. 3 on Al cylinders by means of the preparation device as shown in FIG. 11, with the contents of boron (B) and carbon (C) in the layers being as parameters. The preparation conditions for respective layer constituting the amorphous layers are shown in Table 33 below.

Using the image forming members for electrophotography obtained, toner images were formed repeatedly on transfer papers by applying similarly the electrophotographic process as in Example 25, whereby transferred toner images of high quality could be obtained stably.

TABLE 33

| Amorphous layer constitution | Gases employed (Vol %) | Flow rate (SCCM) | Flow rate ratio | Layer formation rate (Å/S) | Layer thickness (μ) | Discharging power (w/cm²) | Substrate temperature (°C.) | Pressure during reaction (torr) |
|---|---|---|---|---|---|---|---|---|
| Layer region ($t_3t_B$) | $SiH_4/He$ = 0.5 $CH_4$ 100 $B_2H_6/He$ = $3 \times 10^{-3}$ | $SiH_4$ = 200 | $CH_4/SiH_4$ = $8 \times 10^{-2}$ | 20 | 20 | 0.18 | 250 | 0.5 |
| Layer region ($t_2t_3$) | $SiH_4/He$ = 0.5 $CH_4$ 100 $B_2H_6/He$ = $3 \times 10^{-3}$ | $SiH_4$ = 200 | $CH_4/SiH_4$ = $8 \times 10^{-2} \sim 2 \times 10^{-2}$ $B_2H_6/SiH_4$ $8 \times 10^{-5}$ | 20 | 0.5 | 0.18 | 250 | 0.5 |
| Layer region ($t_1t_2$) | $SiH_4/He$ = 0.5 $CH_4$ 100 $B_2H_6/He$ = $3 \times 10^{-3}$ | $SiH_4$ = 200 | $CH_4/SiH_4$ = $2 \times 10^{-2} \sim 0$ $B_2H_6/SiH_4$ = $8 \times 10^{-5} \sim 0$ | 20 | 0.5 | 0.18 | 250 | 0.5 |
| Layer region ($t_st_1$) | $SiH_4/He$ = 0.5 | $SiH_4$ = 300 | | 20 | 1 | 0.18 | 250 | 0.5 |

Discharging frequency: 13.56 MHz

EXAMPLE 27

Image forming members for electrophotography were prepared by carrying out formation of amorphous layers having the layer constitution as shown in FIG. 4 on Al cylinders by means of the preparation device as shown in FIG. 11, with the contents of boron (B) and carbon (C) in the layers being as parameters. The preparation conditions for respective layer constituting the amorphous layers are shown in Table 34 below.

Using the image forming members for electrophotography obtained, toner images were formed repeatedly on transfer papers by applying similarly the electrophotographic process as in Example 25, whereby transferred toner images of high quality could be obtained stably.

EXAMPLE 28

Image forming members for electrophotography were prepared by carrying out formation of amorphous layers having the layer constitution as shown in FIG. 5 on Al cylinders by means of the preparation device as shown in FIG. 11, with the contents of boron (B) and carbon (C) in the layers being as parameters.

The preparation conditions for respective layer regions constituting the amorphous layers are shown in Table 35 below.

Using the image forming members for electrophotography obtained, toner images were formed repeatedly on transfer papers by applying similarly the electrophotographic process as in Example 25, to obtain the evaluations as shown in Table 36.

In Table 35, X(4) means the following:

| | |
|---|---|
| CS4-1 ... $1 \times 10^{-7}$ | CS4-2 ... $5 \times 10^{-7}$ |
| CS4-3 ... $1 \times 10^{-6}$ | CS4-4 ... $5 \times 10^{-6}$ |

TABLE 34

| Amorphous layer constitution | Gases employed (Vol %) | Flow rate (SCCM) | Flow rate ratio | Layer formation rate (Å/S) | Layer thickness (μ) | Discharging power (w/cm²) | Substrate temperature (°C.) | Pressure during reaction (torr) |
|---|---|---|---|---|---|---|---|---|
| Layer region ($t_3t_B$) | $SiH_4/He$ = 0.5 $CH_4$ 100 $B_2H_6/He$ = $3 \times 10^{-3}$ | $SiH_4$ = 200 | $CH_4/SiH_4$ = $1.5 \times 10^{-1}$ $B_2H_6/SiH_4$ = $3 \times 10^{-5}$ | 20 | 20 | 0.2 | 250 | 0.5 |
| Layer region ($t_2 t_3$) | $SiH_4He$ = 0.5 $CH_4$ 100 $B_2H_6/He$ = $3 \times 10^{-3}$ | $SiH_4$ = 200 | $CH_4/SiH_4$ = $1.5 \times 10^{-1}$ $B_2H_6/SiH_4$ = $3.0 \times 10^{-5} \sim 1.5 \times 10^{-5}$ | 20 | 0.5 | 0.2 | 250 | 0.5 |
| Layer region ($t_1t_2$) | $SiH_4/He$ = 0.5 $CH_4$ 100 $B_2H_6/He$ = $3 \times 10^{-3}$ | $SiH_4$ = 200 | $CH_4/SiH_4$ = $1.5 \times 10^{-1} \sim 0$ $B_2H_6/SiH_4$ = $1.5 \times 10^{-5} \sim 0$ | 20 | 0.5 | 0.2 | 250 | 0.5 |
| Layer region ($t_st_1$) | $SiH_4/He$ = 0.5 | $SiH_4$ = 300 | | 20 | 1 | 0.2 | 250 | 0.5 |

Discharging frequency: 13.56 MHz

TABLE 35

| Amorphous layer constitution | Gases employed (Vol %) | Flow rate (SCCM) | Flow rate ratio | Layer formation rate (Å/S) | Layer thickness (μ) | Discharging power (w/cm²) | Substrate temperature (°C.) | Pressure during reaction (torr) |
|---|---|---|---|---|---|---|---|---|
| Layer region ($t_5t_B$) | $SiH_4/He = 0.5$<br>$CH_4\ 100$<br>$B_2H_6/He = 3 \times 10^{-3}$ | $SiH_4 = 200$ | $CH_4/SiH_4 = 8 \times 10^{-2}$<br>$B_2H_6/SiH_4 = 1 \times 10^{-5}$ | 18 | 20 | 0.18 | 250 | 0.5 |
| Layer region ($t_4t_5$) | $SiH_4/He = 0.5$<br>$CH_4\ 100$<br>$B_2H_6/He = 3 \times 10^{-3}$ | $SiH_4 = 200$ | $CH_4/SiH_4 = 8 \times 10^{-2} \sim 5 \times 10^{-2}$<br>$B_2H_6/SiH_4 = 1 \times 10^{-5}$ | 18 | 0.5 | 0.18 | 250 | 0.5 |
| Layer region ($t_3t_4$) | $SiH_4/He = 0.5$<br>$CH_4\ 100$<br>$B_2H_6/He = 3 \times 10^{-3}$ | $SiH_4 = 200$<br>X(4) | $CH_4/SiH_4 = 5 \times 10^{-2} \sim 0$<br>$B_2H_6/SiH_4 = 1 \times 10^{-5} \sim$ | 18 | 0.3 | 0.18 | 250 | 0.5 |
| Layer region ($t_2t_3$) | $SiH_4/He = 0.5$<br>$B_2H_6/He = 3 \times 10^{-3}$ | $SiH_4 = 200$ | $B_2H_6/SiH_4 =$ X(4) | 18 | 0.5 | 0.18 | 250 | 0.5 |
| Layer region ($t_1t_2$) | $SiH_4/He = 0.5$<br>$CH_4\ 100$<br>$B_2H_6/He = 3 \times 10^{-3}$ | $SiH_4 = 200$ | $B_2H_6/SiH_4 =$ X(4)~0 | 18 | 0.3 | 0.18 | 250 | 0.5 |
| Layer region ($t_5t_1$) | $SiH_4/He = 0.5$ | $SiH_4 = 300$ | | 18 | 0.3 | 0.18 | 250 | 0.5 |

Discharging frequency: 13.56 MHz

TABLE 36

| | B distribution concentration $C_{(II)}3$ (atomic %) | | | | | | | | |
|---|---|---|---|---|---|---|---|---|---|
| | 0.1 | 0.5 | 1 | 5 | 10 | 20 | 40 | 80 | 100 |
| Example | Sample No./ Evaluation | Sample No./ Evaluation | Sample No./ Evaluation | Sample No./ Evaluation | Sample No./ Evaluation | Sample No./ Evaluation | Sample No./ Evaluation | Sample No./ Evaluation | 100 Sample No./ Evaluation |
| 28 | S4-1 Δ | S4-2 ○ | S4-3 ◎ | S4-4 ◎ | | | | | |
| 29 | S5-1 Δ | S5-2 ○ | S5-3 ◎ | S5-4 ◎ | S5-5 ◎ | S5-6 ◎ | S5-7 ○ | S5-8 Δ | S5-9 Δ |
| 30 | S6-1 ○ | S6-2 ○ | S6-3 ◎ | S6-4 ◎ | S6-5 ◎ | S6-6 ◎ | | | |
| 31 | S7-1 ○ | S7-2 ○ | S7-3 ◎ | S7-4 ◎ | S7-5 ◎ | S7-6 ◎ | S7-7 ○ | S7-8 Δ | S7-9 Δ |

Evaluation standards are the same as in Table 32

EXAMPLE 29

Image forming members for electrophotography were prepared by carrying out formation of amorphous layers having the layer constitution as shown in FIG. 6 on Al cylinders by means of the preparation device as shown in FIG. 11, with the contents of boron (B) and carbon (C) in the layers being as parameters. The preparation conditions for respective layer regions constituting the amorphous layers are shown in Table 37 below.

Using the image forming members for electrophotography obtained, respectively, toner images were formed repeatedly on transfer papers by applying similarly the electrophotographic process as in Example 25, to obtained the evaluations as shown in Table 36.

In Table 37, X(5) means the following:

| | |
|---|---|
| CS5-1 ... $1 \times 10^{-7}$ | CS5-2 ... $5 \times 10^{-7}$ |
| CS5-3 ... $1 \times 10^{-6}$ | CS5-4 ... $5 \times 10^{-6}$ |
| CS5-5 ... $1 \times 10^{-5}$ | CS5-6 ... $2 \times 10^{-5}$ |
| CS5-7 ... $4 \times 10^{-5}$ | CS5-8 ... $5 \times 10^{-5}$ |
| CS5-9 ... $6 \times 10^{-5}$ | |

TABLE 37

| Amorphous layer constitution | Gases employed (Vol %) | Flow rate (SCCM) | Flow rate ratio | Layer formation rate (Å/S) | Layer thickness (μ) | Discharging power (w/cm²) | Substrate temperature (°C.) | Pressure during reaction (torr) |
|---|---|---|---|---|---|---|---|---|
| Layer region ($t_5t_B$) | $SiH_4/He = 0.5$<br>$CH_4\ 100$<br>$B_2H_6/He =$ | $SiH_4 = 200$ | $CH_4/SiH_4 = 1.1 \times 10^{-2}$<br>$B_2H_6/SiH_4 = 8 \times 10^{-5}$ | 20 | 20 | 0.2 | 250 | 0.5 |

TABLE 37-continued

| Amorphous layer constitution | Gases employed (Vol %) | Flow rate (SCCM) | Flow rate ratio | Layer formation rate (Å/S) | Layer thickness ($\mu$) | Discharging power (w/cm$^2$) | Substrate temperature (°C.) | Pressure during reaction (torr) |
|---|---|---|---|---|---|---|---|---|
| Layer region ($t_4t_5$) | SiH$_4$/He = 0.5<br>CH$_4$ 100<br>B$_2$H$_6$/He = 3 × 10$^{-3}$ | SiH$_4$ = 200<br>7.4 × 10$^{-3}$ | CH$_4$/SiH$_4$ = 1.1 × 10$^{-2}$ ~<br>B$_2$H$_6$/SiH$_4$ = 8.0 × 10$^{-5}$ ~<br>X(5) | 20 | 1.0 | 0.2 | 250 | 0.5 |
| Layer region ($t_3t_4$) | SiH$_4$/He = 0.5<br>CH$_4$ 100<br>B$_2$H$_6$/He = 3 × 10$^{-3}$ | SiH$_4$ = 200 | CH$_4$/SiH$_4$ = 7.4 × 10$^{-3}$ ~ 0<br>Bohd 2H$_6$/SiH$_4$ = X(5) | 20 | 0.5 | 0.2 | 250 | 0.5 |
| Layer region ($t_2t_3$) | SiH$_4$/He = 0.5<br>B$_2$H$_6$/He = 3 × 10$^{-3}$ | SiH$_4$ = 200 | B$_2$H$_6$/SiH$_4$ = X(5) | 20 | 0.3 | 0.2 | 250 | 0.5 |
| Layer region ($t_1t_2$) | SiH$_4$/He = 0.5<br>B$_2$H$_6$/He = 3 × 10$^{-3}$ | SiH$_4$ = 200 | B$_2$H$_6$/SiH$_4$ = X(5)~0 | 20 | 0,5 | 0.2 | 250 | 0.5 |
| layer region ($t_5t_1$) | SiH$_4$/He = 0.5 | SiH$_4$ = 300 | | 20 | 0.5 | 0.2 | 250 | 0.5 |

Dicharging frequency: 13.56 MHz

EXAMPLE 30

Image forming members for electrophotography were prepared by carrying out formation of amorphous layers having the layer constitution as shown in FIG. 7 on Al cylinders by means of the preparation device as shown in FIG. 11, with the contents of boron (B) and carbon (C) in the layers being as parameters.

The preparation conditions for respective layer constituting the amorphous layers are shown in Table 38 below.

Using the image forming members for electrophotography obtained, respectively, toner images were formed repeatedly on transfer papers by applying similarly the electrophotographic process as in Example 25, to obtain the evaluations as shown in Table 36.

In Table 38, X(6) means the following:

| | |
|---|---|
| CS6-1 ... 1 × 10$^{-7}$ | CS6-2 ... 5 × 10$^{-7}$ |
| CS6-3 ... 1 × 10$^{-6}$ | CS6-4 ... 5 × 10$^{-6}$ |
| CS6-5 ... 1 × 10$^{-5}$ | CS6-6 ... 2 × 10$^{-5}$ |

TABLE 38

| Amorphous layer constitution | Gases employed (Vol %) | Flow rate (SCCM) | Flow rate ratio | Layer formation rate (Å/S) | Layer thickness ($\mu$) | Discharging power (w/cm$^2$) | Substrate temperature (°C.) | Pressure during reaction (torr) |
|---|---|---|---|---|---|---|---|---|
| Layer region ($t_3t_B$) | SiH$_4$/He = 0.5<br>CH$_4$ 100<br>B$_2$H$_6$/He = 3 × 10$^{-3}$ | SiH$_4$ = 200 | CH$_4$/SiH$_4$ = 2.2 × 10$^{-2}$<br>B$_2$H$_6$/SiH$_4$ = 3 × 10$^{-5}$ | 20 | 20 | 0.2 | 250 | 0.5 |
| Layer region ($t_2t_3$) | SiH$_4$/He = 0.5<br>CH$_4$ 100<br>B$_2$H$_6$/He = 3 × 10$^{-3}$ | SiH$_4$ = 200 | CH$_4$/SiH$_4$ = 2.2 × 10$^{-2}$ ~ 1.38 × 10$^{-2}$<br>B$_2$H$_6$/SiH$_4$ = 3 × 10$^{-5}$ | 20 | 0.5 | 0.2 | 250 | 0.5 |
| Layer region ($t_1t_2$) | SiH$_4$/He = 0.5<br>CH$_4$ 100<br>B$_2$H$_6$/He = 3 × 10$^{-3}$ | SiH$_4$ = 200 | CH$_4$/SiH$_4$ = 1.38 × 10$^{-2}$ ~ 0<br>B$_2$H$_6$/SiH$_4$ = 3 × 10$^{-5}$ ~ X(6) | 20 | 0.3 | 0.2 | 250 | 0.5 |
| Layer region ($t_5t_1$) | SiH$_4$/He = 0.5<br>B$_2$H$_6$/He = 3 × 10$^{-3}$ | SiH$_4$ = 200 | B$_2$H$_6$/SiH$_4$ = X(6) | 20 | 0.2 | 0.2 | 250 | 0.5 |

Discharging frequency: 13.56 MHz

EXAMPLE 31

Image forming members for electrophotography were prepared by carrying out formation of amorphous layers having the layer constitution as shown in FIG. 8 on Al cylinders by means of the preparation device as shown in FIG. 11, with the contents of boron (B) and carbon (C) in the layers being as parameters.

The preparation conditions for respective layer regions constituting the amorphous layers are shown in Table 39 below.

Using the image forming members for electrophotography obtained, respectively, toner images were formed repeatedly on transfer papers by applying similarly the electrophotographic process as in Example 25, to obtain the evaluations as shown in Table 36.

In Table 39, X(7) means the following:

| | |
|---|---|
| S7-1 ... $1 \times 10^{-7}$ | S7-2 ... $5 \times 10^{-7}$ |
| S7-3 ... $1 \times 10^{-6}$ | S7-4 ... $5 \times 10^{-6}$ |
| S7-5 ... $1 \times 10^{-5}$ | S7-6 ... $2 \times 10^{-5}$ |
| S7-7 ... $4 \times 10^{-5}$ | S7-8 ... $8 \times 10^{-5}$ |
| S7-9 ... $1 \times 10^{-4}$ | | layers having the layer constitution as shown in FIG. 9 on Al cylinders by means of the preparation device as shown in FIG. 11, with the contents of boron (B) and carbon (C) in the layers being as parameters.

The preparation conditions for respective layer regions constituting the amorphous layers are shown in Table 40 below.

Using the image forming members for electrophotography obtained, respectively, toner images were formed repeatedly on transfer papers by applying similarly the electrophotographic process as in Example 25, to obtain the evaluation as shown in Table 41.

In Table 40, X(8) means the following:

| | |
|---|---|
| CS8-1 ... $1.1 \times 10^{-4}$ | CS8-2 ... $4.4 \times 10^{-4}$ |
| CS8-3 ... $1.1 \times 10^{-3}$ | CS8-4 ... $2.2 \times 10^{-3}$ |
| CS8-5 ... $4.4 \times 10^{-3}$ | CS8-6 ... $7.7 \times 10^{-3}$ |

TABLE 39

| Amorphous layer constitution | Gases employed (Vol %) | Flow rate (SCCM) | Flow rate ratio | Layer formation rate (Å/S) | Layer thickness (μ) | Discharging power (w/cm²) | Substrate temperature (°C.) | Pressure during reaction (torr) |
|---|---|---|---|---|---|---|---|---|
| Layer region ($t_3 t_B$) | SiH$_4$/He = 0.5<br>CH$_4$ 100<br>B$_2$H$_6$/He = $3 \times 10^{-3}$ | SiH$_4$ = 200 | CH$_4$/SiH$_4$ = $2.2 \times 10^{-2}$<br>B$_2$H$_6$/SiH$_4$ = $2 \times 10^{-4}$ | 20 | 20 | 0.2 | 250 | 0.5 |
| Layer region ($t_2 t_3$) | SiH$_4$/He = 0.5<br>CH$_4$ 100<br>B$_2$H$_6$/He = $3 \times 10^{-3}$ | SiH$_4$ = 200 | CH$_4$/SiH$_4$ = $2.2 \times 10^{-2}$ ~ $1.47 \times 10^{-2}$<br>B$_2$H$_6$/SiH$_4$ = $2 \times 10^{-4}$ ~ X(7) | 20 | 0.3 | 0.2 | 250 | 0.5 |
| Layer region ($t_1 t_2$) | SiH$_4$/He = 0.5<br>CH$_4$ 100<br>B$_2$H$_6$/He = $3 \times 10^{-3}$ | SiH$_4$ = 200 | CH$_4$/SiH$_4$ = $1.47 \times 10^{-2}$ ~ 0<br>B$_2$H$_6$/SiH$_4$ = X(7) | 20 | 1.0 | 0.2 | 250 | 0.5 |
| Layer region ($t_S t_1$) | SiH$_4$/He = 0.5<br>B$_2$H$_6$/He = $3 \times 10^{-3}$ | SiH$_4$ = 200 | B$_2$H$_6$/SiH$_4$ = X(7) | 20 | 2.0 | 0.2 | 250 | 0.5 |

Discharging frequency: 13.56 MHz

EXAMPLE 32

Image forming members for electrophotography were prepared by carrying out formation of amorphous

TABLE 40

| Amorphous layer constitution | Gases employed (Vol %) | Flow rate (SCCM) | Flow rate ratio | Layer formation rate (Å/S) | Layer thickness (μ) | Discharging power (w/cm²) | Substrate temperature (°C.) | Pressure during reaction (torr) |
|---|---|---|---|---|---|---|---|---|
| Layer region ($t_2 t_B$) | SiH$_4$/He = 0.5<br>CH$_4$ 100<br>B$_2$H$_6$/He = $3 \times 10^{-3}$ | SiH$_4$ = 200 | CH$_4$/SiH$_4$ = $1.1 \times 10^{-2}$<br>B$_2$H$_6$/SiH$_4$ = $4 \times 10^{-5}$ | 20 | 20 | 0.2 | 250 | 0.5 |
| Layer region ($t_1 t_2$) | SiH$_4$/He = 0.5<br>CH$_4$ 100<br>B$_2$H$_6$/He = $3 \times 10^{-3}$ | SiH$_4$ = 200 | CH$_4$/SiH$_4$ = $1.1 \times 10^{-2}$ ~ X(8)<br>B$_2$H$_6$/SiH$_4$ = $4 \times 10^{-4}$ ~ $2 \times ^{-5}$ | 20 | 0.5 | 0.2 | 250 | 0.5 |
| Layer region ($t_S t_1$) | SiH$_4$/He = 0.5 | SiH$_4$ = 300 | | 20 | 1 | 0.2 | 250 | 0.5 |

Discharging frequency: 13.56 MHz

TABLE 41

| Sample No. | CS8-1 | CS8-2 | CS8-3 | CS8-4 | CS8-5 | CS8-6 |
|---|---|---|---|---|---|---|
| Evaluation | Δ | Δ | | | | |

(Evaluation standards are the same as in Table 32)

EXAMPLE 33

Image forming members of electrophotography were prepared by carrying out formation of amorphous layers having the layer constitution as shown in FIG. 10 on Al cylinders by means of the preparation device as shown in FIG. 11, with the thicknesses of the layer region ($t_1 t_2$) and the layer region ($t_2 t_3$) being as parameters. The preparation conditions for respective layer regions constituting the amorphous layers are shown in Table 42 below.

Using the image forming members for electrophotography obtained, respectively, toner images were formed repeatedly on transfer papers by applying similarly the electrophotographic process as in Example 25, to obtain the evaluations as shown in Table 43.

TABLE 42

| Amorphous layer constitution | Gases employed (Vol %) | Flow rate (SCCM) | Flow rate ratio | Layer formation rate (Å/S) | Layer thickness ($\mu$) | Discharging power (w/cm$^2$) | Substrate temperature (°C.) | Pressure during reaction (torr) |
|---|---|---|---|---|---|---|---|---|
| Layer region ($t_3 t_B$) | $SiH_4/He = 0.5$<br>$CH_4$ 100<br>$B_2H_6/He = 3 \times 10^{-3}$ | $SiH_4 = 200$ | $CH_4/SiH_4 = 7.7 \times 10^{-2}$<br>$B_2H_6/SiH_4 = 8 \times 10^{-5}$ | 20 | 20 | 0.2 | 250 | 0.5 |
| Layer region ($t_2 t_3$) | $SiH_4/He = 0.5$<br>$CH_4$ 100<br>$B_2H_6/He = 3 \times 10^{-3}$ | $SiH_4 = 200$ | $CH_4/SiH_4 = 7.7 \times 10^{-2} \sim 3.85 \times 10^{-2}$<br>$B_2H_6/SiH_4 = 8 \times 10^{-5} \sim 0$ | 20 | 1 | 0.2 | 250 | 0.5 |
| Layer region ($t_1 t_2$) | $SiH_4/He = 0.5$<br>$CH_4$ 100 | $SiH_4 = 200$ | $CH_4/SiH_4 = 3.8 \times 10^{-2} \sim 0$ | 20 | 1 | 0.2 | 250 | 0.5 |
| Layer region ($t_S t_1$) | $SiH_4/He = 0.5$ | $SiH_4 = 300$ | | 20 | 1 | 0.2 | 250 | 0.5 |

Discharging frequency: 13.56 MHz

TABLE 43

| Layer region ($t_2 t_3$) ($\mu$m) | Layer region ($t_1 t_2$) ($\mu$m) | | | | |
|---|---|---|---|---|---|
| | 0.1<br>Sample No./Evaluation | 0.5<br>Sample No./Evaluation | 1.0<br>Sample No./Evaluation | 4<br>Sample No./Evaluation | 8<br>Sample No./Evaluation |
| 0.1 | CS9-11 | CS9-12 | CS9-13 | CS9-14 | CS9-15 |
| 0.2 | CS9-21 | CS9-22 | CS9-23 | CS9-24 | CS9-25 |
| 1.0 | CS9-31 | CS9-32 | CS9-33 | CS9-34 | CS9-35 |
| 4 | CS9-41 | CS9-42 | CS9-43 | CS9-44 | CS9-45 |
| 8 | CS9-51 | CS9-52 | CS9-53 | CS9-54 | CS9-55 |

EXAMPLE 34

Image forming members for electrophotography were prepared by carrying formation of amorphous layers having the layer constitution as shown in FIG. 2 on Al cylinders by means of the preparation device as shown in FIG. 11, with the contents of boron (B) and carbon (C) in the layers being as parameters. The preparation conditions for respective layer regions constituting the amorphous layers are shown in Table 44 below.

Using the image forming members for electrophotography obtained, toner images were formed repeatedly on transfer papers by applying similarly the electrophotographic process as in Example 25, whereby transferred toner images of high quality could be obtained stably.

TABLE 44

| Amorphous layer constitution | Gases employed (Vol %) | Flow rate (SCCM) | Flow rate ratio | Layer formation rate (Å/S) | Layer thickness ($\mu$) | Discharging power (w/cm$^2$) | Substrate temperature (°C.) | Pressure during reaction (torr) |
|---|---|---|---|---|---|---|---|---|
| Layer region ($t_4 t_B$) | $SiH_4/He = 0.5$<br>$CH_4$ 100<br>$B_2H_6/He = 3.3 \times 10^{-3}$ | $SiH_4 = 200$ | $CH_4/SiH_4 = 4 \times 10^{-2}$<br>$B_2H_6/SiH_4 = 5 \times 10^{-4}$ | 20 | 0.3 | 0.2 | 250 | 0.5 |
| Layer | $SiH_4/He =$ | $SiH_4 =$ | $CH_4/SiH_4 =$ | 20 | 20 | 0.2 | 250 | 0.5 |

TABLE 44-continued

| Amorphous layer constitution | Gases employed (Vol %) | Flow rate (SCCM) | Flow rate ratio | Layer formation rate (Å/S) | Layer thickness ($\mu$) | Discharging power (w/cm$^2$) | Substrate temperature (°C.) | Pressure during reaction (torr) |
|---|---|---|---|---|---|---|---|---|
| region ($t_2t_4$) | 0.5 CH$_4$ 100 B$_2$H$_6$/He = 3.3 × 10$^{-3}$ | 200 | 4 × 10$^{-2}$ B$_2$H$_6$/SiH$_4$ = 8 × 10$^{-5}$ | | | | | |
| Layer region ($t_1t_2$) | SiH$_4$/He = 0.5 CH$_4$ 100 B$_2$H$_6$/He = 3.3 × 10$^{-3}$ | SiH$_4$ = 200 | CH$_4$/SiH$_4$ = 4 × 10$^{-2}$~0 B$_2$H$_6$/SiH$_4$ = 8 × 10$^{-5}$~0 | 20 | 1 | 0.2 | 250 | 0.5 |
| Layer region ($t_S t_1$) | SiH$_4$/He = 0.5 | SiH$_4$ = 300 | | 20 | 0.15 | 0.2 | 250 | 0.5 |

Discharging frequency: 13.56 MHz

EXAMPLE 35

After amorphous layers having the layer constitution as shown in FIG. 3 were formed on Al cylinders according to the same procedures under the same conditions as in Example 26, silicon carbide type surface barrier layers were formed on said amorphous layers in accordance with the conditions as shown below. The thus prepared samples were subjected to the electrophotographic process repeatedly to obtain toner transferred images. As the result, even the one millionth toner transferred image was also found to be of very high quality, comparable to the first toner transferred image.

| Gases employed | CH$_4$ |
|---|---|
| | SiH$_4$/He= 10:250 |
| Flow rate | SiH$_4$ = 10 SCCM |
| Flow rate ratio | CH$_4$/SiH$_4$ = 30 |
| Layer formation rate | 0.84Å/sec |
| Discharging power | 0.18 W/cm$^2$ |
| Substrate temperature | 250° C. |
| Pressure during reaction | 0.5 torr |

EXAMPLE 36

Image forming members for electrophotography were prepared by carrying out formation of amorphous layers having the layer constitution as shown in FIG. 3 on Al cylinders by means of the preparation device as shown in FIG. 11, with the contents of boron (B) and carbon (C) in the layers being as parameters. The preparation conditions for respective layer regions constituting the amorphous layers are shown in Table 45 below.

Using the image forming members for electrophotography obtained, toner images were formed repeatedly on transfer papers by applying similarly the electrophotographic process as in Example 25, whereby transferred toner images of high quality could be obtained stably.

TABLE 45

| Amorphous layer constitution | Gases employed (Vol %) | Flow rate (SCCM) | Flow rate ratio | Layer formation rate (Å/S) | Layer thickness ($\mu$) | Discharging power (w/cm$^2$) | Substrate temperature (°C.) | Pressure during reaction (torr) |
|---|---|---|---|---|---|---|---|---|
| Layer region ($t_3t_B$) | SiH$_4$/He = 0.5 SiF$_4$/He = 0.5 CH$_4$ 100 B$_2$H$_6$/He = 3 × 10$^{-3}$ | SiH$_4$ = 200 | CH$_4$/(SiH$_4$ + SiF$_4$) = 4 × 10$^{-2}$ SiF$_4$/SiH$_4$ = 0.2 B$_2$H$_6$/(SiH$_4$ + SiF$_4$) = 8 × 10$^{-5}$ | 20 | 20 | 0.18 | 250 | 0.5 |
| Layer region ($t_2t_3$) | SiH$_4$/He = 0.5 SiF$_4$/He = 0.5 CH$_4$ 100 B$_2$H$_6$/He = 3 × 10$^{-3}$ | SiH$_4$ = 200 | CH$_4$/(SiH$_4$ + SiF$_4$) = 4 × 10$^{-2}$~2 × 10$^{-2}$ SiF$_4$/SiH$_4$ = 0.2 B$_2$H$_6$/(SiH$_4$ + SiF$_4$) = 8 × 10$^{-5}$ | 20 | 0.5 | 0.18 | 250 | 0.5 |
| Layer region ($t_1t_2$) | SiH$_4$/He = 0.5 SiF$_4$/He = 0.5 CH$_4$ 100 B$_2$H$_6$/He = 3 × 10$^{-3}$ | SiH$_4$ = 200 | CH$_4$/(SiH$_4$ + SiF$_4$) = 2 × 10$^{-2}$~0 SiF$_4$/SiH$_4$ = 0.2 B$_2$H$_6$/(SiH$_4$ + SiF$_4$) = 8 × 10$^{-5}$~0 | 20 | 0.5 | 0.18 | 250 | 0.5 |
| Layer | SiH$_4$/He = | SiH$_4$ = | SiF$_4$/SiH$_4$ = | 20 | 1 | 0.18 | 250 | 0.5 |

TABLE 45-continued

| Amorphous layer constitution | Gases employed (Vol %) | Flow rate (SCCM) | Flow rate ratio | Layer formation rate (Å/S) | Layer thickness ($\mu$) | Discharging power (w/cm$^2$) | Substrate temperature (°C.) | Pressure during reaction (torr) |
|---|---|---|---|---|---|---|---|---|
| region ($t_5t_1$) | 0.5 SiF$_4$/He = 0.5 | 300 | 0.2 | | | | | |

Discharging frequency: 13.56 MHz

What we claim is:

1. A photoconductive member comprising a support for a photoconductive member and an amorphous layer having photoconductivity constituted of an amorphous material comprising silicon atoms as a matrix and at least one of hydrogen atoms and halogen atoms, said amorphous layer having a first layer region containing as the constituent atom at least one kind of atoms selected from the group consisting of oxygen atoms, carbon atoms and nitrogen atoms in a distribution state which is ununiform and continuous in the direction of layer thickness wherein the ununiform distribution is concentrated at the support side and decreases towards the side opposite to the side at which the support is provided and wherein the distribution state is uniform in the direction substantially parallel to surface of said amorphous layer and a second layer region containing atoms belonging to the group III of the periodic table as constituent atoms in a distribution state which is ununiform and continuous in the direction of layer thickness, said first layer region existing internally below the surface of said amorphous layer.

2. A photoconductive member according to claim 1, wherein the first layer region and the second layer region are substantially the same layer region.

3. A photoconductive member according to claim 1, wherein said second layer region exists internally within said first layer region.

4. A photoconductive member according to claim 1, wherein the second layer region occupies substantially the entire layer region of the amorphous layer.

5. A photoconductive member according to claim 1, wherein oxygen atoms are contained in the first layer region.

6. A photoconductive member according to claim 5, wherein the distribution of oxygen atoms in the first layer is such that it is decreased toward the side opposite to the side at which the support is provided.

7. A photoconductive member according to claim 5, wherein the distribution of oxygen atoms in the first layer is such that it has a distribution region with higher concentration of oxygen atoms on the side of the support.

8. A photoconductive member according to claim 1, wherein nitrogen atoms are contained in the first layer region.

9. A photoconductive member according to claim 8, wherein the distribution of nitrogen atoms in the first layer is such that it is decreased toward the side opposite to the side at which the support is provided.

10. A photoconductive member according to claim 8, wherein the distribution of nitrogen atoms in the first layer is such that it has a distribution region with higher concentration of nitrogen atoms on the side of the support.

11. A photoconductive member according to claim 1, wherein carbon atoms are contained in the first layer region.

12. A photoconductive member according to claim 11, wherein the distribution of carbon atoms in the first layer is such that it is decreased toward the side opposite to the side at which the support is provided.

13. A photoconductive member according to claim 11, wherein the distribution of carbon atoms in the first layer is such that it has a distribution region with higher concentration of carbon atoms on the side of the support.

14. A photoconductive member according to claim 1, wherein oxygen atoms and nitrogen atoms are contained in the first layer region.

15. A photoconductive member according to claim 1, wherein oxygen atoms and carbon atoms are contained in the first layer region.

16. A photoconductive member according to claim 1, wherein carbon atoms and nitrogen atoms are contained in the first layer region.

17. A photoconductive member according to claim 1, wherein oxygen atoms, nitrogen atoms and carbon atoms are contained in the first layer region.

18. A photoconductive member according to claim 1, wherein hydrogen atoms are contained in the amorphous layer.

19. A photoconductive member according to claim 18, wherein the content of hydrogen atoms is 1 to 40 atomic %.

20. A photoconductive member according to claim 1, wherein halogen atoms are contained in the amorphous layer.

21. A photoconductive member according to claim 20, wherein the content of halogen atoms is 1 to 40 atomic %.

22. A photoconductive member according to claim 1, wherein hydrogen atoms and halogen atoms are contained in the amorphous layer.

23. A photoconductive member according to claim 22, wherein the sum of the contents of hydrogen atoms and halogen atoms is 1 to 40 atomic %.

24. A photoconductive member according to claim 1, further having a surface barrier layer on the amorphous layer.

25. A photoconductive member according to claim 1, wherein there is further provided on the amorphous layer a surface layer comprising an amorphous material containing silicon atoms as matrix and at least one kind of atoms selected from carbon atoms and nitrogen atoms.

26. A photoconductive member according to claim 25, wherein the amorphous material constituting the surface layer further contains hydrogen atoms.

27. A photoconductive member according to claim 25, wherein the amorphous material constituting the surface layer further contains halogen atoms.

28. A photoconductive member according to claim 25, wherein the amorphous material constituting the surface layer further contains hydrogen atoms and halogen atoms.

29. A photoconductive member according to claim 1, further having a surface layer constituted of an electrically insulating metal oxide.

30. A photoconductive member according to claim 1, further having a surface layer constituted of an electrically insulating organic compound.

31. A photoconductive member according to claim 1, wherein the atoms belonging to the group III of the periodic table are selected from the group consisting of B, Al, Ga, In and Tl.

32. A photoconductive member according to claim 1, wherein the content of the atoms belonging to the group III of the periodic table in the second layer region is $0.01-5 \times 10^4$ atomic ppm.

33. A photoconductive member according to claim 1, wherein the content of the atoms belonging to the group III of the periodic table in the second layer region is 1-100 ppm.

34. A photoconductive member according to claim 1, wherein the content of the selected atoms contained in the first layer region is 0.001-30 atomic %.

35. A photoconductive member according to claim 1, wherein the content of the selected atoms contained in the first layer region is 0.01-20 atomic %.

36. A photoconductive member according to claim 1, wherein the distribution concentration C(III) of the atoms belonging to the group III of the periodic table contained in the second layer region in the direction of layer thickness at the end portion of said layer region on the support side is $0.1-8 \times 10^4$ atomic ppm based on silicon atoms.

37. A photoconductive member according to claim 1, wherein the distribution concentration C(III) of the atoms belonging to the group III of the periodic table contained in the second layer region in the direction of layer thickness at the end portion of said layer region on the support side is 0.1-1000 atomic ppm based on silicon atoms.

38. A photoconductive member according to claim 1, wherein the distribution concentration $C_1$ of the selected atoms contained in the first layer region in the direction of layer thickness at the end portion of said layer region on the support side is 0.01-35 atomic %.

39. A photoconductive member according to claim 1, wherein the distribution concentration $C_1$ of the selected atoms contained in the first layer region in the direction of layer thickness at the end portion of said layer region on the support side is 0.01-30 atomic %.

40. A photoconductive member according to claim 1, wherein the distribution concentration line of the atoms belonging to the group III of the periodic table contained in the second layer region has a portion in which the concentration is continuously decreased toward the surface of said amorphous layer.

41. A photoconductive member according to claim 1, wherein the distribution concentration line of the selected atoms contained in the first layer region in the direction of layer thickness has a portion in which the concentration is continuously decreased toward the surface of said amorphous layer.

42. A photoconductive member according to claim 1, wherein the distribution concentration line of the atoms belonging to the group III of the periodic table contained in the second layer region in the direction of layer thickness has an even portion and uneven portion.

43. A photoconductive member according to claim 1, wherein the distribution concentration line of the selected atoms contained in the first layer region in the direction of layer thickness has an even portion and uneven portion.

44. A photoconductive member according to claim 1, wherein the layer thickness of the layer region not containing the selected atom contained in the first layer region is 100 Å-10μ.

45. A photoconductive member according to claim 1, wherein the first layer region has a region in which the selected atoms contained in said layer region is contained in a high concentration, at the end region on the support side.

46. A photoconductive member according to claim 45, the layer thickness of the layer region containing the selected atoms in a high concentration is 50 Å-5μ.

47. A photoconductive member according to claim 1, wherein the layer thickness of the amorphous layer is 3-100μ.

48. A photoconductive member according to claim 1, wherein the support is in a belt like form.

49. A photoconductive member according to claim 1, wherein the support is in a cylindrical form.

50. A photoconductive member according to claim 1, wherein the support is provided with a synthetic resin film having electroconductivity at the surface.

51. A photoconductive member according to claim 24, wherein the layer thickness of the surface barrier layer is 30 Å-5μ.

52. A photoconductive member according to claim 25, wherein the layer thickness of the surface layer is 30 Å-5μ.

* * * * *

UNITED STATES PATENT AND TRADEMARK OFFICE
CERTIFICATE OF CORRECTION

PATENT NO. : 4,460,669

DATED : July 17, 1984

INVENTOR(S) : OGAWA, Kyosuke et al

It is certified that error appears in the above-identified patent and that said Letters Patent is hereby corrected as shown below:

Cover, ABSTRACT, line 9, change "ununiform" to --non-uniform--
Cover, ABSTRACT, lines 12/13, change "ununiform" to --non-uniform--

Col. 2, line 39, change "it" to --It--

Col. 3, line 28, change "ununiform" to --non-uniform--
      lines 31/32, change "ununiform" to --non-uniform--
      line 42, insert --show-- following "10"
      line 46, insert --show-- following "11"

Col. 4, line 14, change "ununiform" to --non-uniform--
      line 35, change "ununiform" to --non-uniform--

Col. 6, line 9, change "$t_s t_B)$" to --$(t_s t_B)$--

Col. 9, line 65, change "ununiformly" to --non-uniformly--

Col. 10, line 18, change "ununiform" to --non-uniform--
      line 37, delete "about"

Col. 12, line 6, change "conpound" to --compound--

Col. 14, line 61, insert --is-- before "used"

Col. 15, line 49, change "S" to --Si--

Col. 17, line 35, change "there" to --they--
      line 40, change "Cl" to --$C_i$--

Col. 18, line 23, insert --be-- following "generally"

Col. 20, line 44, change "maay" to --may--

UNITED STATES PATENT AND TRADEMARK OFFICE
CERTIFICATE OF CORRECTION

PATENT NO. : 4,460,669  Page 2 of 18
DATED : July 17, 1984
INVENTOR(S) : OGAWA, Kyosuke et al It is certified that error appears in the above-identified patent and that said Letters Patent is hereby corrected as shown below:

Col. 22, Table 2, attached chart is correct.

UNITED STATES PATENT AND TRADEMARK OFFICE
CERTIFICATE OF CORRECTION

PATENT NO. : 4,460,669
DATED : July 17, 1984
INVENTOR(S) : OGAWA, Kyosuke et al

Page 3 of 18

It is certified that error appears in the above-identified patent and that said Letters Patent is hereby corrected as shown below:

Col. 23, Table 3, in the Note: change "dask" to --dash--

Col. 25, Table 6, attached Table is correct.

Table 6

| Distribution concentration Si(III) (atomic %) / Example | 0.1 | 0.5 | 1 | 5 | 10 | 20 | 40 | 80 | 100 |
|---|---|---|---|---|---|---|---|---|---|
| 4 | S4-1 | S4-2 | S4-3 | S4-4 | | | | | |
| | | | | | | | | | |
| 5 | S5-1 | S5-2 | S5-3 | S5-4 | S5-5 | S5-6 | S5-7 | S5-8 | S5-9 |
| | | | | | | | | | |
| 6 | S6-1 | S6-2 | S6-3 | S6-4 | S6-5 | S6-6 | | | |
| | | | | | | | | | |
| 7 | S7-1 | S7-2 | S7-3 | S7-4 | S7-5 | S7-6 | S7-7 | S7-8 | S7-9 |
| | | | | | | | | | |

Sample No. / Evaluation    Evaluation standards are the same as in Table 2

Col. 30, line 3, change "FIG. 1" to --FIG. 11--

UNITED STATES PATENT AND TRADEMARK OFFICE
CERTIFICATE OF CORRECTION

PATENT NO. : 4,460,669           Page 4 of 18
DATED : July 17, 1984
INVENTOR(S) : OGAWA, Kyosuke et al It is certified that error appears in the above-identified patent and that said Letters Patent is hereby corrected as shown below:

Col. 31, Table 11, attached Table is correct.

Table 11

| Sample No. | S8-1 | S8-2 | S8-3 | S8-4 | S8-5 | S8-6 |
|---|---|---|---|---|---|---|
| O distribution concentration C(o)] | 0.05 | 0.2 | 0.5 | 1.0 | 2 | 3.5 |
| Evaluation | △ | △ | ○ | ◎ | ◎ | ◎ |

Evaluation standards are the same as in Table 2

Col. 32, Table 13, attached Table is correct.

Table 13

| Layer region $(t_1, t_2)$ (μm) / Layer region $(t_2, t_3)$ (μm) | 0.1 | 0.5 | 1.0 | 4 | 4 |
|---|---|---|---|---|---|
| 0.1 | S9-11 | S9-12 | S9-13 | S9-14 | S9-15 |
|     | ○ | ○ | ○ | ○ | ○ |
| 0.2 | S9-21 | S9-22 | S9-23 | S9-24 | S9-25 |
|     | ○ | ○ | ○ | ○ | ○ |
| 1.0 | S9-31 | S9-32 | S9-33 | S9-34 | S9-35 |
|     | ○ | ○ | ○ | ○ | ○ |
| 4   | S9-41 | S9-42 | S9-43 | S9-44 | S9-45 |
|     | ○ | ○ | ○ | ○ | ○ |
| 8   | S9-51 | S9-52 | S9-53 | S9-54 | S9-55 |
|     | ○ | ○ | ○ | ○ | ○ |

| Sample No. |
|---|
| Evaluation |

UNITED STATES PATENT AND TRADEMARK OFFICE
CERTIFICATE OF CORRECTION

PATENT NO. : 4,460,669

DATED : July 17, 1984

INVENTOR(S) : OGAWA, Kyosuke et al

Page 5 of 18

It is certified that error appears in the above-identified patent and that said Letters Patent is hereby corrected as shown below:

Col. 33, Table 15, attached Table is correct.

Table 15

| Amorphous layer constitution | Gases employed (Vol.%) | Flow rate (SCCM) | Flow rate ratio | Layer formation rate (Å/s) | Layer thickness (μ) | Discharging power (W/cm$^2$) | Substrate temperature (°C) | Pressure during reaction (torr) |
|---|---|---|---|---|---|---|---|---|
| Layer region $(t_1, t_0)$ | $SiH_4/He = 0.5$<br>$SiF_4/He = 0.5$<br>$NO\ 100$<br>$B_2H_6/He = 3\times10^{-3}$ | $SiH_4$<br>+200 | $NO/(SiH_4+SiF_4)$<br>$= 4\times10^{-2}$<br>$SiF_4/SiH_4 = 0.2$<br>$B_2H_6/(SiH_4+SiF_4) = 8\times10^{-5}$ | 20 | 20 | 0.18 | 250 | 0.5 |
| Layer region $(t_2, t_1)$ | $SiH_4/He = 0.5$<br>$SiF_4/He = 0.5$<br>$NO\ 100$<br>$B_2H_6/He = 3\times10^{-3}$ | $SiH_4$<br>+200 | $NO/(SiH_4+SiF_4)$<br>$= 4\times10^{-2} - 2\times10^{-2}$<br>$SiF_4/SiH_4 = 0.2$<br>$B_2H_6/(SiH_4+SiF_4) = 8\times10^{-5}$ | 20 | 0.5 | 0.18 | 250 | 0.5 |
| Layer region $(t_3, t_2)$ | $SiH_4/He = 0.5$<br>$SiF_4/He = 0.5$<br>$NO\ 100$<br>$B_2H_6/He = 3\times10^{-3}$ | $SiH_4$<br>+200 | $NO/(SiH_4+SiF_4)$<br>$= 2\times10^{-2} - 0$<br>$SiF_4/SiH_4 = 0.2$<br>$B_2H_6/(SiH_4+SiF_4) = 8\times10^{-5} - 0$ | 20 | 0.5 | 0.18 | 250 | 0.5 |
| Layer region $(t_4, t_3)$ | $SiH_4/He = 0.5$<br>$SiF_4/He = 0.5$ | $SiH_4$<br>+300 | $SiF_4/SiH_4 = 0.2$ | 20 | 1 | 0.18 | 250 | 0.5 |

Discharging frequency: 13.56 MHz

UNITED STATES PATENT AND TRADEMARK OFFICE
CERTIFICATE OF CORRECTION

PATENT NO. : 4,460,669   Page 6 of 18
DATED : July 17, 1984
INVENTOR(S) : OGAWA, Kyosuke et al It is certified that error appears in the above-identified patent and that said Letters Patent is hereby corrected as shown below:

Col. 35/36, Table 17, attached Table is correct.
38, Table 17, attached Table is correct.

UNITED STATES PATENT AND TRADEMARK OFFICE
CERTIFICATE OF CORRECTION

PATENT NO. : 4,460,669     Page 7 of 18

DATED : July 17, 1984

INVENTOR(S) : OGAWA, Kyosuke et al

It is certified that error appears in the above-identified patent and that said Letters Patent is hereby corrected as shown below:

Col. 38, line 65, insert --regions-- following "layer"

Col. 39/40, Table 21, attached Table is correct.
     41/42, Table 21, attached Table is correct.

UNITED STATES PATENT AND TRADEMARK OFFICE
CERTIFICATE OF CORRECTION

PATENT NO. : 4,460,669  Page 8 of 18
DATED : July 17, 1984
INVENTOR(S) : OGAWA, Kyosuke et al It is certified that error appears in the above-identified patent and that said Letters Patent is hereby corrected as shown below:

Col. 46, Table 27, attached Table is correct

Table 27

| Amorphous layer constitution | Gases employed (Vol%) | Flow rate (SCCM) | Flow rate ratio | Layer formation rate (Å/s) | Layer thickness (μ) | Discharging power (W/cm²) | Substrate temperature (°C) | Pressure during reaction (Torr) |
|---|---|---|---|---|---|---|---|---|
| Layer region $(c_3 c_4)$ | $SiH_4/He$ =0.5<br>$NH_3$ 100<br>$B_2H_6/He$ =3×10$^{-3}$ | $SiH_4$ =200 | $NH_3/SiH_4$ =7.7×10$^{-2}$<br>$B_2H_6/SiH_4$ =8×10$^{-5}$ | 20 | 20 | 0.2 | 250 | 0.5 |
| Layer region $(c_2 c_3)$ | $SiH_4/He$ =0.5<br>$NH_3$ 100<br>$B_2H_6/He$ =3×10$^{-3}$ | $SiH_4$ =100 | $NH_3/SiH_4$ =7.7×10$^{-2}$ – 3.85×10$^{-2}$<br>$B_2H_6/SiH_4$ =8×10$^{-5}$ – 0 | 20 | 0.5 | 0.2 | 250 | 0.5 |
| Layer region $(c_1 c_2)$ | $SiH_4/He$ =0.5<br>$NH_3$ 100 | $SiH_4$ =200 | $NH_3/SiH_4$ =3.85×10$^{-2}$ – 0 | 20 | 0.5 | 0.2 | 250 | 0.5 |
| Layer region $(c_0 c_1)$ | $SiH_4/He$ =0.5 | $SiH_4$ =100 |  | 20 | 1 | 0.2 | 250 | 0.5 |

Discharging frequency: 13.56 MHz

UNITED STATES PATENT AND TRADEMARK OFFICE
CERTIFICATE OF CORRECTION

PATENT NO. : 4,460,669

DATED : July 17, 1984

INVENTOR(S) : OGAWA, Kyosuke et al

Page 9 of 18

It is certified that error appears in the above-identified patent and that said Letters Patent is hereby corrected as shown below:

Col. 46, Table 28, attached Table is correct.

Table 28

| Layer region $(c_1,c_2)$ \ Layer (unit) region $(c_3,c_4,...)$ | 0.1 | 0.5 | 1.0 | — | 8 |
|---|---|---|---|---|---|
| 0.1 | NS9-11 ○ | NS9-12 ○ | NS9-13 ○ | NS9-14 ○ | NS9-15 ◎ |
| 0.2 | NS9-21 ○ | NS9-22 ◎ | NS9-23 ◎ | NS9-24 ◎ | NS9-25 ◎ |
| 1.0 | NS9-31 ○ | NS9-32 ◎ | NS9-33 ◎ | NS9-34 ◎ | NS9-35 ◎ |
| — | NS9--1 ○ | NS9--2 ◎ | NS9--3 ◎ | NS9--4 ◎ | NS9--5 ◎ |
| 8 | NS9-51 ◎ | NS9-52 ◎ | NS9-53 ◎ | NS9-54 ◎ | NS9-55 ◎ |

| Sample No. |
|---|
| Evaluation |

Col. 47, Table 28, eliminate entire "TABLE 28-Continued" including TABLE itself.

UNITED STATES PATENT AND TRADEMARK OFFICE
CERTIFICATE OF CORRECTION

PATENT NO. : 4,460.669
DATED : July 17, 1984
INVENTOR(S) : OGAWA, KYOSUKE et al

Page 10 of 18

It is certified that error appears in the above-identified patent and that said Letters Patent is hereby corrected as shown below:

Col. 49, Table 30, attached Table is correct.

Table 30

| Amorphous layer constitution | Gases employed (Vol%) | Flow rate (SCCM) | Flow rate ratio | Layer formation rate (Å/S) | Layer thickness (μ) | Discharging power (W/cm²) | Substrate temperature (°C) | Pressure during reaction (torr) |
|---|---|---|---|---|---|---|---|---|
| Layer region $(c_1 c_B)$ | $SiH_4/He$ =0.5<br>$SiF_4/He$ =0.5<br>$NH_3$ 100<br>$B_2H_6/He$ =3×10⁻³ | $SiH_4$ =200 | $NH_3/(SiH_4+SiF_4)$ =4×10⁻²<br>$SiF_4/SiH_4$ =0.2<br>$B_2H_6/(SiH_4+SiF_4)$ =8×10⁻⁵ | 20 | 20 | 0.18 | 250 | 0.5 |
| Layer region $(c_2 t_1)$ | $SiH_4/He$ =0.5<br>$SiF_4/He$ =0.5<br>$NH_3$ 100<br>$B_2H_6/He$ =3×10⁻³ | $SiH_4$ =200 | $NH_3/(SiH_4+SiF_4)$=∞<br>10⁻²∼4×10⁻²<br>$SiF_4/SiH_4$ =0.2<br>$B_2H_6/(SiH_4+SiF_4)$ =8×10⁻⁵ | 20 | 0.5 | 0.18 | 250 | 0.5 |
| Layer region $(c_1 t_2)$ | $SiH_4/He$ =0.5<br>$SiF_4/He$ =0.5<br>$NH_3$ 100<br>$B_2H_6/He$ =3×10⁻³ | $SiH_4$ =200 | $NH_3/(SiH_4+SiF_4)$ =2×10⁻²∼0<br>$SiF_4/SiH_4$ =0.2<br>$B_2H_6/(SiH_4+SiF_4)$ =8×10⁻⁵∼0 | 20 | 0.5 | 0.18 | 250 | 0.5 |
| Layer region $(c_1 t_1)$ | $SiH_4/He$ =0.5<br>$SiF_4/He$ =0.5 | $SiH_4$ =100 | $SiF_4/SiH_4$ =0.2 | 20 | 1 | 0.18 | 250 | 0.5 |

UNITED STATES PATENT AND TRADEMARK OFFICE
CERTIFICATE OF CORRECTION

PATENT NO. : 4,460,669
DATED : July 17, 1984
INVENTOR(S) : OGAWA, KYOSUKE et al

It is certified that error appears in the above-identified patent and that said Letters Patent is hereby corrected as shown below:

Col. 50, Table 31, attached Table is correct.

Col. 52, line 61, insert --regions-- following "layer"

UNITED STATES PATENT AND TRADEMARK OFFICE
CERTIFICATE OF CORRECTION

PATENT NO. : 4,460,669

DATED : July 17, 1984

INVENTOR(S) : OGAWA, KYOSUKE et al

Page 12 of 18

It is certified that error appears in the above-identified patent and that said Letters Patent is hereby corrected as shown below:

Col. 53, Table 33, attached Table is correct.

Col. 53, line 32, insert --regions-- following "layers"

UNITED STATES PATENT AND TRADEMARK OFFICE
CERTIFICATE OF CORRECTION

PATENT NO. : 4,460,669

DATED : July 17, 1984

INVENTOR(S) : OGAWA, KYOSUKE et al

Page 13 of 18

It is certified that error appears in the above-identified patent and that said Letters Patent is hereby corrected as shown below:

Col. 55, Table 35, attached Table is correct

Table 35

| Amorphous layer constitution | Gases employed (Vol%) | Flow rate (SCCM) | Flow rate ratio | Layer formation rate (Å/S) | Layer thickness (μ) | Discharging power (W/cm²) | Substrate temperature (°C) | Pressure during reaction (torr) |
|---|---|---|---|---|---|---|---|---|
| Layer region $(t_5 t_6)$ | $SiH_4/He$ =0.5  $CH_4$ 100  $B_2H_6/He$ =3×10⁻³ | $SiH_4$ =200 | $CH_4/SiH_4$ =8×10⁻²  $B_2H_6/SiH_4$ =1×10⁻⁵ | 18 | 20 | 0.18 | 250 | 0.5 |
| Layer region $(t_4 t_5)$ | $SiH_4/He$ =0.5  $CH_4$ 100  $B_2H_6/He$ =3×10⁻³ | $SiH_4$ =200 | $CH_4/SiH_4$ =8×10⁻²  =5×10⁻²  $B_2H_6/SiH_4$ =1×10⁻⁵ | 18 | 0.5 | 0.18 | 250 | 0.5 |
| Layer region $(t_3 t_4)$ | $SiH_4/He$ =0.5  $CH_4$ 100  $B_2H_6/He$ =3×10⁻³ | $SiH_4$ =200 | $CH_4/SiH_4$ 5×10⁻²∼0  $B_2H_6/SiH_4$ =1×10⁻⁵  =X(4) | 18 | 0.1 | 0.18 | 250 | 0.5 |
| Layer region $(t_2 t_3)$ | $SiH_4/He$ =0.5  $B_2H_6/He$ =3×10⁻³ | $SiH_4$ =200 | $B_2H_6/SiH_4$ =Y(4) | 18 | 0.5 | 0.18 | 250 | 0.5 |
| Layer region $(t_1 t_2)$ | $SiH_4/He$ =0.5  $CH_4$ 100  $B_2H_6/He$ =1×10⁻³ | $SiH_4$ =200 | $B_2H_6/SiH_4$ =Y(4) | 18 | 0.1 | 0.18 | 250 | 0.5 |
| Layer region $(t_0 t_1)$ | $SiH_4/He$ =0.5 | $SiH_4$ =100 | | 18 | 0.1 | 0.18 | 250 | 0.5 |

Discharging frequency: 13.56 MHz

UNITED STATES PATENT AND TRADEMARK OFFICE
CERTIFICATE OF CORRECTION

PATENT NO. : 4,460,669

DATED : July 17, 1984

INVENTOR(S) : OGAWA, KYOSUKE et al

Page 14 of 18

It is certified that error appears in the above-identified patent and that said Letters Patent is hereby corrected as shown below:

Col. 55/56, Table 36, attached Table is correct.

Col. 56, lines 48/49, change "obtained" to --obtain--

UNITED STATES PATENT AND TRADEMARK OFFICE
CERTIFICATE OF CORRECTION

PATENT NO. : 4,460,669
DATED : July 17, 1984
INVENTOR(S) : OGAWA, KYOSUKE et al

Page 15 of 18

It is certified that error appears in the above-identified patent and that said Letters Patent is hereby corrected as shown below:

Col. 57, Table 37, attached Table is correct.

Col. 57, line 38, insert --regions-- following "layer"

UNITED STATES PATENT AND TRADEMARK OFFICE
CERTIFICATE OF CORRECTION

PATENT NO. : 4,460,669

DATED : July 17, 1984

Page 16 of 18

INVENTOR(S) : OGAWA, KYOSUKE et al

It is certified that error appears in the above-identified patent and that said Letters Patent is hereby corrected as shown below:

Col. 58, Table 38 attached Table is correct.

Table 38

| Amorphous layer constitution | Gases employed (Vol%) | Flow rate (SCCM) | Flow rate ratio | Layer formation rate (Å/S) | Layer thickness (μ) | Discharging power (w/cm²) | Substrate temperature (°C) | Pressure during reaction (torr) |
|---|---|---|---|---|---|---|---|---|
| Layer region $(t_3t_8)$ | $SiH_4/He$ =0.5  $CH_4$ 100  $B_2H_6/He$ =3×10⁻³ | $SiH_4$ =200 | $CH_4/SiH_4$ =2.2×10⁻²  $B_2H_6/SiH_4$ =1×10⁻⁵ | 20 | 20 | 0.2 | 250 | 0.5 |
| Layer region $(t_2t_7)$ | $SiH_4/He$ =0.5  $CH_4$ 100  $B_2H_6/He$ =3×10⁻³ | $SiH_4$ =200 | $CH_4/SiH_4$ =2.2×10⁻²  ~1.38×10⁻²  $B_2H_6/SiH_4$ =3×10⁻⁵ | 20 | 0.5 | 0.2 | 250 | 0.5 |
| Layer region $(t_1t_2)$ | $SiH_4/He$ =0.5  $CH_4$ 100  $B_2H_6/He$ =3×10⁻³ | $SiH_4$ =200 | $CH_4/SiH_4$ =1.38×10⁻²  ~0  $B_2H_6/SiH_4$ =3×10⁻⁵  ~X(6) | 20 | 0.3 | 0.2 | 250 | 0.5 |
| Layer region $(t_5t_1)$ | $SiH_4/He$ =0.5  $B_2H_6/He$ =3×10⁻³ | $SiH_4$ =200 | $B_2H_6/SiH_4$ =X(6) | ~0 | 0.2 | 0.2 | 250 | 0.5 |

Discharging frequency: 13.56 MHz

UNITED STATES PATENT AND TRADEMARK OFFICE
CERTIFICATE OF CORRECTION

PATENT NO. : 4,460,669
DATED : July 17, 1984
INVENTOR(S) : OGAWA, KYOSUKE et al

It is certified that error appears in the above-identified patent and that said Letters Patent is hereby corrected as shown below:

Col. 60, Table 40, attached Table is correct.

Col. 61, Table 41, attached Table is correct.

UNITED STATES PATENT AND TRADEMARK OFFICE
CERTIFICATE OF CORRECTION

PATENT NO. : 4,460,669
DATED : July 17, 1984
INVENTOR(S) : OGAWA, KYOSUKE et al

Page 18 of 18

It is certified that error appears in the above-identified patent and that said Letters Patent is hereby corrected as shown below:

Col. 62, Table 43, attached Table is correct.

Signed and Sealed this

Thirtieth Day of July 1985

[SEAL]

Attest:

Attesting Officer

DONALD J. QUIGG
Acting Commissioner of Patents and Trademarks